(12) United States Patent
Hashimoto et al.

(10) Patent No.: US 6,504,712 B2
(45) Date of Patent: Jan. 7, 2003

(54) HEAT SINKS FOR CPUS FOR USE IN PERSONAL COMPUTERS

(75) Inventors: Suzushi Hashimoto, Kawachi (JP); Kazuo Kinaga, Hikone (JP); Shoji Akutsu, Tochigi (JP)

(73) Assignee: Showa Denka K.K., Tokyo (JP)

( * ) Notice: Subject to any disclaimer, the term of this patent is extended or adjusted under 35 U.S.C. 154(b) by 0 days.

(21) Appl. No.: 09/992,407

(22) Filed: Nov. 26, 2001

(65) Prior Publication Data

US 2002/0044424 A1 Apr. 18, 2002

Related U.S. Application Data

(62) Division of application No. 09/584,388, filed on Jun. 1, 2000, now abandoned.

(30) Foreign Application Priority Data

Jun. 1, 1999 (JP) .......................................... 11/153406
Aug. 6, 1999 (JP) .......................................... 11/224246
Mar. 3, 2000 (JP) ........................................ 2000/059195
Mar. 3, 2000 (JP) ........................................ 2000/059295

(51) Int. Cl.[7] .............................. G06F 1/20; H05K 7/20
(52) U.S. Cl. ...................... 361/687; 361/704; 361/719; 257/719; 165/80.3; 174/16.3
(58) Field of Search ............................... 361/687, 704, 361/707, 709, 710, 715, 719; 165/80.3, 185; 24/457, 458, 453; 174/16.3; 257/718, 719, 726, 727

(56) References Cited

U.S. PATENT DOCUMENTS

| 4,557,225 A | | 12/1985 | Sagues et al. ............ 123/41.31 |
| 5,570,271 A | | 10/1996 | Lavochkin .................. 361/704 |
| 5,630,469 A | | 5/1997 | Butterbaugh et al. ...... 165/80.3 |
| 5,850,691 A | * | 12/1998 | Bell ............................. 29/845 |
| 5,870,288 A | * | 2/1999 | Chen .......................... 361/704 |
| 5,883,783 A | | 3/1999 | Turturro ..................... 361/704 |
| 5,946,190 A | | 8/1999 | Patel et al. ................. 361/700 |
| 5,973,921 A | * | 10/1999 | Lin ............................. 361/695 |
| 6,043,984 A | * | 3/2000 | Tseng ......................... 361/704 |
| 6,061,239 A | * | 5/2000 | Blomquist .................. 361/704 |
| 6,071,128 A | * | 6/2000 | Brewington et al. .......... 439/73 |
| 6,082,440 A | * | 7/2000 | Clemens et al. ........... 165/80.3 |
| 6,141,220 A | | 10/2000 | Lin ............................. 361/704 |
| 6,160,706 A | | 12/2000 | Davis et al. ................ 361/704 |

* cited by examiner

Primary Examiner—Lynn D. Feild
(74) Attorney, Agent, or Firm—Armstrong, Westerman & Hattori, LLP

(57) ABSTRACT

A heat sink for CPUs for use in personal computers comprises a radiating base plate of metal having on one surface thereof a flat portion for receiving the heat generated by the CPU, and a plurality of raised radiating fins integrally formed by cutting on the other surface of the radiating base plate. The heat sink can be provided with a greater number of radiating fins than a conventional heat sink of comparable base plate size, hence an increased radiating area is obtained.

5 Claims, 36 Drawing Sheets

HEAT SINKS FOR CPUS FOR USE IN PERSONAL COMPUTERS

This application is a division of prior application Ser. No. 09/584,388 filed Jun. 1, 2000 now abandoned.

BACKGROUND OF THE INVENTION

The present invention relates to heat sinks for dissipating the heat generated by CPUs of personal computers.

The term "aluminum" as used herein includes aluminum alloys in addition to pure aluminum.

Desktop personal computers include those wherein a printed circuit board termed a motherboard and disposed in a housing is provided with a connector which has attached thereto a CPU assembly comprising a CPU mount circuit board and a CPU (central processing unit) mounted on the board (to be referred to as the "personal computer of the first type"). Further some personal computers have a motherboard disposed within a housing and provided with a socket which has attached thereto a CPU having a package (to be referred to as the "personal computer of the second type").

Personal computers are recently remarkably increased in the number of functions given and in processing speed and consequently incorporate a CPU having an increased output and generating a greatly increased quantity of heat. It is accordingly required to cool the CPU efficiently. The personal computer of the first type therefore has a heat sink fixed to the CPU assembly for dissipating the heat generated by the CPU. In the case of the personal computer of the second type, a heat sink having a radiating base plate is fixed to the socket with a clip, with a heat receiving portion of the base plate disposed in contact with the CPU.

Heat sinks of the type described and conventionally used comprise a radiating bass plate of aluminum extrudate having a flat surface over the entire area of one side thereof, and a plurality of platelike radiating fine formed in parallel on the other side of the base plate integrally therewith and extending in the direction of extrusion of the base plate.

In the case of the conventional heat sink wherein the platelike radiating fins are formed on one side of the radiating base plate of extrudate integrally therewith and extending in the direction of extrusion, the radiating fine are given a relatively large thickness and a relatively great fin pitch because of the reasons involved in the fabrication technique, with the result that if the radiating base plate is limited in size by the CPU assembly or the socket, the sink has the problem of being insufficient in radiating area and low in radiation efficiency.

Another heat sink of this type already known is disclosed in Japanese Utility Model Registration No. 3054704. The disclosed sink comprises a radiating base plate of aluminum extrudate having a flat surface on one side thereof and a plurality of upstanding walls formed in parallel on the other side thereof integrally therewith and extending in the direction of extrusion of the base plate, the upstanding walls having a plurality of slits arranged at a spacing longitudinally thereof to provide a plurality of pinlike radiating fins.

The upstanding walls are formed on one side of the radiating base plate of extrudate, extend in the direction of extrusion of the plate and are slitted to provide the pinlike radiating fins. Accordingly, the upstanding walls have a relatively large thickness and a relatively great wall pitch because of the reasons involved in the fabrication technique, consequently giving the heat sink a relatively small number of radiating fins per unit area. The sink therefore similarly has the problem of being insufficient in radiating area and low in radiation efficiency if the radiating base plate is limited in size by the CPU assembly or the socket.

Further in the case of the personal computer of the first type, the heat sink is fixed to the CPU assembly, for example, by the method disclosed in the Japanese Utility Model Registration No. 3054704. The CPU assembly disclosed in this publication has a casing comprising a plastic cover in the form of a box, and an aluminum plate covering an opening of the cover. The CPU mount circuit board as disposed inside the casing is so positioned that the CPU is in contact with the aluminum plate. The heat sink is fixed to the CPU assembly in the following manner using a clip. A hole is formed in each of the radiating base plate of the heat sink, the aluminum plate and cover of casing of the CPU assembly and the CPU mount circuit board. The plastic cover of the casing has a projection on its periphery. The clip has two legs, one of which has at its outer end an engaging portion engageable with an inner peripheral portion of the cover defining the hole, and the other of which is formed at its outer end with a through bore for fitting the cover projection therein. The heat sink is fixed to the CPU assembly by positioning the heat sink with the flat surface of its radiating base plate in intimate contact with the outer surface of the aluminum plate of the casing, inserting one leg of the clip through the holes of the base plate, the casing aluminum plate, the CPU mount circuit board and the plastic cover, engaging the engaging portion at the and of this leg with the hole-defining peripheral portion of the cover, and fitting the peripheral projection of the cover in the end bore of the other leg.

However, the clip is merely in engagement with the plastic cover, so that the radiating base plate of the beat sing is not held in intimate contact with the aluminum plate with a sufficient force. The conventional fixing structure described therefore has the problem of failing to ensure satisfactory radiating performance since heat is not transferred from the CPU of the CPU assembly to the heat sink efficiently.

Further for use in the personal computer of the second type, a clip-equipped heat sink is known as disclosed in U.S. Pat. No. 5,570,271. This clip-equipped heat sink comprises a heat sink and a clip held to the sink. The heat sink comprises a radiating base plate having a bottom side providing a flat surface, and a plurality of platelike radiating fins formed in parallel on the upper side of the base plate integrally therewith. The clip comprises a striplike horizontal bases, a vertical leg extending downward from each and of the base integrally therewith, and a depending wall integral with each side edge of a lengthwise intermediate portion of the base. Projections formed on the outer surfaces of the depending walls of the clip are engaged with lengthwise ridges formed respectively on the opposed faces of the two adjacent fine in the center, whereby the clip is held to the heat sink.

In the case of the clip-equipped heat sink, the clip is held to the sink by the engagement of the projections on the clip with the ridges an radiating fins of the sink. Accordingly the fins to be formed with the ridges, need to have an increased thickness to give greeter holding strength. Since the heat sink is made of an extrudate, the other radiating fine also have a relatively great thickness and a relatively great fin pitch because of the reasons involved in fabrication technique, failing to provide a sufficient radiating area to result in a relatively low radiation efficiency.

SUMMARY OF THE INVENTION

An object of the present invention is to overcome the foregoing problems and to provide a heat sink for CPUs for use in personal computers which is outstanding in radiating performance.

Another object of the invention is to provide a structure for fixing a heat sink to a CPU assembly for use in personal computers of the first type, the fixing structure being adapted to transfer heat from the CPU of the CPU assembly to the heat sink with an improved efficiency.

Still another abject of the present invention is to provide a clip-equipped heat sink for use in personal computers of the second type, the heat sink having a radiating base plate which is fittable to the CPU in intimate contact therewith effectively to exhibit outstanding radiating performance.

The present invention provides a heat sink for CPUs for use in personal computers which comprises a radiating base plate of metal having on one surface thereof a flat portion for receiving the heat generated by the CPU, and a plurality of radiating fins formed in a raised shape on the other surface of the radiating base plate integrally therewith by cutting.

The heat sink of the invention can be provided with a greater number of radiating fins than the conventional heat sink wherein platelike radiating fins are formed integrally with a radiating base plate when both the sinks are identical in the size of the base plate, hence an increased radiating area. Accordingly, the heat generated by the CPU can be dissipated efficiently even when the radiating base plate in limited in size by the CPU assembly or socket.

The present invention provides a structure for fixing a heat sink to a CPU assembly having a CPU mount circuit board within a housing of a personal computer by a first clip provided on the heat sink and a second clip provided on the CPU assembly, the heat sink comprising a radiating base plate of metal having on one surface thereof a flat portion for receiving the heat generated by the CPU, and a plurality of radiating fins formed in a raised shape on the other surface of the radiating base plate integrally therewith by cutting, the radiating base plate of the heat sink having an internally enlarged furrow formed in the surface thereof provided with the heat receiving portion, the first clip comprising a base in the form of a strip and having a width larger than the opening width of the furrow and smaller than the bottom width of the furrow, and a leg provided on the base perpendicular thereto and having an engaging portion at an outer end thereof, the second clip comprising a springlike elastic portion engageable with the engaging portion of the leg end of the first clip, the base of the first clip being disposed in the furrow with the leg thereof extending from inside the furrow outward through the CPU assembly, the engaging portion of the leg end being in engagement with the elastic portion of the second clip as deformed elastically, the first clip being biased toward the CPU assembly by the elastically deformed elastic portion.

With the heat sink fixing structure of the invention, the first clip is held to the heat sink by having its base positioned in the internally enlarged furrow, and the engaging portion at the leg end of the first clip thus held by the heat sink is engaged with the springlike elastic portion of the second clip as elastically deformed, whereby the first clip is biased toward the CPU assembly. As a result, the heat sink is pressed against the CPU assembly effectively by the repulsive force of the elastic portion. The radiating base plate of the heat sink is therefore fitted to the CPU assembly with an increased force, consequently transferring heat from the CPU of the assembly to the heat sink with an improved efficiency for the heat sink to exhibit satisfactory radiating performance.

The present invention provides another structure for fixing a heat sink to a CPU assembly having a CPU mount circuit board within a housing of a personal computer by a first clip provided on the heat sink and a second clip provided on the CPU assembly, the heat sink comprising a radiating base plate of metal having on one surface thereof a flat portion for receiving the heat generated by the CPU, and a plurality of radiating fine formed in a raised shape on the other surface of the radiating base plate integrally therewith by cutting, the structure comprising a sink holding frame fitted around the radiating fins and engaged with at least part of a peripheral portion of the radiating base plate, the first clip comprising a base in the form of a strip and a leg provided on the base perpendicular thereto and having an engaging portion at an outer end thereof, the second clip comprising a springlike elastic portion engageable with the engaging portion of the leg end of the first clip, the first clip having its base positioned along the sink holding frame and its leg inserted through the holding frame and the CPU assembly, the engaging portion of the leg end being in engagement with the elastic portion of the second clip as deformed elastically, the first clip being biased toward the CPU assembly by the elastically deformed elastic portion.

With this sink fixing structure, the leg of the first clip is inserted through the holding frame in engagement with the radiating base plate of the heat sink and through the CPU assembly, and the engaging portion of the leg end is engaged with the elastically deformed springlike elastic portion of the second clip, whereby the first clip is biased toward the CPU assembly. The heat sink is therefore pressed against the CPU assembly effectively with the holding frame interposed therebetween by the repulsive force of the elastic portion. The radiating base plate of the heat sink is therefore fitted to the CPU assembly with a increased force, consequently transferring heat from the CPU of the assembly to the heat sink with an improved efficiency for the heat sink to exhibit satisfactory radiating performance.

The present invention provides a clip-equipped heat sink comprising a heat sink and a clip held to the heat sink for fixing the heat sink to a socket, the heat sink comprising a radiating base plate of metal having on one surface thereof a flat portion for receiving the heat generated by a CPU by contact with the CPU, the CPU being attached to the socket as provided on a printed circuit board within a housing of a personal computer, the heat sink further comprising a plurality of radiating fins formed in a raised shape on the other surface of the radiating base plate integrally therewith, the finned surface of the radiating base plate having an internally enlarged furrow at a portion thereof where no fins provided, the clip comprising a base disposed in the furrow, a projection formed integrally with each of opposite ends of the base to extend outward from inside the furrow in the base plate and having an outer end positioned above the base plate and outside the furrow longitudinally thereof, and a leg formed integrally with the outer and of the projection and extending downward to provide at an outer end thereof an engaging portion engageable with a portion of the socket, the base of the clip being provided with a portion having a width larger than the opening width of the furrow and smaller than the bottom width thereof.

With the clip-equipped heat sink of the invention, the base of the clip has a portion with a width larger than the opening width of the furrow and smaller than the bottom width thereof, so that the clip is held by the heat sink without slipping off therefrom and without moving out of position widthwise of the radiating base plate. The heat sink and the clip can be wrapped into a package with ease. Since the clip is unlikely to become displaced relative to the sink widthwise of the base, the heat sink can be positioned accurately relative to the socket when to be fixed to the socket with use of the clip. Since the clip is held to the sink by having its base positioned in the bottom of the internally enlarged furrow, there is no need to hold the clip with radiating fins as disclosed in U.S. Pat. No. 5,570,271. This makes it possible to use thin tonguelike fins for radiation which are formed by louvering the radiating base plate, consequently affording a greater radiating area and ensuring higher radiating performance than when platelike fins formed by extrusion are used.

The present invention will be described in greater detail with reference to the accompanying drawings.

DESCRIPTION OF THE PREFERRED EMBODIMENTS

Figure 1:
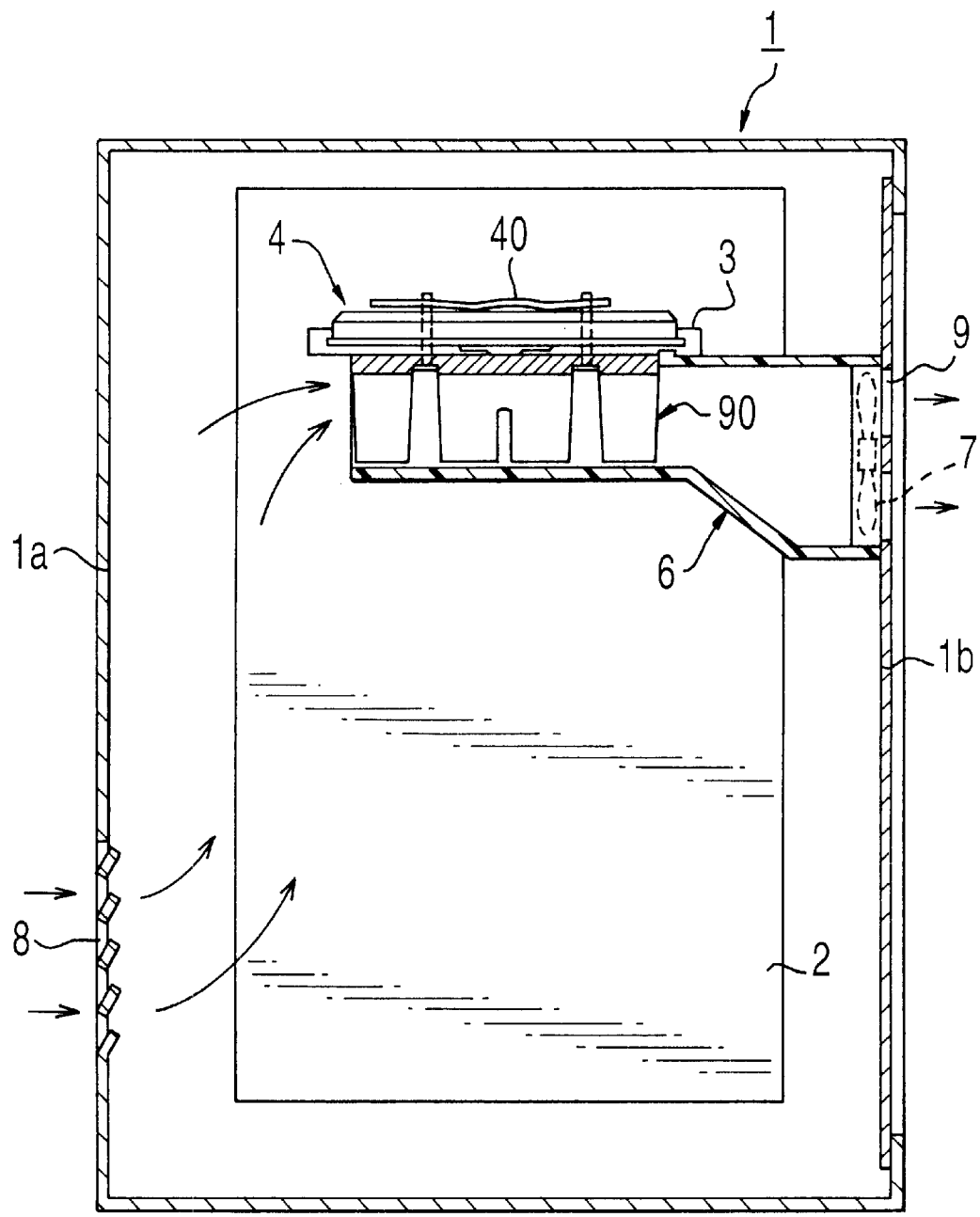
FIG. 1 is a view in vertical section schematically showing a personal computer having a heat sink of first embodiment of the invention.

Throughout the drawings, like parts will be designated by like reference numerals and will not be described repeatedly in the following description.

First Embodiment

This embodiment is shown in FIGS. 1 to 4. In describing this embodiment, the upper and lower sides of FIG. 1 will be referred to as "upper" and "lower," respectively, the left-hand side of the drawing as "front," and the opposite side thereof as "rear." Further the rear side of the plane of FIGS. 1 or 2 will be referred to as "left," and the opposite side thereof as "right."

With reference to FIG. 1 showing a desktop personal computer of the so-called tower type, the computer has a housing 1, in which a motherboard 2 is disposed in a vertical position. Provided on the right side surface of the motherboard 2 is a connector 3 elongated forward or rearward and having a CPU assembly 4 attached thereto in a horizontal position. A heat sink 90 is fixed to the bottom surface of the CPU assembly 4. A plastic duct 6 attached to the heat sink 90 is provided at its rear end with a fan 7, by which air flowing in through an air opening e formed in the front wall 1a of the housing 1 is introduced into the duct 6, passed through the duct 6 and drawn off from an air opening 9 formed in the rear wall 1b of the housing 1.

The CPU assembly 4 comprises a CPU mount circuit board 12 carrying e CPU 11 thereon, and a plastic cover 13 covering the upper side of the circuit board 12. The CPU 11 is disposed beneath the bottom surface of the circuit board 12 and faces downward as exposed (see FIG. 2).

Figure 2:
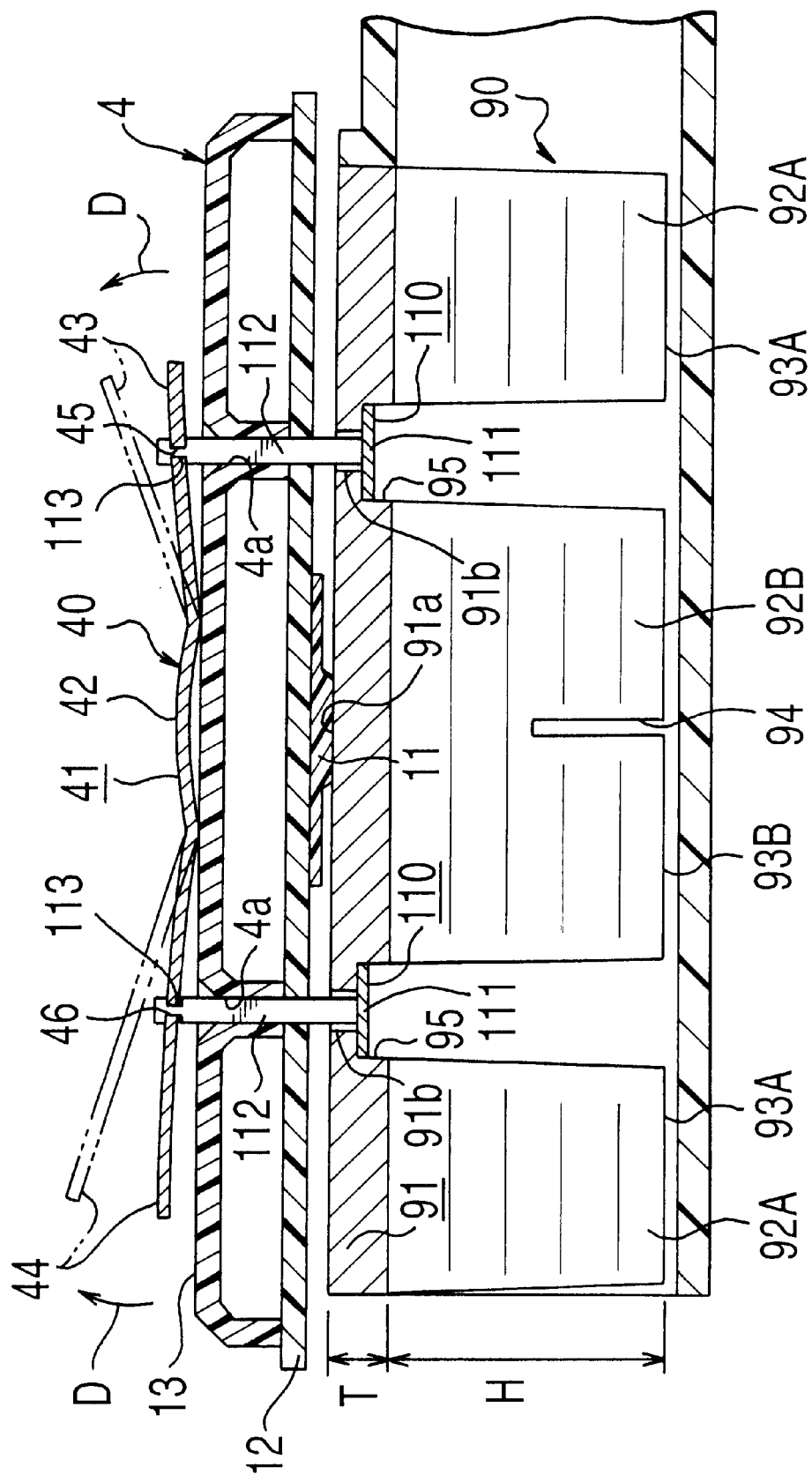
FIG. 2 is an enlarged fragmentary view of FIG. 1.
Figure 3:
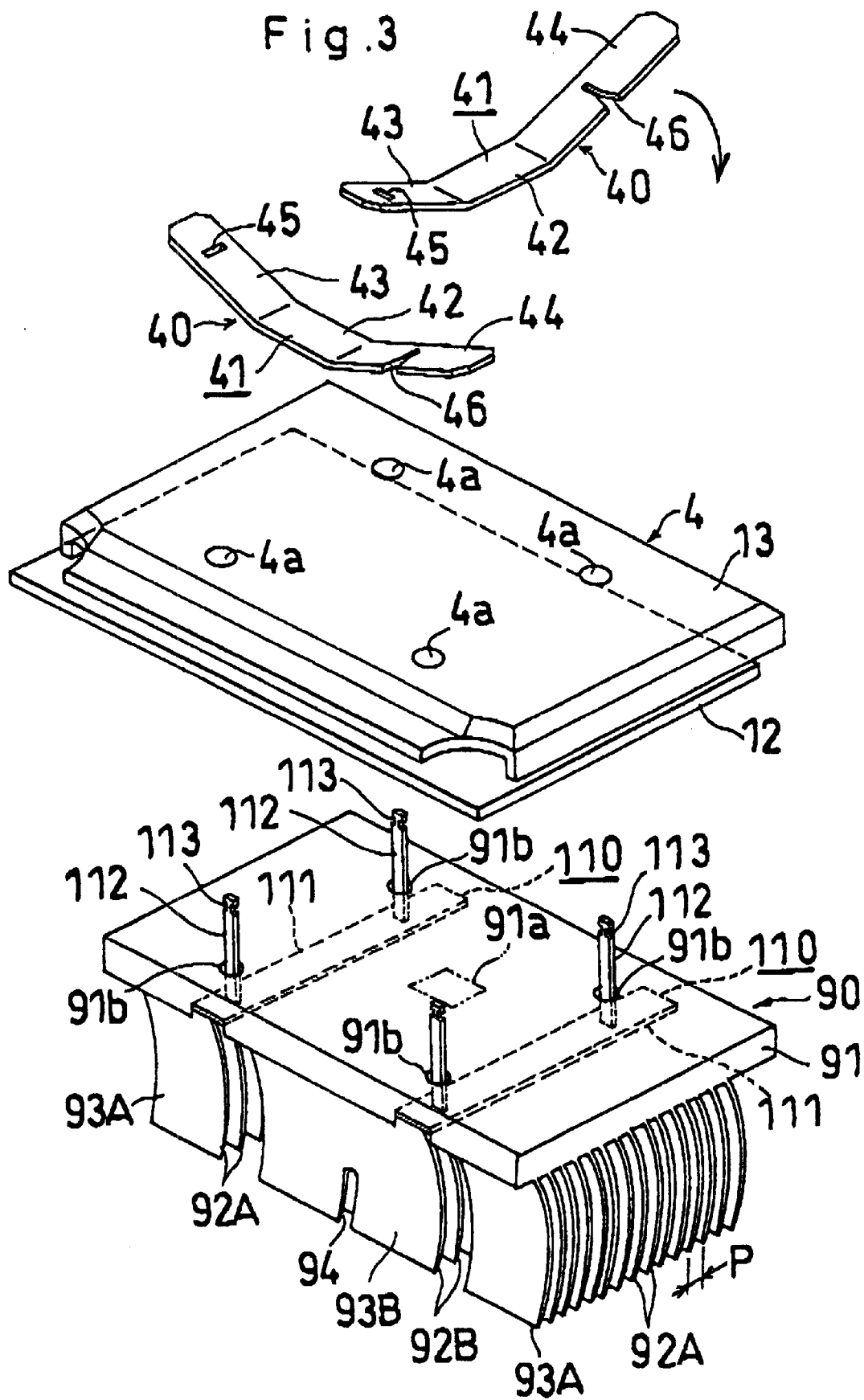
FIG. 3 is an exploded perspective view showing how to fix the heat sink to a CPU assembly according to the first embodiment.

As seen in FIGS. 2 and 3, the heat sink 90 comprises a radiating base plate 91 made of an aluminum extrudate and having an upper side providing a flat surface in its entirety and a heat receiving portion 91a provided at the central portion of the surface for contact with the CPU 11 for receiving the heat generated by the CPU 11, and a plurality of fin rows 93A, 93B provided on the lower surface of the base plate 91. The fin rows 93A, 93B, which are three in number in the present embodiment, each comprise a multiplicity of tonguelike radiating fine 92A or 92B formed in a raised form by cutting integrally with the bass plate 91 and arranged at a spacing in the direction of extrusion of the plate 91 (leftward or rightward, i.e., transversely of the housing 1). These fin rows 93A, 93B extend transversely of the housing 1 and are spaced apart forward or rearward, i.e., longitudinally of the housing 1. The radiating fine 92A, 92B providing the rows 93A, 93B are each in the form of a circular-arc bulging rightward at the midportion of the height. The radiating fins 92B providing the center fin row 93B are greater than the radiating fins 92A providing the front and rear fin rows 93A in width along the longitudinal direction of the housing 1, and are each formed with a slit 94 extending from the lower end thereof centrally thereof. The radiating base plate 91 is formed in its lower surface with a furrow 95 extending transversely of the housing 1 between each pair of adjacent fin rows 93A, 93B.

Figure 4:
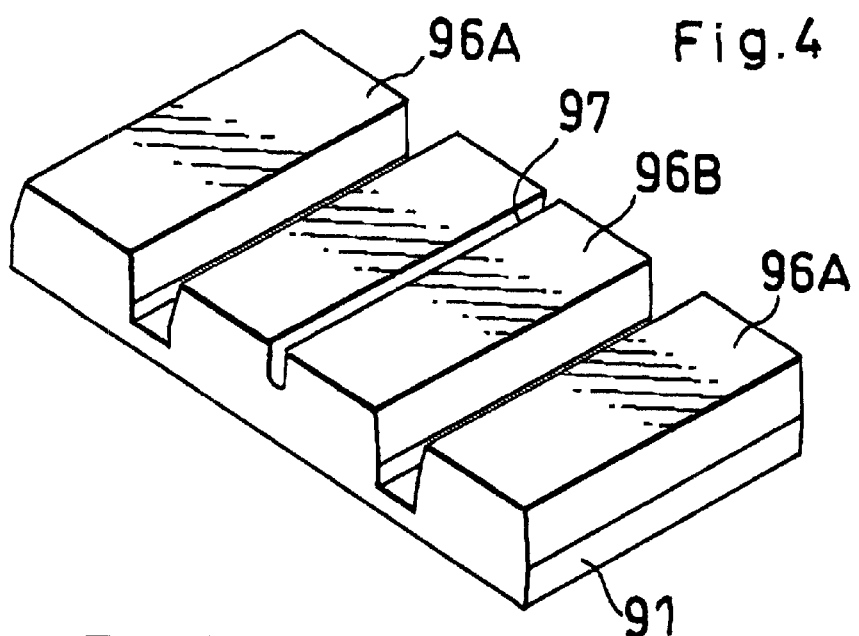
FIG. 4 is a perspective view showing a radiating base plate as extruded before radiating fins are formed according to the first embodiment.

With reference to FIG. 4, three fin forming ridges 96A, 96B spaced apart longitudinally of the base plate 91, extending transversely thereof and formed integrally therewith when the plate is extruded are louvered, that is, cut to a raised form, whereby the radiating fins 92A, 92B of the heat sink 1 are formed. A groove 97 extending transversely of the base plate 91 is formed in the upper surface of the fin forming ridge 96B in the center. The groove 97 is formed in order to reduce the resistance to cutting and to hold lubricant therein when the fins 92B are formed by louvering. The presence of the groove 97 forms the slits 94 in the radiating fins 92B formed by louvering.

Preferably, the heat sink 90 is 3 to 8 mm in the thickness T of the radiating base plate 91, 20 to 50 mm in the height H of the fins 92A, 92B from their base ends to the outer ends thereof, 0.2 to 0.7 mm in the thickness of the fins 92A, 92B, and 1.5 to 4 mm in the fin pitch P of the fins 92A, 92B which are adjacent to one another transversely of the housing 1.

Figure 5:
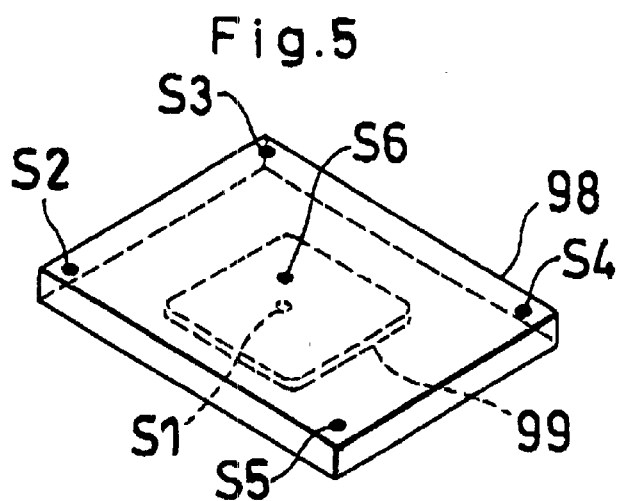
FIG. 5 is a perspective view showing a method of experiment conducted to determine the thickness of the radiating base plate of the first embodiment.
Figure 6:
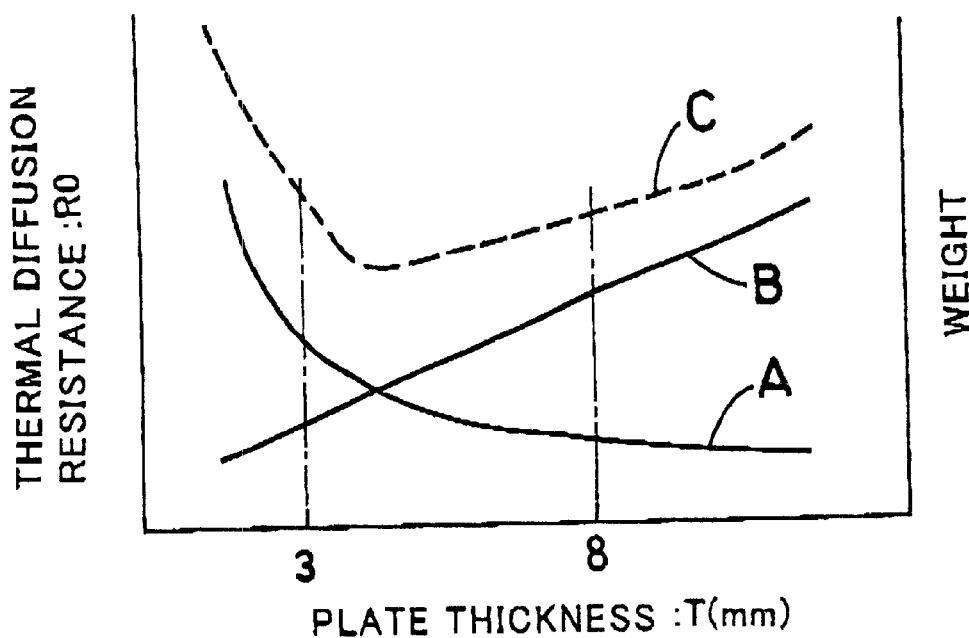
FIG. 6 is a graph showing the relationships of the thickness of aluminum plate with the thermal diffusion resistance and with the weight, as determined by the experiment of FIG. 5.

The thickness T is determined by the following experiment conducted by us. First as shown in FIG. 5, aluminum plates 98 measuring 80 mm in length and 60 mm in width and varying in thickness were prepared from an alloy comprising 0.2 to 0.6 wt. % of Si, 0.45 to 0.9 wt. % of Mg and the balance Al and inevitable impurities. Subsequently, the temperature X1 of the central portion S1 of lower surface of each aluminum plate 98 was measured while heating the plate 98 with a heater 99 attached to the lower surface of the aluminum plate 98 centrally thereof. Also measured at the same time ware the temperatures of portions S2 to S5 close the respective four corners of upper surface of the aluminum plate 98 and the central portion S6 of the upper surface to calculate the average X2 of the temperatures of the five portions S2 to S6. The thermal diffusion resistance R0 (°C./W) was then calculated from the equation R0=(X1−X2)/Q based on the quantity of heat input Q (W) by the heater 99 and the temperatures X1 and X2. FIG. 6, Curve A represents the relationship thus determined between the thickness of the aluminum plates 98 and the thermal diffusion resistance R0 thus determined. Further FIG. 6, Line B represents the relationship between the thickness of the aluminum plates 98 and the weight thereof. The thickness 3 to 8 mm of the radiating base plate 91 of the heat sink 90 was determined from Curve C obtained by superposing Curve A on Line B. More specifically stated, if the thickness T is less than 3 mm, the thermal diffusion resistance R0 will not be sufficiently small, making it difficult for the base plate 91 to transmit heat over the entire area of upper surface thereof, so that all the fins 92A, 92B will not function effectively. When the thickness exceeds 8 mm, an increased weight will result. The thermal diffusion resistance R0 increases when the thickness T is less than 3 mm presumably because when having a smaller thickness T, the plate 91 conducts heat concentrically to the central portion of its upper surface and encounters difficulty in spreading the heat over the entire upper surface. When the thickness T is in the range of 3 to 8 mm, the thermal diffusion resistance R0 decreases as the thickness T increases, whereas the resistance R0 also increases if the thickness exceeds this range.

Figure 7:
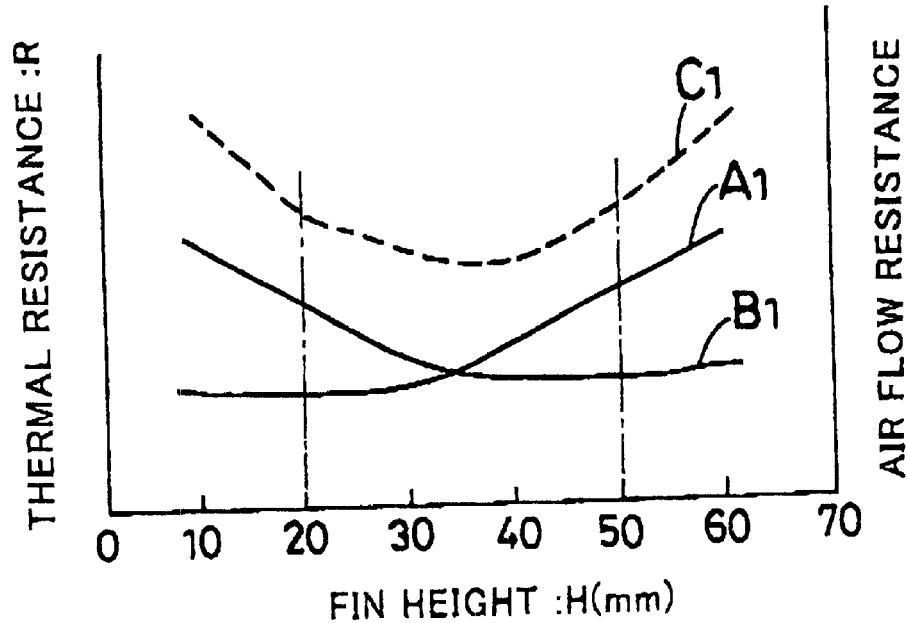
FIG. 7 is a graph showing the relationships of the height of radiating fine of the first embodiment with the thermal resistance and with the air flow resistance.

The height H of the radiating fine 92A, 92B from their base ends to the outer ends thereof is determined by the following experiment conducted by us. First, heat sinks 90 were fabricated which had a radiating base plate 91 measuring 80 mm in length, 60 mm in width and 6 mm in thickness and prepared from an alloy comprising 0.2 to 0.6 wt. % of Si, 0.45 to 0.9 wt. % of Mg and the balance Al and inevitable impurities; and radiating fins 92A, 92B formed on the upper surface of the base plate 91 integrally therewith and having a thickness of 0.3 mm and a fin pitch of 2 mm. The heat sinks 90 were different in the height H of the fine. Subsequently, the temperatures of the central portion and portions close to the respective four corners of lower surface of the radiating base plate 91 were measured while heating the plate 91 with a heater attached to the lower surface of the base plate 91 centrally thereof to calculate the average Y1 of the temperatures of the five portions. At the same time, the temperature Y2 of cooling air to be applied to the fine 92A, 92B was measured. The thermal resistance R (°C./W) was then calculated from the equation R=(Y1−Y2)/Q based on the quantity of heat input Q (W) by the heater and the temperatures Y1 and Y2. Also measured was the resistance to the flow of air between the fins 92A, 92B which were adjacent to one another transversely of the base plate 91. FIG. 7, Curve A1 represents the relationship thus determined between the height H of the fins 92A, 92B from their base ends to the outer ends thereof and the thermal resistance R. Further FIG. 7, Curve B1 represents the relationship between the height H of the fins 92A, 92B and the air flow resistance. The height H of the radiating fins 92A, 92B of the heat sink 90 which is 20 to 50 mm was determined from Curve C1 obtained by superposing Curve A1 on Curve B1. More specifically stated, if the height H of the fins 92A, 92B is less than 20 mm, sufficiently reduced air flow resistance is not available, whereas a height in excess of 50 mm results in a lower fin efficiency and greater thermal resistance R. Thus, the heat sink fails to achieve an improvement in radiation efficiency in either case. If the fin height H is lose than 20 mm, the air flow resistance increases presumably because the clearances for the air flow between the fins 92A, 92B adjacent to one another transversely of the base plate 91 then diminish in area.

Figure 8:
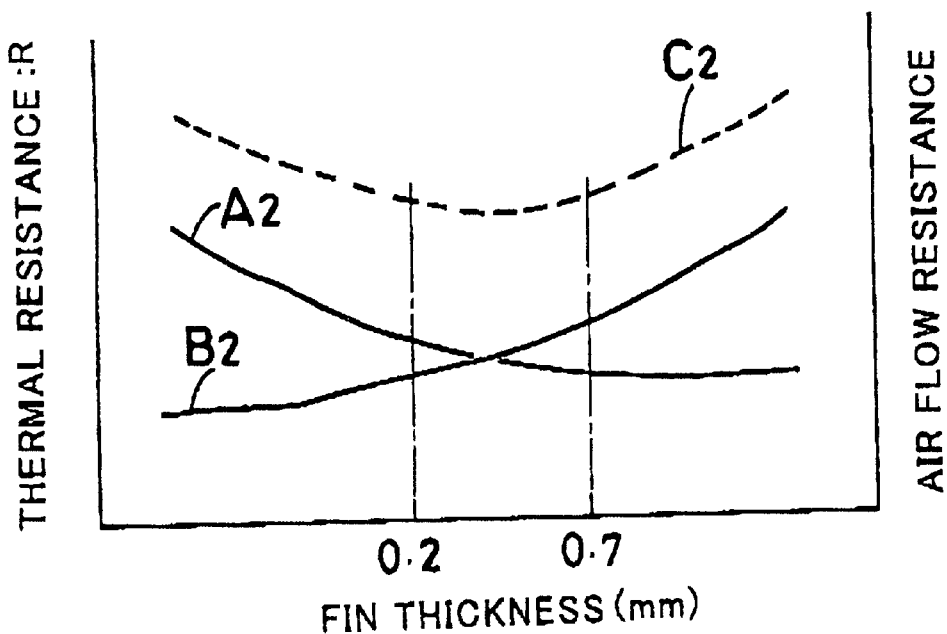
FIG. 8 is a graph showing the relationships of the thickness of radiating fine of the same embodiment with the thermal resistance and with the air flow resistance.

The thickness of the radiating fine 92A, 92B is determined by the following experiment conducted by us. First, heat sinks 90 were fabricated which had a radiating base plate 91 measuring 80 mm in length, 60 mm in width and 6 mm in thickness and prepared from an alloy comprising 0.2 to 0.6 wt. % of Si, 0.45 to 0.9 wt. % of Mg and the balance Al and inevitable impurities, and radiating fins 92A, 92B formed on the upper surface of the base plate 91 integrally therewith and having a fin pitch of 2 mm. The heat sinks 90 were different in the thickness of the fins. Subsequently, the thermal resistance R was determined in the same manner as in the case of the fin height H. Also measured was the resistance to the flow of air between the fine 92A, 92B which were adjacent to one another transversely of the base plate 91. FIG. 8, Curve A2 represents the relationship thus determined between the thickness of the fins 92A, 92B and the thermal resistance R. Further FIG. 8, Curve B2 represents the relationship between the thickness of the fins 92A, 92B and the air flow resistance. The thickness 0.2 to 0.7 mm of the radiating fins 92A, 92B of the heat sink 90 was determined from Curve C2 obtained by superposing Curve A2 on Curve B2. More specifically stated, if the thickness of the fins 92A, 92B is less than 0.2 mm, a reduced fin efficiency and increased thermal resistance R will result, whereas if the thickness is in excess of 0.7 mm, the air flow resistance increases. The heat sink fails to achieve an improvement in radiation efficiency in either case. The air flow resistance increases when the thickness of the fins 92A, 92B is over 0.7 mm presumably because the clearances for the air flow between the fins 92A, 92B adjacent to each other transversely of the base plate 91 then diminish in area.

Figure 9:
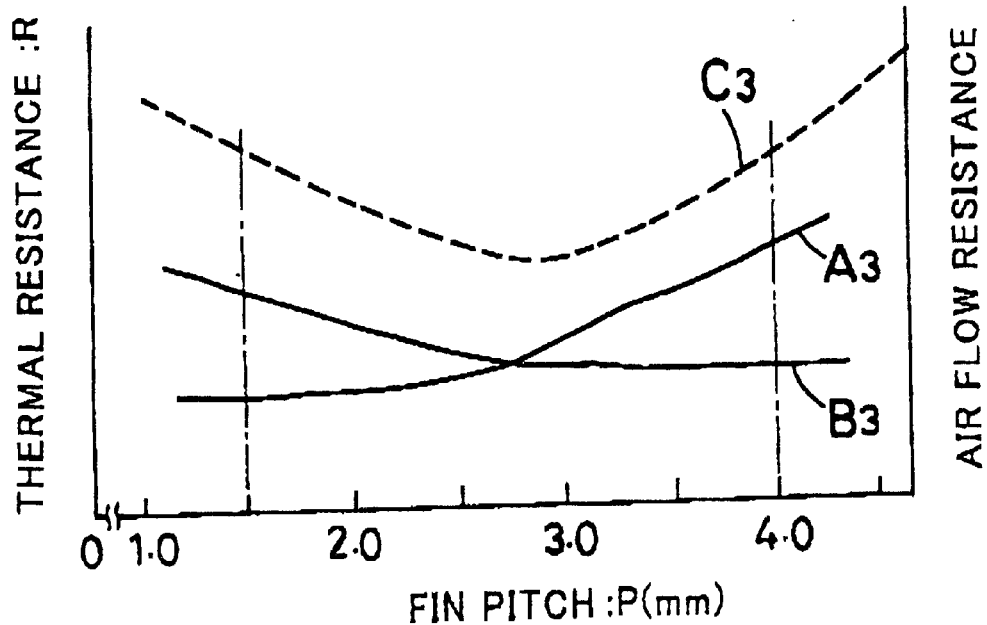
FIG. 9 is a graph showing the relationships of the fin pitch of radiating fins of the same embodiment with the thermal resistance and with the air flow resistance.

The fin pitch P of the radiating fins 92A, 92B adjacent to one another transversely of the base plate 91 is determined by the following experiment conducted by us. First, heat sinks 90 were fabricated which had a radiating base plate 91 measuring 80 mm in length, 60 mm in width and 6 mm in thickness and prepared from an alloy comprising 0.2 to 0.6 wt. % of Si, 0.45 to 0.9 wt. % of Mg and the balance Al and inevitable impurities, and radiating fins 92A, 92B formed on the upper surface of the base plate 91 integrally therewith and having a thickness of 0.3 mm. The heat sinks 90 were different in the fin pitch P of the fins 92A, 92B adjacent to one another transversely of the plate 91. Subsequently, the thermal resistance R was determined in the same manner as in the case of the fin height H. Also measured was the resistance to the flow of air between the fins 92A, 92B which were adjacent to one another in the transverse direction. FIG. 9, Curve A3 represents the relationship thus determined between the fin pitch P of the fins 92A, 92B and the thermal resistance R. Further FIG. 9, Curve B3 represents the relationship between the fin pitch P of the fins 92A, 92B and the air flow resistance. The fin pitch P, 1.5 to 4 mm, of the radiating fins 92A, 92B of the heat sink 90 was determined from Curve C3 obtained by superposing Curve A3 on curve B3. More specifically stated, if the fin pitch P of the fins 92A, 92B is less than 1.5 mm, increased air flow resistance will be offered, while a pitch in excess of 4 mm leads to a reduction in air flow resistance but fails to afford a required area of heat conduction to result in increased thermaal resistance R. An improved radiation efficiency is not available in either case. Furthermore, it is desired that the heat sink 90 be 6 to 62 in the ratio of the height H of the fins 92A, 92B from their base end to the outer ends thereof to the spacing between the fins 92A or 92B (the fin pitch P minus the thickness of one fin 92A or 92B). If the ratio is less than the lower limit value, the sink fails to have a sufficiently large radiating area, whereas ratios in excess of the upper limit value result in a diminished fin pitch P and an increased pressure loss. The sink fails to achieve an improved radiation efficiency in either case. More preferably, the above ratio is 10 to 30.

The heat sink 90 is fixed to the CPU assembly 4 by two first clips 110 provided on the heat sink 90, and two second clips 40 provided on the assembly 4.

Figure 10:
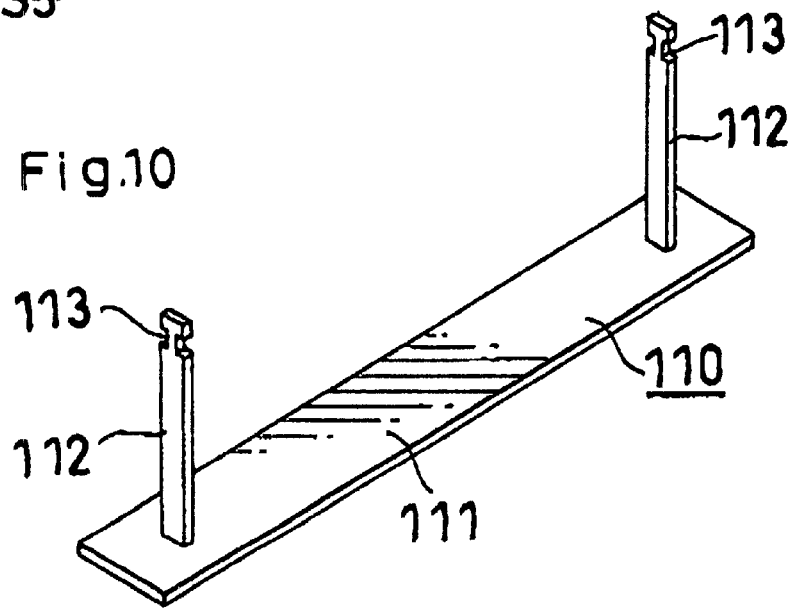
FIG. 10 is a perspective view showing a first clip of the first embodiment.

With reference to FIG. 10, each first clip 110 comprises a base 111 in the form of a horizontal strip and fittable in the furrow 95 in the lower surface of the base plate 91 between the adjacent fin rows 93A, 93B, and a plurality of, e.g., two, striplike logs 112 extending upward from the base 11 integrally therewith and spaced apart transversely of the base plate 91. Each leg 112 has a neck 113 as positioned close to its upper end. The leg 112 is insertable through a bore 91b formed in the sink base plate 91 through the bottom wall of the furrow 95 so as to project upward beyond the upper surface of the base plate 91. The first clip 110 is made from a sheet of spring steel, stainless steel or the like by press work and has springlike elasticity.

Each second clip 40 comprises a plate spring 41 in the form of a strip and having a length greater than the spacing between the front and rear fin rows 93A. The plate spring 41 providing the second clip 40 comprises a flat base 42 positionable along the outer surface of cover 13 of the CPU assembly 4, and two slanting portions 43, 44 extending respectively from opposite ends of the base 42 integrally therewith and each slanting upward toward an outer end thereof. One of the slanting portions, 43, is formed with a slot 45 having a length larger than the width of leg 112 of the first clip 110 end a width larger than the width of the neck 113, with the length positioned widthwise of the second clip 40. The other slating portion 44 is formed with a slit 46 extending from one side edge thereof widthwise of the second clip 40 and having a width smaller than the width of the leg 112 and larger than the width of the neck 113. The widths of the slot 45 and the slit 46 are greater than the thickness of the leg 112. The second clip 40 is made from a sheet of spring steel, stainless steel or the like by press work.

The heat sink 90 is fixed to the CPU assembly 4 in the following manner.

First, the legs 112 of each first clip 110 are inserted through the corresponding bores 91b in the radiating base plate 91 of the heat sink 90 from below and caused to project upward beyond the upper surface of the base plate 91, and the base 111 is fitted into the furrow 95 in the lower surface of the base plate 91. The legs 112 of the first clip 110 are then inserted through holes 4a formed in the CPU assembly 4 from below, causing the leg 112 outer ends to project upward beyond the cover 13 of the assembly 4. The distance from the upper surface of the cover 13 to the neck 113 of each leg 112 inserted through the hole 4a of the CPU assembly 4 is smaller than the vertical distance from the lower surface of the base 42 of the second clip 40 in a state not deformed elastically to the slot 45 or slit 46. The radiating base plate 91 of the heat sink 90 has a thermally conductive resin film (not shown) adhered to the heat receiving portion 91a of the upper surface thereof. The heat sink 90 is joined to the CPU assembly 4 with the film in intimate contact with the CPU 11.

Subsequently the second clip 40 is positioned with its length extending transversely of the resulting assembly and with the slanting portion 43 located at the left side of the assembly, and the left leg 112 of one of the first clips 110, i.e., of the rear clip 110, is inserted through the slot 45 with its neck 113 positioned in the slot 45. The second clip 40 is then elastically deformed while being turned about the neck 113 so as to position the slit 46 at a level corresponding to the neck 113 of left leg 112 of the front first clip 110, and the slit 46 is fitted around the neck 113. The portions of the left legs 112 of the two first clips 110 which portions are closer to the leg outer ends than the necks 113 are then engaged respectively with an edge part defining the slot 45 in the slanting portion 43 of the second clip 40 as elastically deformed and with an edge part defining the slit 46 of the other slanting portion 44 of the second clip 40 as elastically deformed. In this way, the heat sink 90 is fixed to the CPU assembly 4. At this time, the second clips 40 are elastically deformed as indicated in solid lines in FIG. 2 from the state indicated in chain lines, and the first clips 110 are biased upward, i.e., toward the CPU assembly 4, by the repulsive force of the elastically deformed second clips 40 which force is acting in a direction indicated by arrows D in FIG. 2. Accordingly, the heat receiving portion 91a of upper surface of the radiating base plate 91 of the heat sink 90 is pressed against the CPU 11 of the assembly 4 under increased pressure, with the thermally conductive resin film interposed therebetween. This ensures heat transfer from the CPU 11 of the CPU assembly 4 to the heat sink 90 with an improved efficiency for the sink to exhibit satisfactory radiating performance.

Second Embodiment

Figure 11:
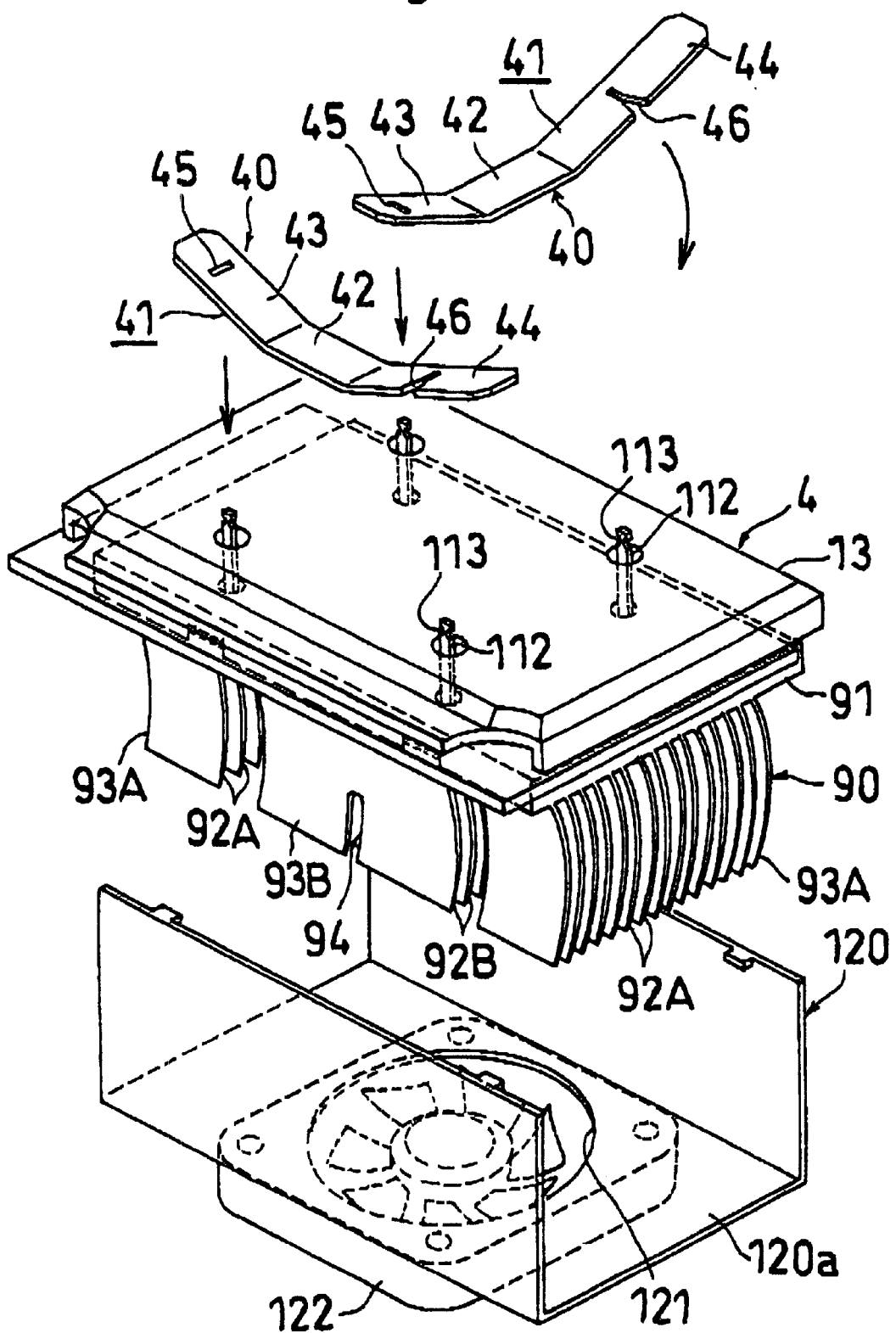
FIG. 11 is a perspective view showing a heat sink of second embodiment.

This embodiment is shown in FIG. 11.

In the case of this embodiment, a heat sink 90 within the housing 1 of a personal computer is provided with no duct 6, and therefore no fan 7. Instead of these members, radiating fins 92A. 92B of the sink 90 are covered, as seen from the front and rear, with a plastic fin cover 120 which is open upward. The fin cover 120 has a bottom wall 120a which is formed with an opening 121. A cooling fan 122 is attached to the lower surface of the bottom wall 120a of the fin cover 120. The fin cover 120 and the cooling fan 122 serve to cause air to be drawn into the fin cover 120, to flow inward longitudinally of the housing between the fins 92A, 92B adjacent to one another transversely of the housing and also downward and to be discharged from the cover 120 through the opening 121.

Preferably the heat sink 90 of the present embodiment is 3 to 8 mm in the thickness T of the radiating base plate 91, 15 to 35 mm in the height H of the fins 92A, 92B from their base ends to the outer ends thereof, 0.2 to 0.7 mm in the thickness of the fins 92A, 92B, and 1.5 to 2.5 mm in the fin pitch P of the fins 92A, 92B which are adjacent to one another transversely of the housing 1.

The thickness T of the radiating base plate 91 is determined by the same experiment as conducted for the first embodiment. The height H of the fins 92A, 92B from their base ends to the outer ends thereof, the thickness of the fins 92A, 92B and the fin pitch P of the fins 92A, 925 are determined by the same experiments as conducted for the first embodiment with the exception of using the cooling fan 122 which is 0.5 $m^3$/min in maximum quantity of air flow and 4400 rpm in rated speed of rotation. Consequently, the heat sink is the same as the first embodiment in the thickness of the base plate 91 and the thickness of the fins 92A, 92B.

Figure 12:
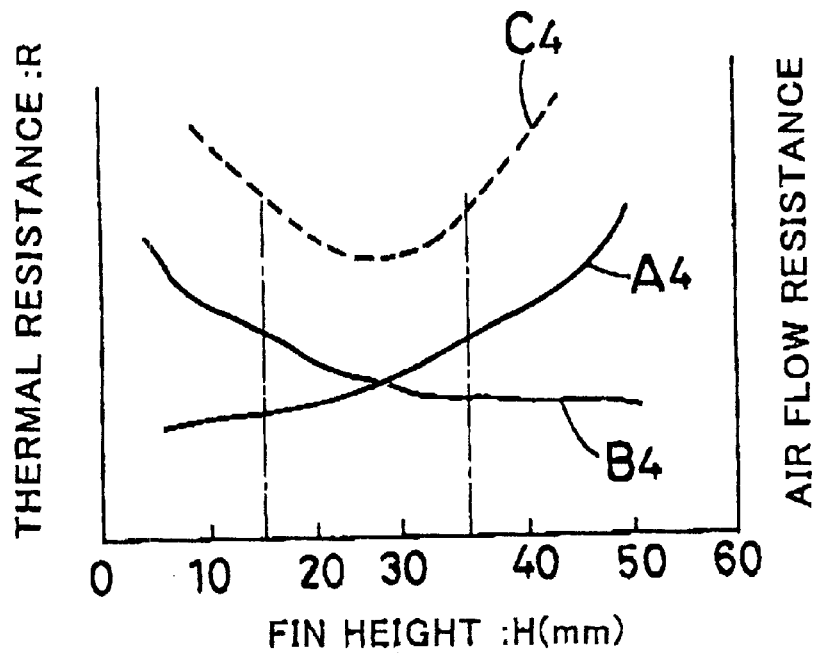
FIG. 12 is a graph showing the relationships of the height of radiating fins of the second embodiment with the thermal resistance and with the air flow resistance.

The height H of the fins 92A, 923 from their base ends to the outer ends thereof is 15 to 35 mm, as determined with reference to Curve C4 obtained by superposing Curve A4 of FIG. 12 representing the relationship between the thermal resistance R and the fin height H on Curve B4 of FIG. 12 representing the relationship between the air flow resistance and the fin height H. More specifically stated, if the height H of the fins 92A, 92B is less than 15 mm, sufficiently reduced air flow resistance is not available, whereas a height in excess of 35 mm results in a lower fin efficiency and greater thermal resistance R. Thus, the heat sink fails to achieve an improvement in radiation efficiency in either case. If the fin height H is less than 15 mm, the air flow resistance increases presumably because the clearances for the air flow between the fins 92A, 92B adjacent to one another transversely of the base plate 91 then diminish in area.

Figure 13:
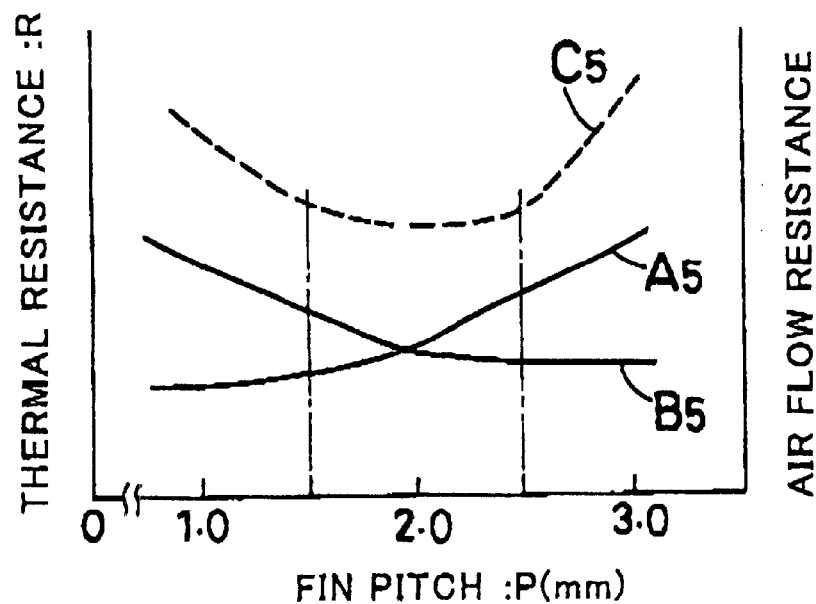
FIG. 13 is a graph showing the relationships of the fin pitch of radiating fins of the same embodiment with the thermal resistance and with the air flow resistance.
Figure 14:
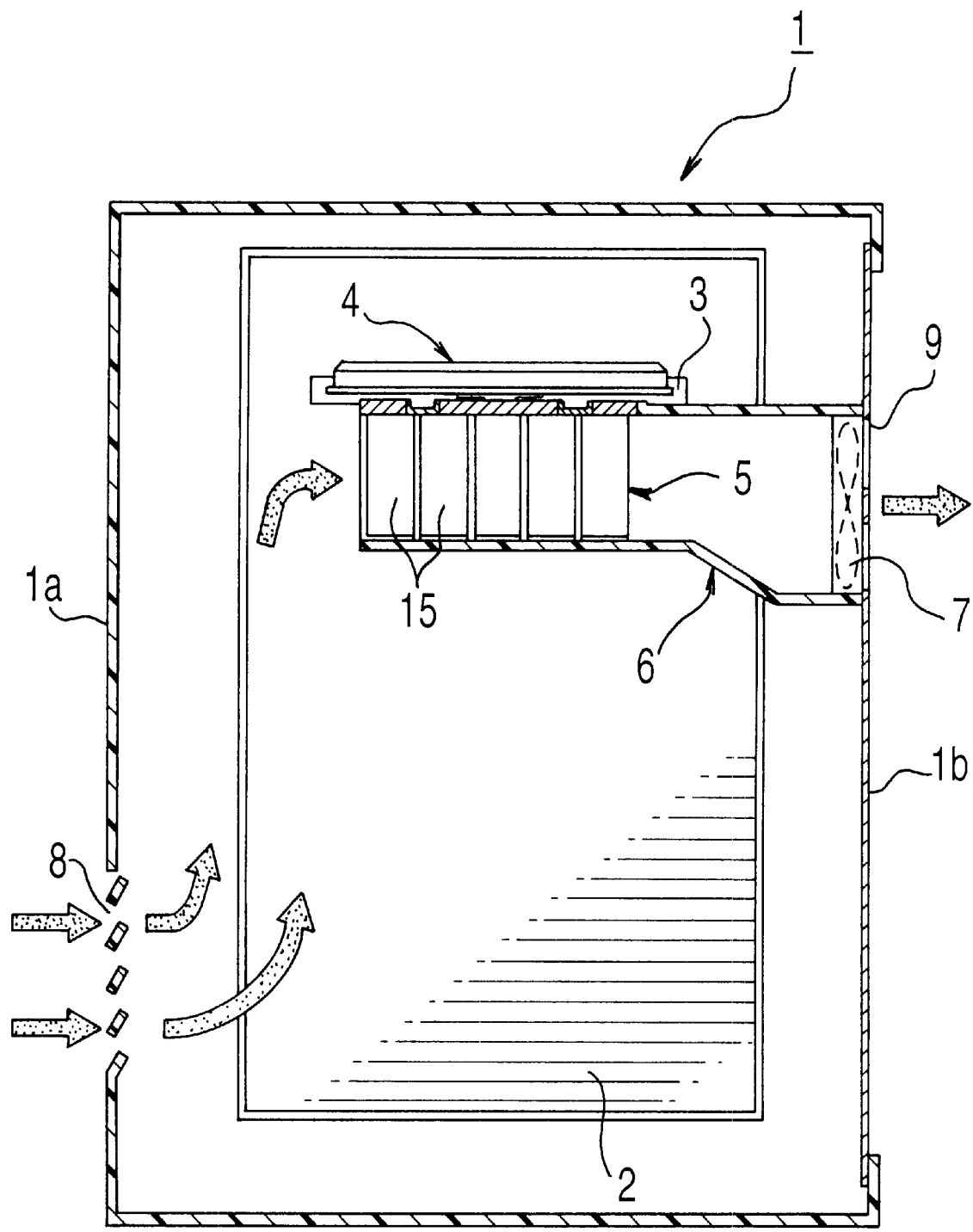
FIG. 14 is a view in vertical section schematically showing a personal computer having a heat sink of third embodiment of the invention.
Figure 15:
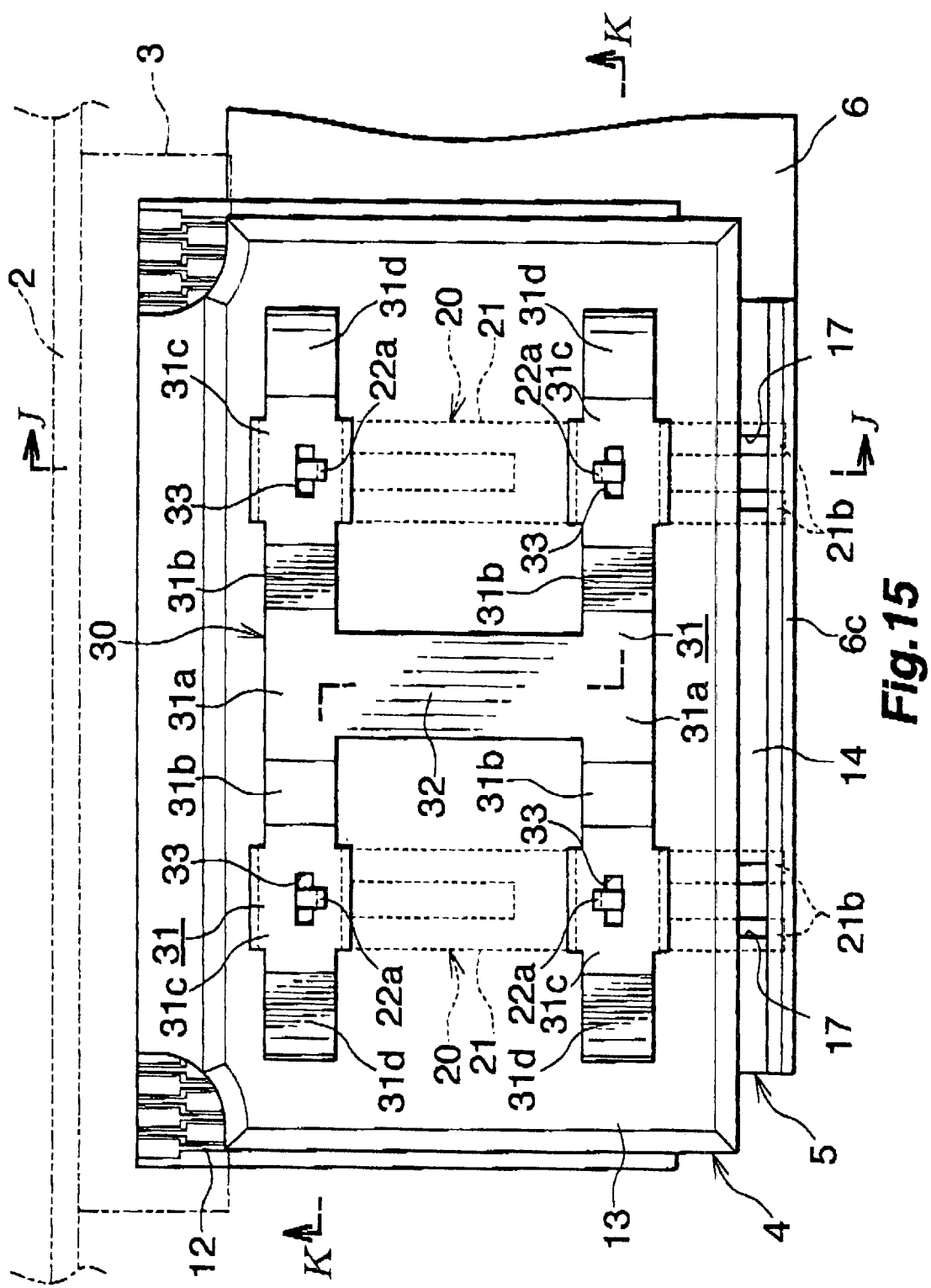
FIG. 15 is a plan view showing the portion of CPU assembly in the, personal computer of FIG. 14 on an enlarged scale.
Figure 16:
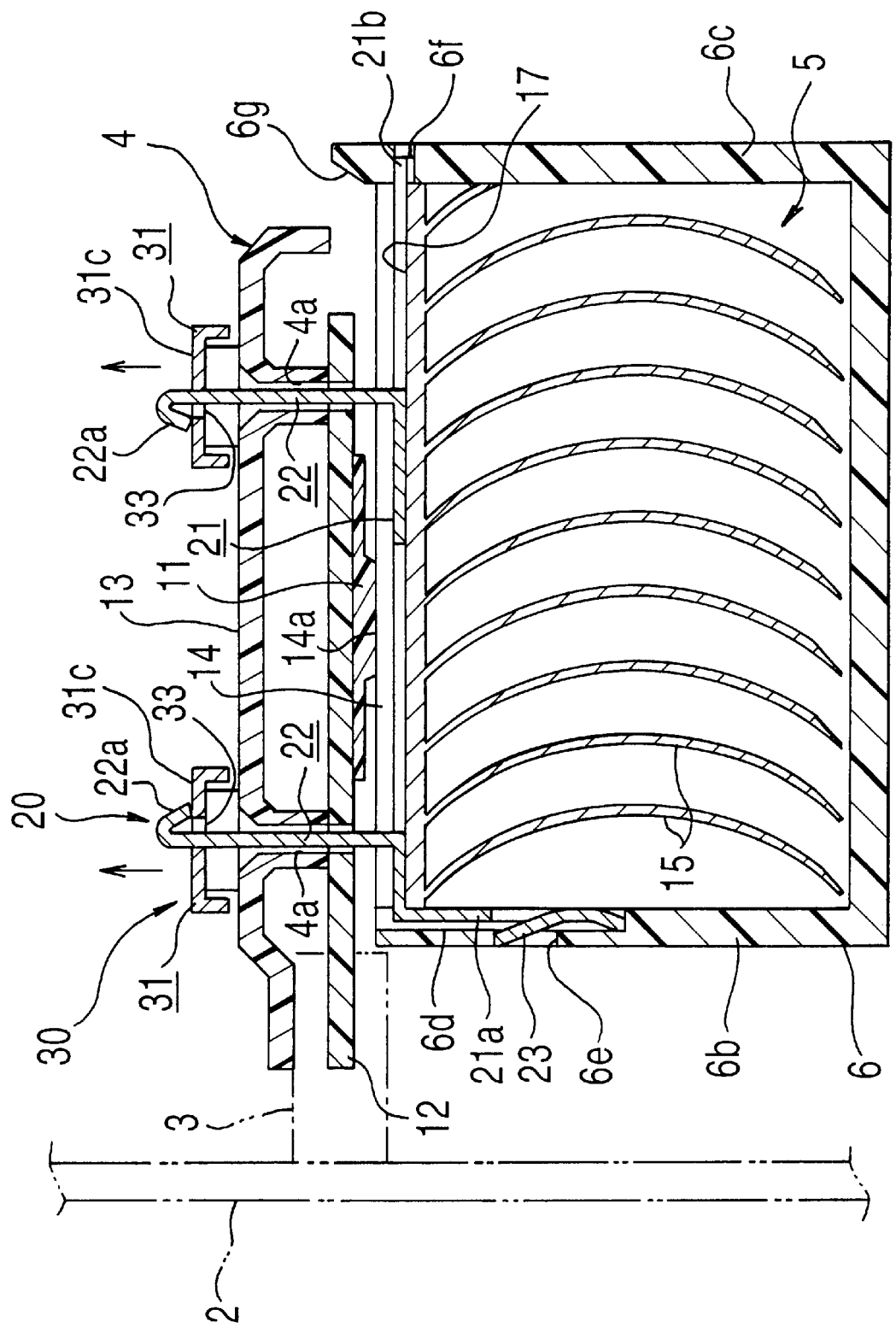
FIG. 16 is a view in section taken along the line J—J in FIG. 15.
Figure 17:
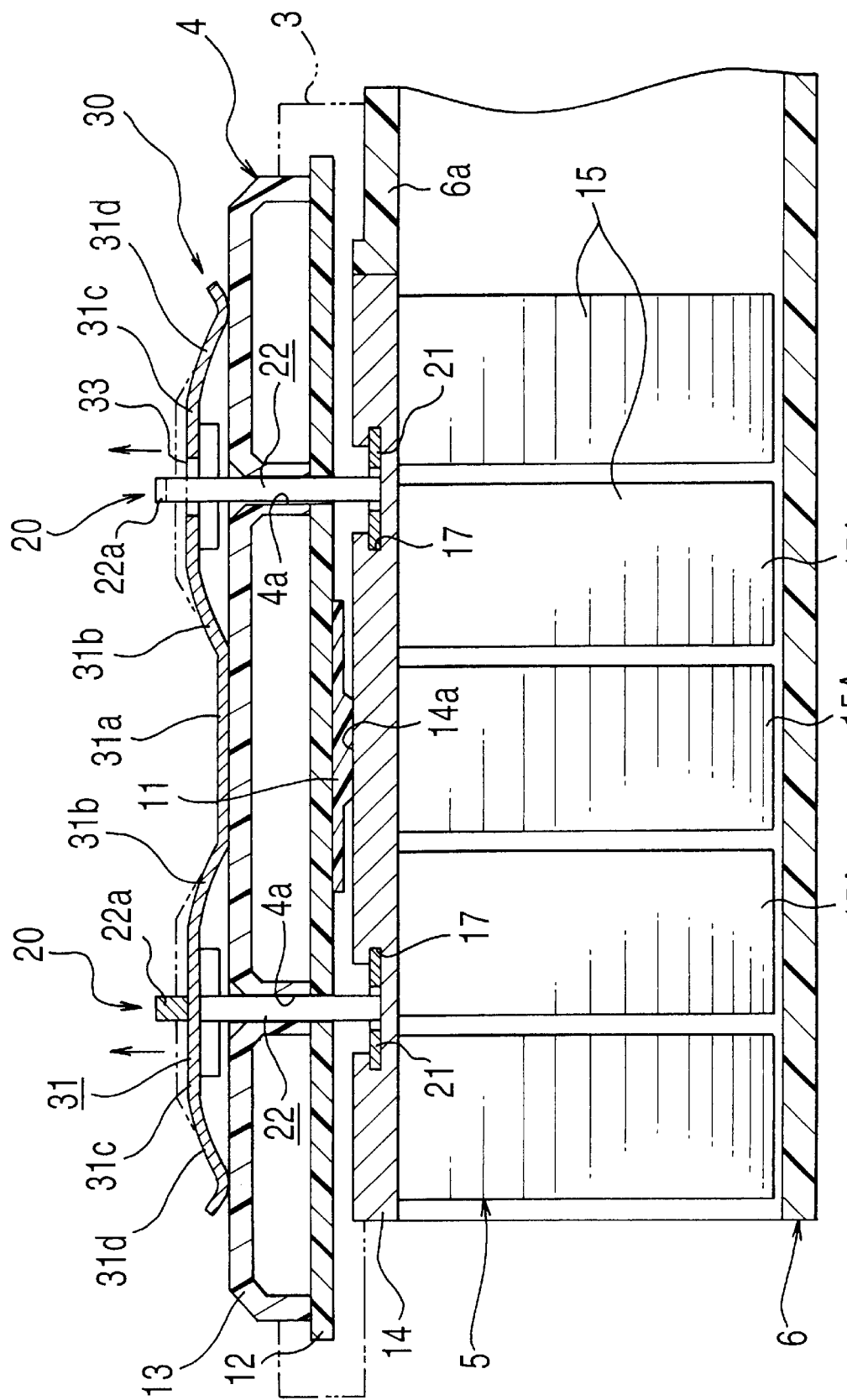
FIG. 17 is a view in section taken along the line K—K in FIG. 15.
Figure 18:
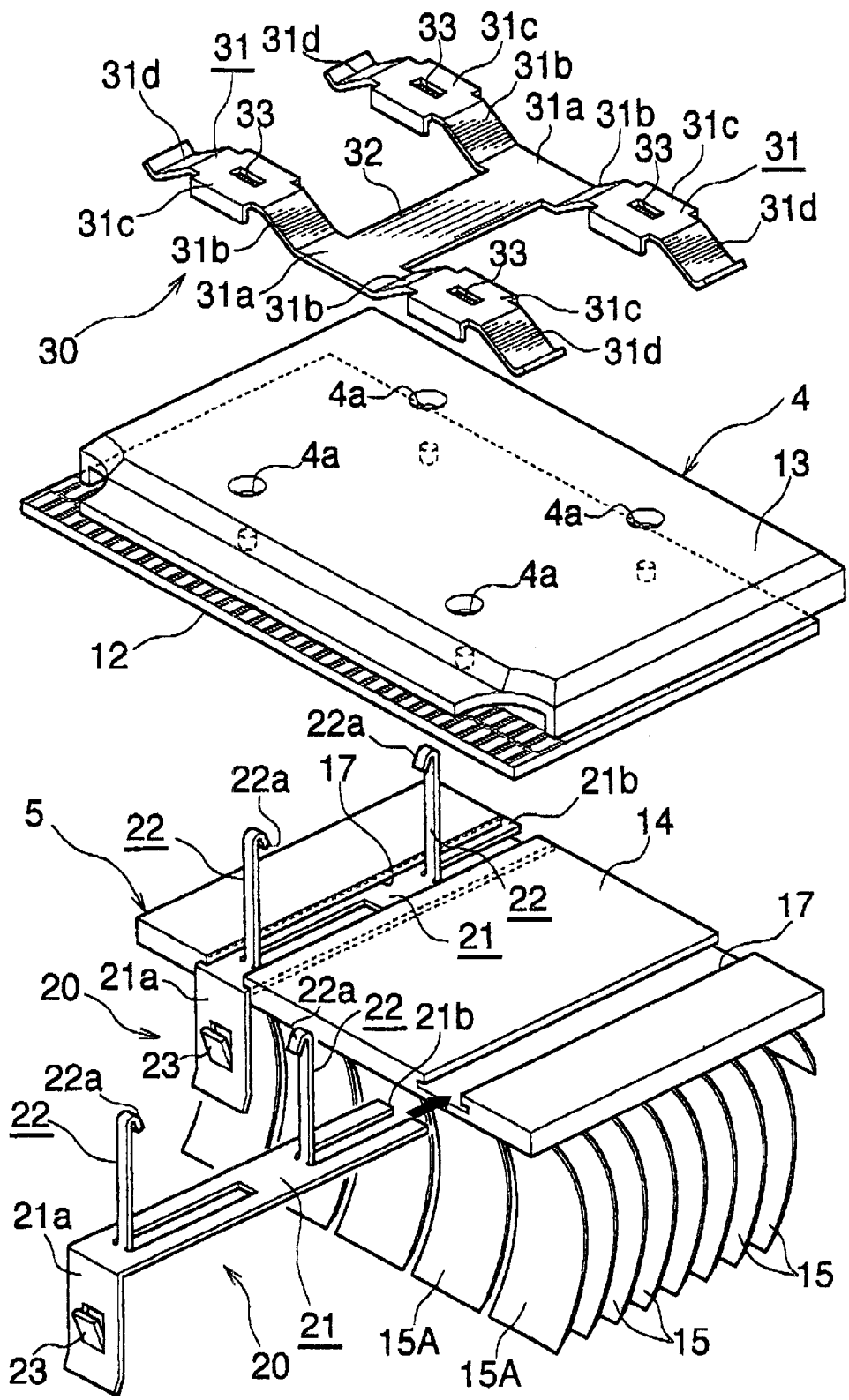
FIG. 18 is an exploded perspective view showing how to fix the heat sink to the CPU assembly according to the third embodiment.
Figure 19:
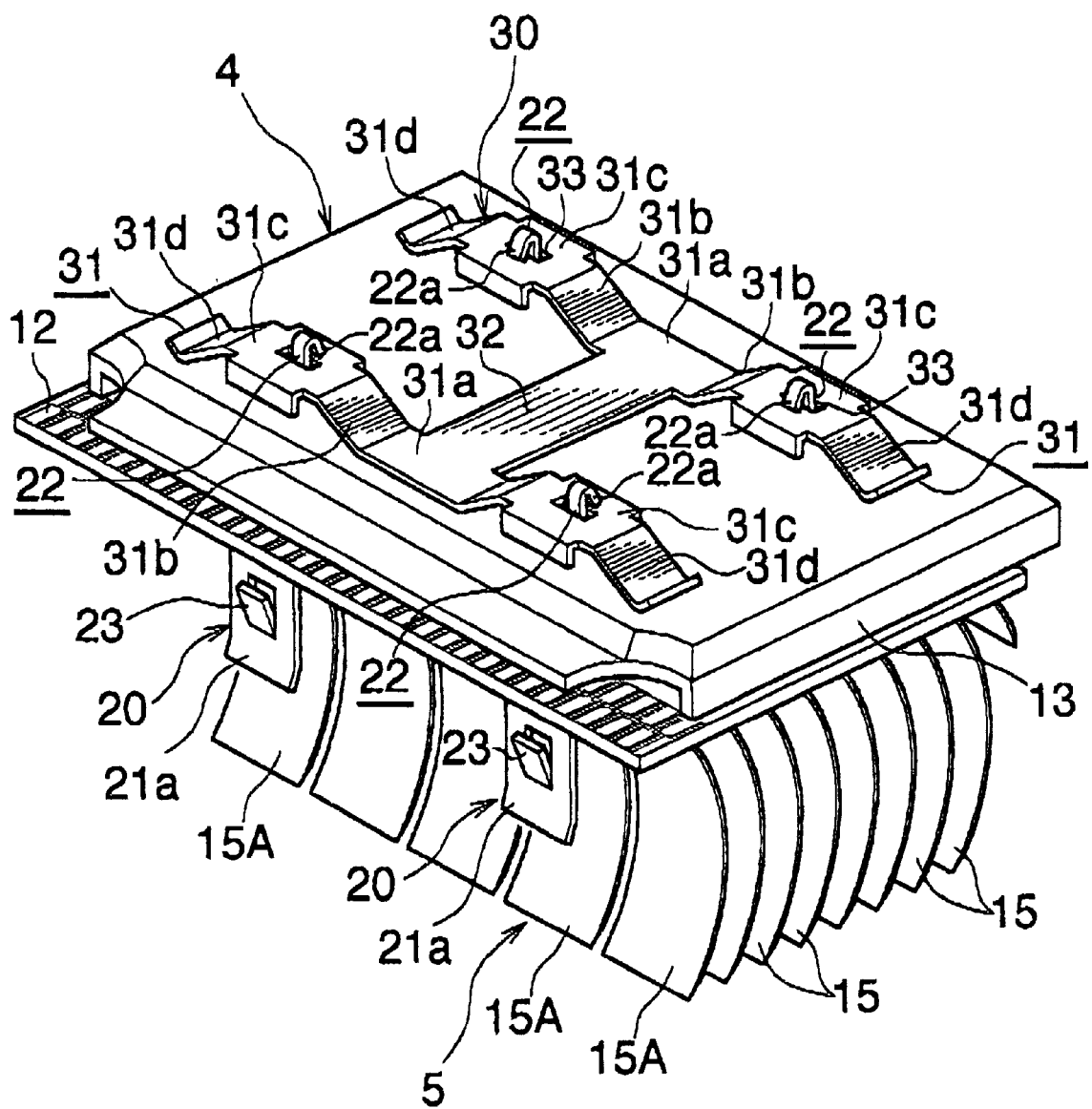
FIG. 19 is a perspective view showing the heat sink as fixed to the CPU assembly according to the same embodiment.

The fin pitch P of the fins 92A, 92B which are adjacent to one another in the transverse direction is 1.5 to 2.5 mm, as determined with reference to Curve C5 obtained by superposing Curve A5 of FIG. 13 representing the relationship between the thermal resistance R and the fin pitch R on Curve B5 of FIG. 13 representing the relationship between the air flow resistance and the fin pitch P. More specifically stated, if the fin pitch P of the fins 92A, 92B is less than 1.5 mm, increased air flow resistance will be offered, while a pitch in excess of 2.5 mm leads to a reduction in air flow resistance but fails to afford a required area of heat conduction to result in increased thermal resistance R. An improved radiation efficiency is not available in either case.

In the case where the fin cover 120 and the cooling fan 122 are used, it is desired that the heat sink 90 be 7 to 44 in the ratio of the height H of the fins 92A, 92B from their base end to the outer ends thereof to the spacing between the fins 92A or 92B adjacent to one another transversely of the base plate 91 (the fin pitch P minus the thickness of one fin 92A or 92B). If the ratio is less than the lower limit value, the sink fails to have a sufficiently large radiating area, whereas ratios in excess of the upper limit value result in a diminished fin pitch P and an increased pressure loss. The sink fails to achieve an improved radiation efficiency in either case. More preferably, the above ratio is 10 to 20.

The present embodiment differs from the first embodiment in the height R of the fins 92A, 92B, the fin pitch P and the ratio of the fin height H to the spacing between the fins 92A or 92B adjacent to one another in the transverse direction because of the difference in the speed of air flow.

Third Embodiment

This embodiment is shown in FIGS. 14 to 19. In describing this embodiment, the upper and lower sides of FIG. 14 will be referred to as "upper" and "lower," respectively, the left-hand side of the drawing (left-hand side of FIG. 15) as "front," and the opposite side thereof as "rear." Further the left-hand side and the right-hand side of FIG. 16 will be referred to as "left" and "right," respectively.

The heat sink 5 of this embodiment comprises a radiating base plate 14 made of an aluminum extrudate and having an upper side providing a flat surface in its entirety and a heat receiving portion 14a provided at the central portion of the surface for contact with a CPU 11, and a plurality of fin rows 15A provided on the lower surface of the base plate 14. The fin rows 15A, which are five in number in the present embodiment, each comprise a multiplicity of tonguelike radiating fins 15 formed in a raised form by cutting integrally with the base plate 14 and arranged at a spacing in the direction of extrusion of the plate 14 (leftward or rightward, i.e., transversely of the sink). These fin rows 15A extend transversely of the heat sink and are spaced apart forward or rearward, i,e., longitudinally of the sink. The radiating fins 15 are each in the form of a circular-arc bulging rightward at the midportion of the height. The base plate 91 of the sink 5 has a plurality of, e.g., two, internally enlarged T-shaped furrows 17 formed in its upper surface transversely of the base plate and spaced apart longitudinally thereof. The furrow T is not limited to the T-shaped groove but can be a dovetail groove. As is the case with the first embodiment, fin forming ridges extending transversely of the base plate 14 and formed when the plate 14 having the furrows 17 is extruded are louvered, that is, out to a raised form, whereby the radiating fins 15 of the heat sink 5 are formed.

The heat sink 5 is fixed to a CPU assembly 4 by two first clips 20 provided on the sink 5 and a second clip 30 provided on the CPU assembly 4.

The first clip 20 comprises a base 21 in the form of a horizontal strip and to be disposed in the furrow 17, and a plurality of legs, e.g., two legs 22, integral with the base and spaced apart longitudinally thereof. The base 21 has a width larger than the width between the opening edges of the furrow 17 and smaller than the width of the furrow bottom, i.e., of the bottom surface defining the furrow 17, whereby the base 21 as fitted in the furrow 17 is prevented from slipping out of the furrow upward to hold the first clip 20 to the base plate 14 of the heat sink 5. The base 21 has a length slightly greater than that of the furrow 17 and is integral with a downward bent portion 21a at its left end. The engagement of the bent portion 21a with the left side face of the base plate 14 of the heat sink 5 positions the first clip 20 in place with respect to the transverse direction, further preventing the clip 20 from slipping off rightward. The downward bent portion 21a has a lug 23 projecting leftward, The base 21 has a right end slightly projecting outward beyond the right side face of the base plate 14. The rightward projection is indicated at 21b. Each leg 22 of the first clip 20 is in the form of a strip having a width smaller than the opening width of the furrow 17 and positioned lengthwise of the base plate 14. The leg 22 is provided at its upper end with a hook 22a (engaging portion) formed by folding over the leg end transversely of the base plate. The first clip 20 is made from a sheet of spring steel, stainless steel or the like by press work and has spring elasticity.

The second clip 30 comprises two striplike plate springs 31 extending in parallel to each other and having a width positioned transversely of the base plate 14 and a length greater than the distance between the forwardly and rearwardly outer opening edges of the two furrows 17, with its length positioned lengthwise of the plate 14, and a connector 32 interconnecting the plate springs 31 at the lengthwise midportions thereof. The plate springs 31 of the second clip 30 each comprise a flat horizontal base 31a extending along the outer surface of a cover 13 of the CPU assembly 4, two first slanting portions 31b extending from the respective opposite ends of the base 31a integrally therewith and each slanting upward toward the outer end thereof, i.e., forwardly or rearwardly outward, two horizontal portions 31c each integrally extending from the outer end of the first slanting portion 31b forwardly or rearwardly outward, and two second slanting portions 31d each extending from the outer end of the horizontal portion 31c integrally therewith and slanting downward forwardly or rearwardly outward to position the outer end thereof in bearing contact with the outer surface of cover 13 of the CPU assembly 4. Each horizontal portion 31c of each plate spring 31 is formed with a slot 33 (hole) having a length larger than the width of the leg 22 of the first clip 20 and positioned lengthwise of the base plate 14. The slot 33 has such a width in the transverse direction that the hook 22a at the outer end of the leg 22, as elastically deformed to a closed state, is movable through the slot 33. The second clip 30 is made from a sheet of spring steel, stainless steel or the like by press work and has spring elasticity.

The heat mink 5 ms fixed to the CPU assembly 4 in the following manner.

First, the base 21 of each first clip 20 is inserted at its right end into the internally enlarged furrow 17 of the radiating base plate 14 of the sink 5 through the left-end opening of the furrow, whereby the first clip 20 is held to the mink 5. The leg 22 of the first clip 20 are then inserted through holes 4a formed in the CPU assembly 4 from below, causing the leg outer ends to project upward beyond the cover 13 of the assembly 4. At this time, the distance from the upper surface of the cover 13 to the end of the hook 22a of the leg 22 becomes smaller than the distance from the lower surface of the base 31a of the second clip 30 to the upper surface of the horizontal portion 31c thereof. The radiating base plate 14 of the heat sink 5 has a thermally conductive resin film (not shown) adhered to the heat receiving portion 14a of the upper surface thereof. The heat sink 5 is joined to the CPU assembly 4 with the film in intimate contact with the CPU 11 of the assembly 4.

Next, the second clip 30 is disposed above the CPU assembly 4, with the clots 33 in the horizontal portions 31c of the plate springs 31 positioned immediately above the respective lags 22, and the horizontal portions 31c of the plate springs 31 of the second clip 30 are depressed, whereby the legs 22 are forced through the respective slots 33. More specifically, the left legs 22 of the two first clips 20 are forcibly inserted through the two slots 33 in the left plate spring 31 of the second clip 30, and the right legs 22 through the two slots 33 in the right plate spring 31 of the second clip 30. At this time the hook 22a at the end of each leg 22 is elastically deformed to a closed state and restores itself upon passage through the slot 33. On the other hand, the horizontal portions 31c, and first and second slanting portions 31b, 31d of each plate spring 31 of the second clip 30 elastically deform so as to move down from the state shown in chain lines in FIG. 17 as indicated in solid lines, with the result that each hook 22a of the first clip 20 is engaged with an edge part defining the slot 33 in the horizontal portion 31c of the second clip plate spring 31 as elastically deformed. In this way, the heat sink 5 is fixed to the CPU assembly 4. In this state, the first clips 20 are biased upward, i.e., toward the CPU assembly 4, by the plate springs 31 of the second clips 30 as elastically deformed. Consequently, the heat receiving portion 14a of the radiating base plate 14 of the heat sink 5 is pressed against the CPU 11 of the assembly 4 under increased pressure, with the thermally conductive resin film interposed therebetween. This ensures heat transfer from the CPU 11 of the CPU assembly 4 to the heat sink 5 with an improved efficiency for the sink to exhibit satisfactory radiating performance.

For reference, how to attach a duct 6 to the heat sink 5 will be described. The duct 6 is attached to the sink 5 after the sink 5 is fixed to the CPU assembly 4.

The duct 6 has an upper wall 6a, a front portion of which is cut out over the entire width. The radiating base plate 14 of the heat sink 5 is positioned in the cut-out portion of the wall 6a between the upper ends of left and right walls 6b, 6c of the duct 6. The left side wall 6b of the duct 6 is formed, at the inner surface portion thereof to be opposed to each furrow 17, with a recessed portion 6d extending vertically for the downward bent portion 21a of the first clip 20 to fit in. A hole 6e for the lug 23 of the projection 21a of the first clip 20 to fit in is formed in the bottom wall of the recessed portion 6d and opened to the outer surface of the left side wall 6b. An opening 6f for fitting in the projection 21b of the first clip 20 is formed in the duct right side wall 6c at the portion thereof to be opposed to the furrow 17. A slope 6g slanting upwardly rightward in formed in the inner surface of the duct right side wall 6c at a portion thereof above the opening 6f.

The duct 6 is fitted around the heat sink 5 from below so that the radiating base plate 14 of the heat sink 5 is positioned in the cut-out portion of the upper wall 6a between the upper ends of left and right walls 6b, 6c. At this time, the projection 21b of the base 21 of the first clip 20 moves down relative to the duct 6 along the slope 6g of the right side wall 6c of the duct 6, with the result that the right side wall 6c elastically deforms rightward and restores itself upon the projection 21b fitting into the opening 6f. On the other hand, the lug 23 of the downward projection 21a of the base 21 is elastically deformed rightward by being pushed by the inner surface of the duct left side wall 6b, and restores itself, fits into the hole 6e and has its upper end engaged by an upper edge portion defining the hole 6e upon reaching the portion of the hole 6e. In this way, the duct 6 is attached to the heat sink 5.

Fourth embodiment

Figure 20:
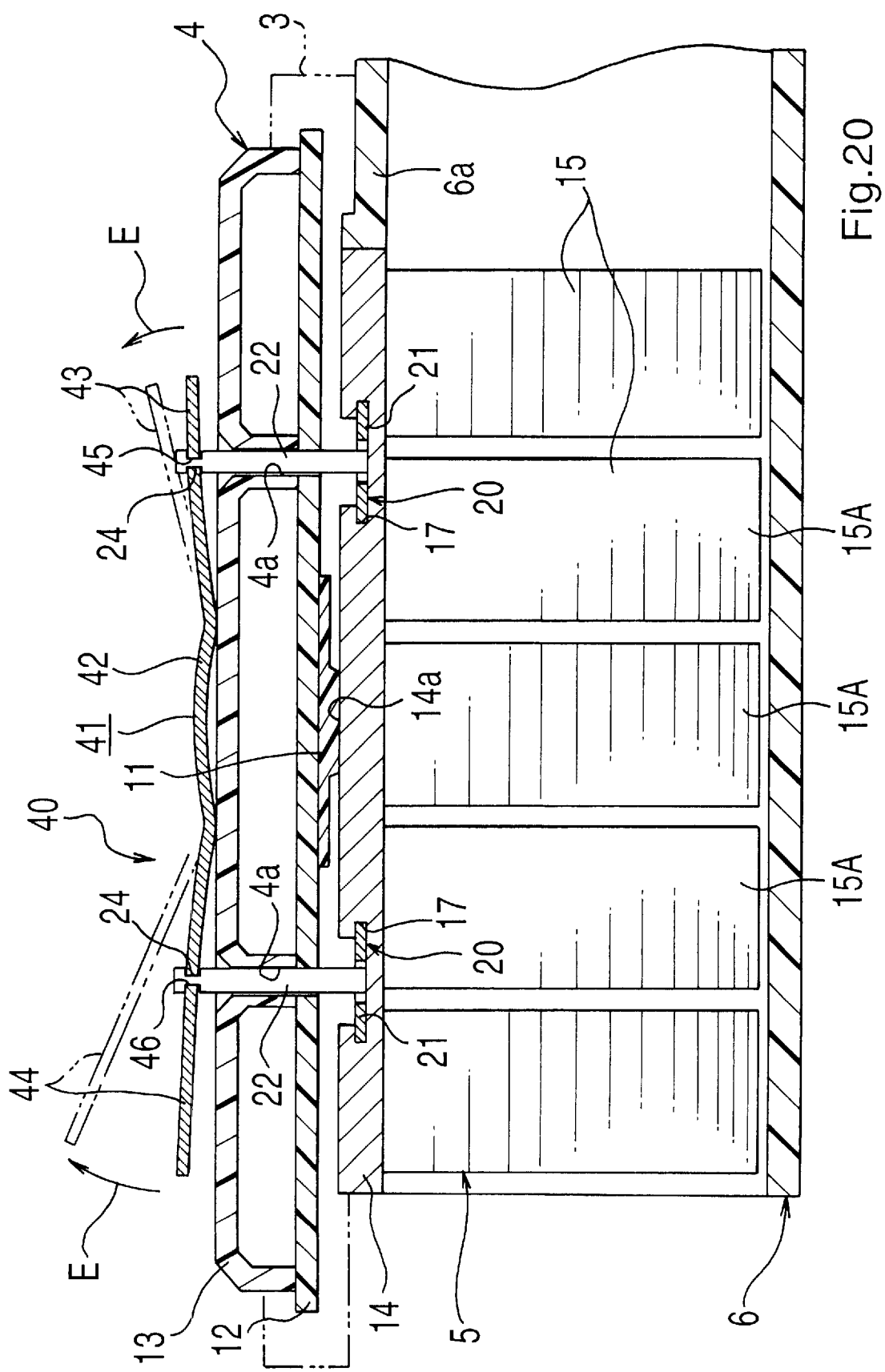
FIG. 20 is a fragmentary view in vertical section showing a fourth embodiment.
Figure 21:
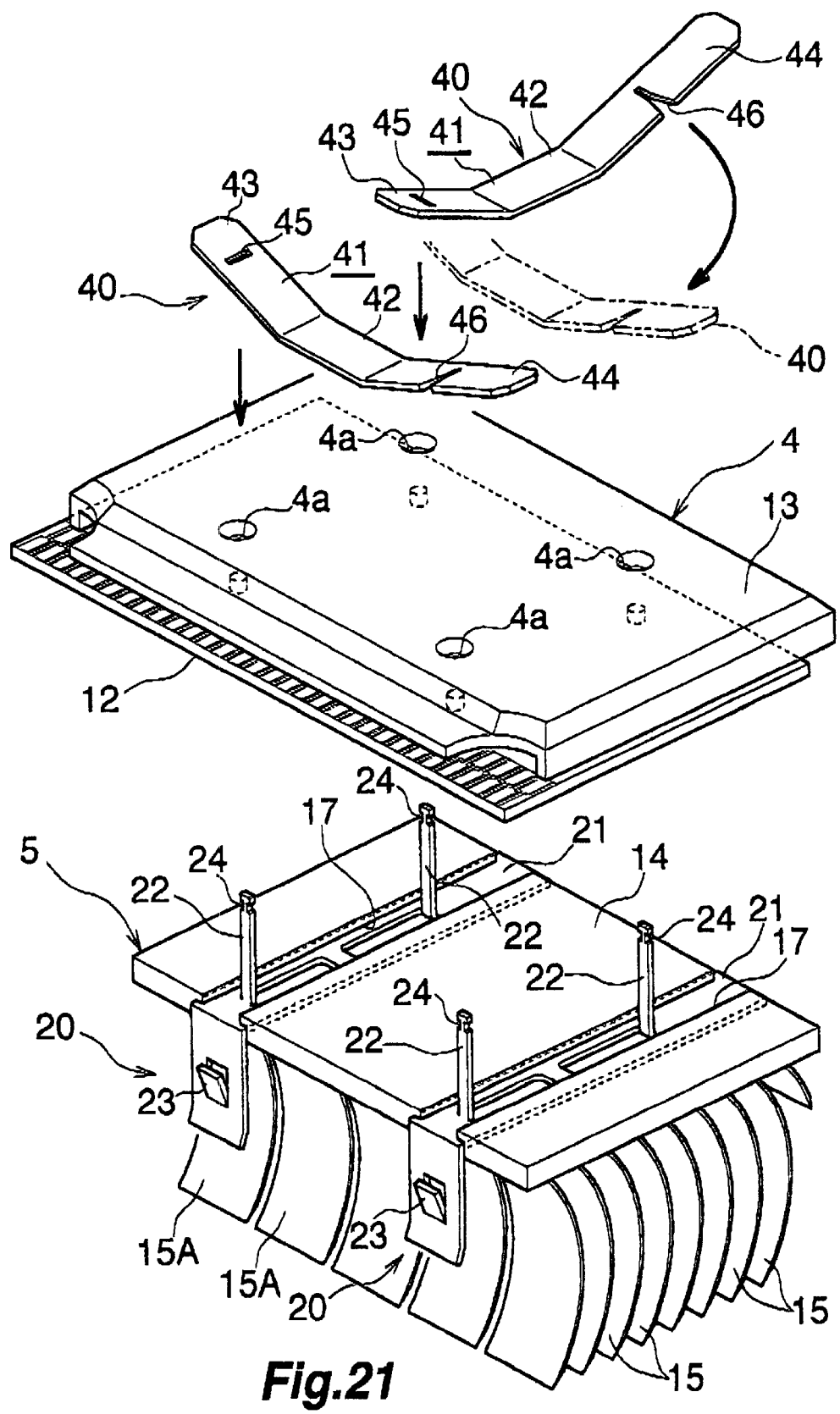
FIG. 21 is an exploded perspective view showing how to fix a heat sink to a CPU assembly according to the fourth embodiment.
Figure 22:
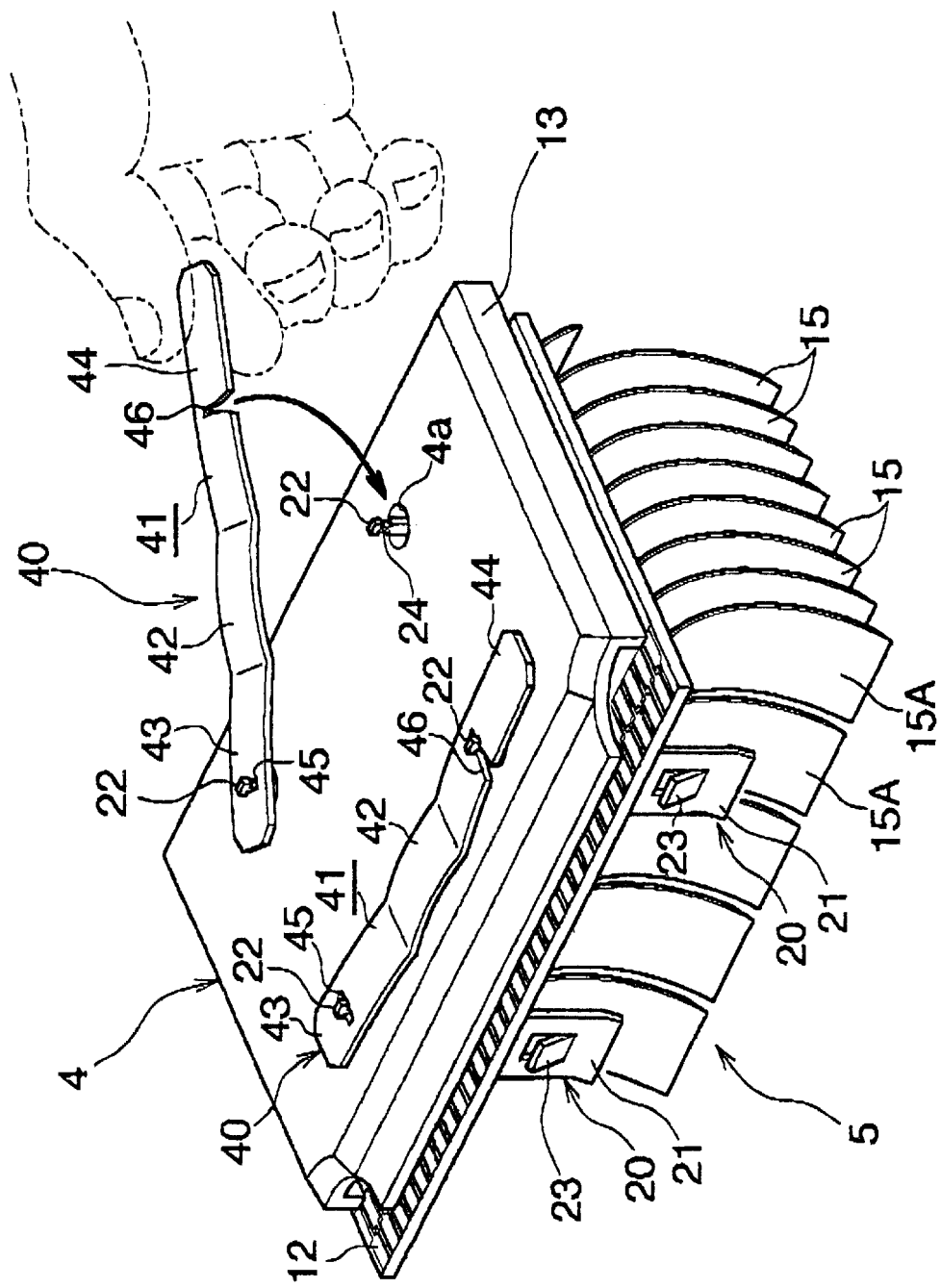
FIG. 22 is a perspective view showing how to engage a second clip with a first clip according to the same embodiment.

This embodiment is shown in FIGS. 20 to 22. The terms upper, lower, front, rear, left and right as used in describing this embodiment each mean the same direction as in the case of the third embodiment.

In the case of the present embodiment, two striplike legs 22 of each of two first clips 20 have no hook 22a at their outer ends but each have a neck 24 at a portion thereof close to the outer end. Two second clips 40 are arranged on a CPU assembly 4.

Each of the second slips 40 comprises a striplike plate spring 41 which has a length larger than the distance between the leftward and rightward outer opening edges of two internally enlarged furrows 17 in a radiating base plate 14 of a heat sink 5. The second clip 40 has a slanting portion 43 which is formed with a slot 45 having a length larger than the width of leg 22 of the first clip 20 and a width larger than the width of the neck 24, with the length positioned widthwise of the second clip 40. Another slating portion 44 of the clip 40 is formed with a slit 46 extending from one side edge thereof widthwise of the second clip 40 and having a width smaller than the width of the leg 22 and larger than the width of the neck 24. The widths of the slot 45 and the slit 46 are greater than the thickness of the leg 22. The second clip 40 is made from a sheet of spring steel, stainless steel or the like by press work.

The fourth embodiment otherwise has the same construction as the third.

The heat sink 90 is fixed to the CPU assembly 4 in the following manner.

The first clips 20 are mounted on the heat sink 5 and the sink 5 is attached to the CPU assembly 4 in the same manner as in the case of the third embodiment. The distance from the upper surface of the cover 13 to the neck 24 of each leg 22 inserted through the hole 4a of the CPU assembly 4 is smaller than the vertical distance from the lower surface of the base 42 of the second clip 40 in a state not deformed elastically to the slot 45 or slit 46.

Subsequently the second clip 40 is positioned with its length extending transversely of the resulting assembly and with the slanting portion 43 located at the left side of the assembly, and the left leg 22 of one of the first clips 20, i.e., of the rear clip 20, is inserted through the slot 45 with its neck 24 positioned in the slot 45. The second clip 40 is then elastically deformed while being turned about the neck 24 so as to position the slit 46 at a level corresponding to the neck 24 of left leg 22 of the front first clip 20, and the slit 46 is fitted around the neck 24. The portions of the left legs 22 of the two first clips 20 which portions are closer to the leg outer ends than the necks 24 are then engaged respectively with an edge part defining the slot 45 in the slanting portion 43 of the second clip 40 an elastically deformed and with an edge part defining the alit 46 of the other slanting portion 44 of the second clip 40 as elastically deformed. In this way, the heat sink 5 is fixed to the CPU assembly 4. At this time, the second clips 40 are elastically deformed as indicated in solid lines in FIG. 20 from the state indicated in chain lines, and the first clips 20 are biased upward, i.e., toward the CPU assembly 4, by the repulsive force of the elastically deformed second clips 40 which force is acting in a direction indicated by arrows B in FIG. 20. Accordingly, the heat receiving portion 14a of the radiating base plate 14 of the heat sink 5 is pressed against the CPU 11 of the assembly 4 under increased pressure, with the thermally conductive resin film interposed therebetween. This ensures heat transfer from the CPU 11 of the CPU assembly 4 to the heat sink 90 with an improved efficiency for the sink to exhibit satisfactory radiating performance.

Fifth Embodiment

Figure 23:
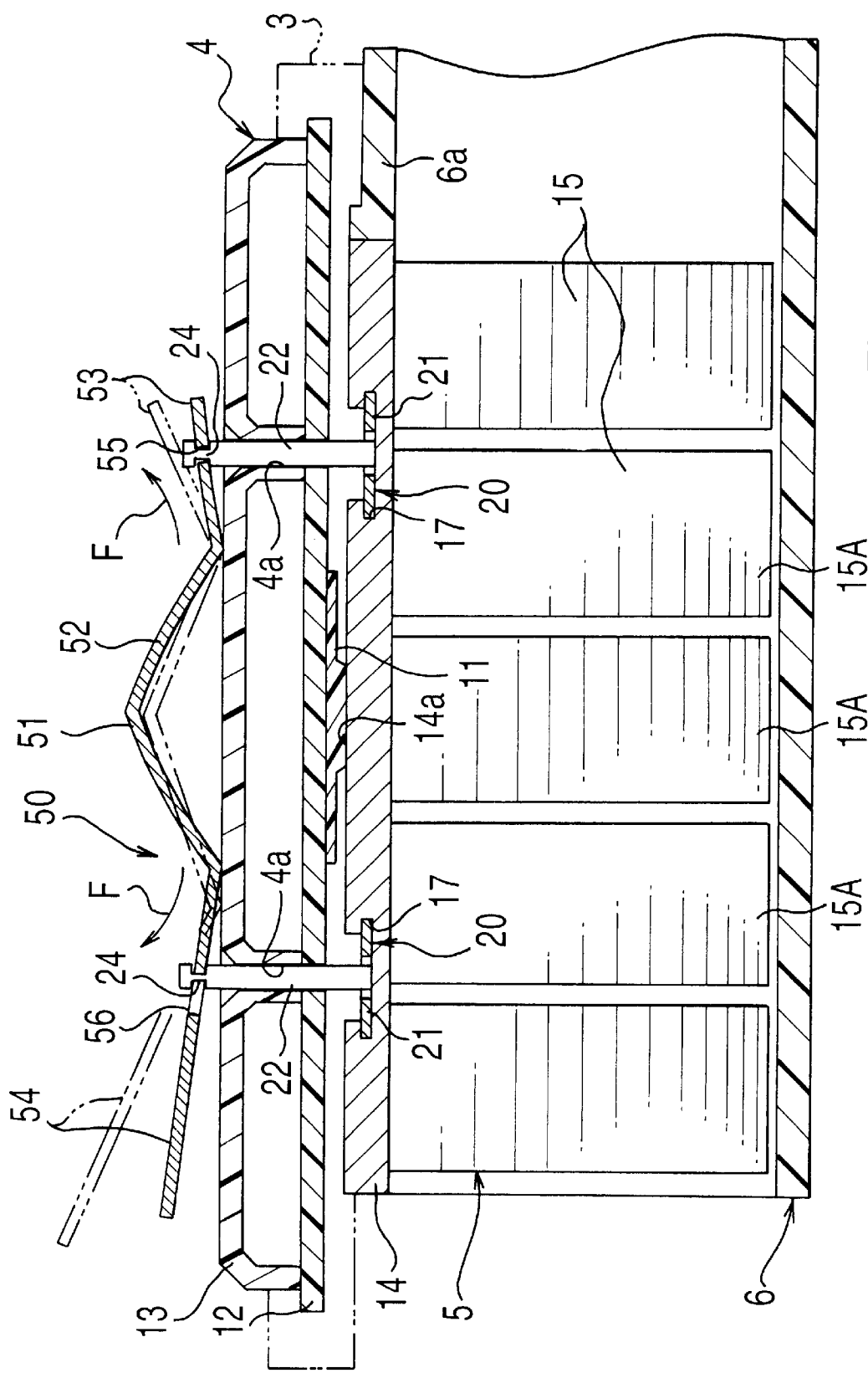
FIG. 23 is a view in section corresponding to FIG. 20 and showing a fifth embodiment.
Figure 24:
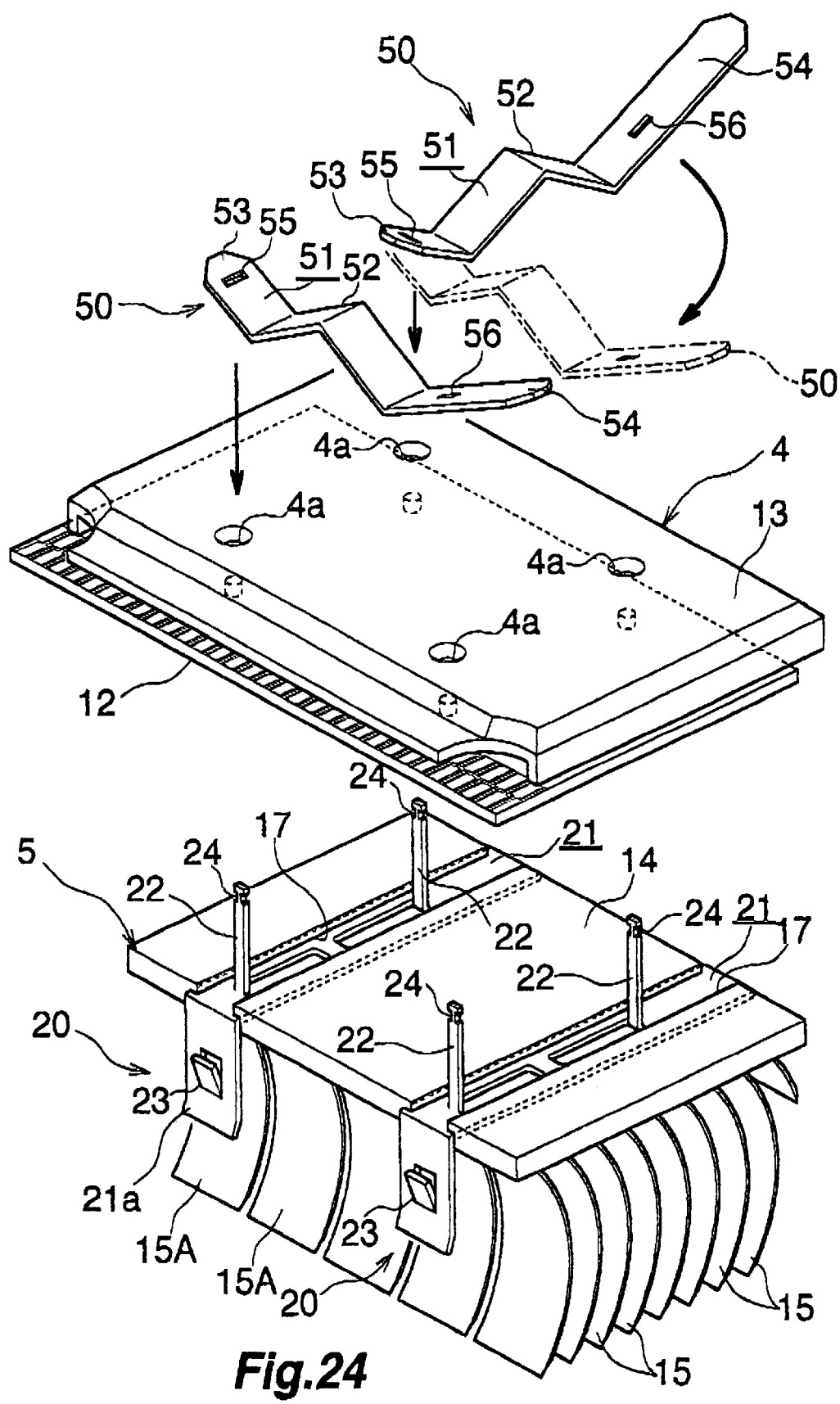
FIG. 24 is an exploded perspective view showing how to fix a heat sink to a CPU assembly according to the fifth embodiment.
Figure 25:
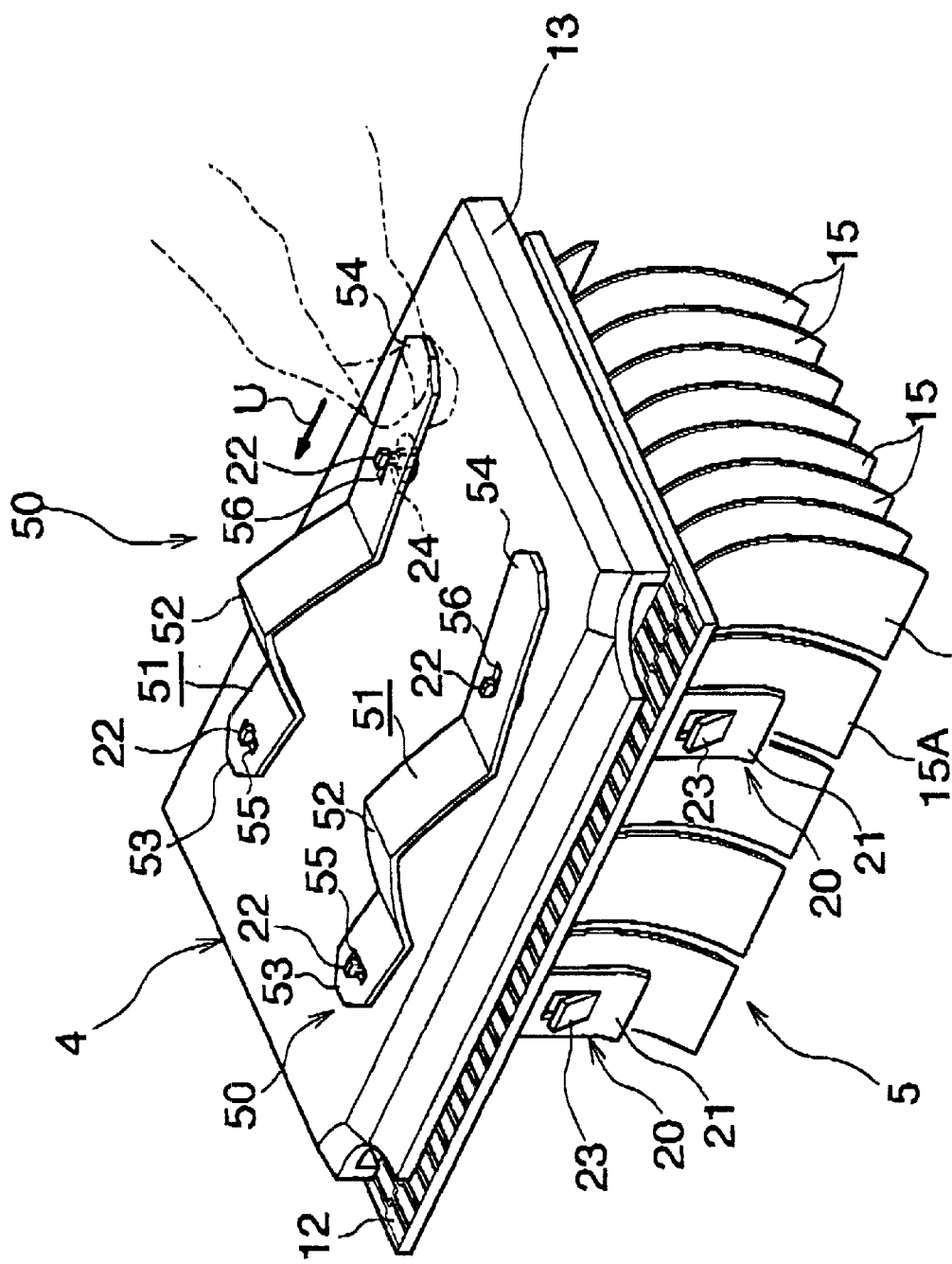
FIG. 25 is a perspective view showing how to engage a second clip with a first clip according to the same embodiment.

This embodiment is shown in FIGS. 23 to 25. The terms upper, lower, front, rear, left and right as used in describing this embodiment each mean the same direction as in the case of the third embodiment.

This embodiment has the same construction as the fourth with the exception of the construction of second clips.

Each of the second clips 50 comprises a striplike plate spring 51 having a length larger than the distance between the leftward and rightward outer opening edges of two internally enlarged furrows 17 in a radiating bass plate 14 of a heat sink 5. The plate spring 51 providing the second clip 50 comprises an inverted V-shaped base 52 along the outer surface of a cover 13 of a CPU assembly 4, and two slanting portions 53, 54 integrally extending from the respective opposite ends of the base 52 and each slanting upward toward the outer end thereof. The slanting portion 53 is formed with a first slot 55 having a length larger than the width of leg 22 of the first clip 20 and a width larger than the width of the neck 24, with its length positioned widthwise of the second clip 50. The other slanting portion 54 is longer than the slanting portion 53 and has a second slot 56 having a length greater than the width of the leg 22 of the first clip 20 and positioned lengthwise of the second clip 50. The spacing between the two slots 55, 56 is smaller than the spacing between the left legs 22 of the front and rear first clips 20 and the distance between the right legs 22 thereof. The widths of the slots 55, 56 are greater than the thickness of the leg 22. The second clip 50 is made from a sheet of spring steel, stainless steel or the like by press work.

The heat sink 5 is fixed to the CPU assembly 4 in the following manner.

The first clips 20 are mounted on the heat sink 5 and the sink 5 is attached to the CPU assembly 4 in the same manner as in the case of the third embodiment. The distance from the upper surface of the cover 13 to the neck 24 of each leg 22 inserted through the hole 4a of the CPU assembly 4 is smaller than the vertical distance from the lower surface of the base 52 of the second clip 50 in a state not deformed elastically to the slot 55 or 56.

Subsequently the second clip 50 is positioned with its length extending transversely of the resulting assembly and with the slanting portion 53 located at the left side of the assembly, and the left leg 22 of one of the first clips 20, i.e., of the rear clip 20, is inserted through the first slot 55 with its neck 24 positioned in the slot 55. The second clip 50 is then turned about the neck 24 and thereafter elastically deformed to contract the base 52 longitudinally thereof (see arrow U in FIG. 25) and to position the second slot 56 as opposed to the neck 24 of left leg 22 of the first clip 20 which is positioned toward the front, and the second slot 56 is fitted around the neck 24. The second clip 50 is subsequently released from the force applied thereto, whereupon the portion of the left leg 22 of the rear first clip 20 which portion is closer to the leg outer end than the neck 24 is engaged with the front and rear side edges defining the first slot 55 in the first slanting portion 53 of the second clip 50 as elastically deformed, and the portion of the left leg 22 of the front first clip 20 which portion is closer to the leg outer end than the neck 24 is engaged with the front and rear side edges defining the second slot 56 in the second slanting portion 54 of the second clip 50 as elastically deformed. In this way, the heat sink 5 is fixed to the CPU assembly 4. At this time, the second clips 50 are elastically deformed as indicated in solid lines in FIG. 23 from the state indicated in chain lines, and the first clips 20 are biased upward, i.e., toward the CPU assembly 4, by the repulsive force of the elastically deformed second clips 50 which force is acting in a direction indicated by arrows F in FIG. 23. Accordingly, the heat receiving portion 14a of the radiating base plate 14 of the heat sink 5 is pressed against the CPU 11 of the assembly 4 under increased pressure, with the thermally conductive resin film interposed therebetween. This ensures heat transfer from the CPU 11 of the CPU assembly 4 to the heat sink 5 with an improved efficiency for the sink to exhibit satisfactory radiating performance.

Sixth Embodiment

Figure 26:
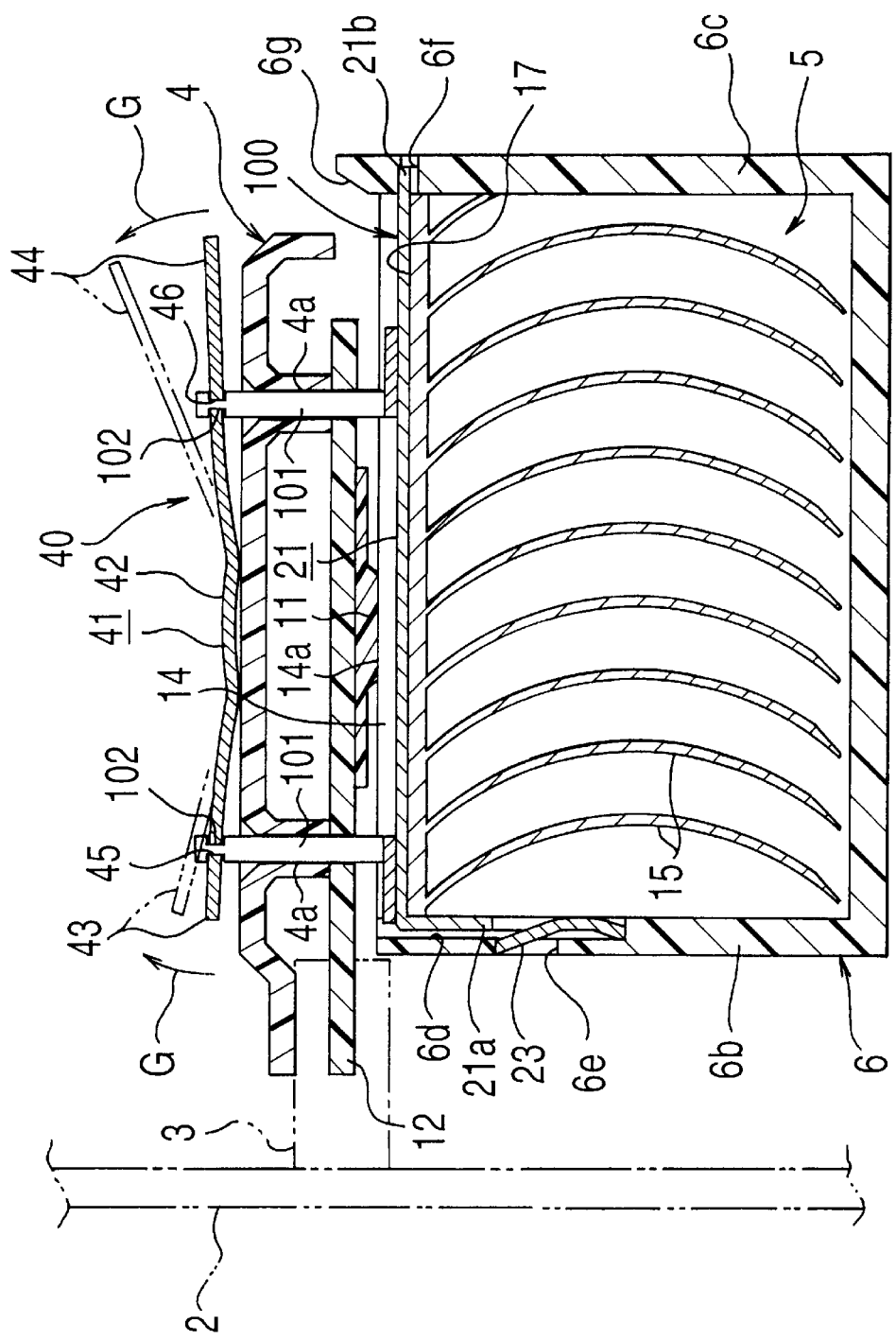
FIG. 26 is a view in section corresponding to FIG. 16 and showing a sixth embodiment.
Figure 27:
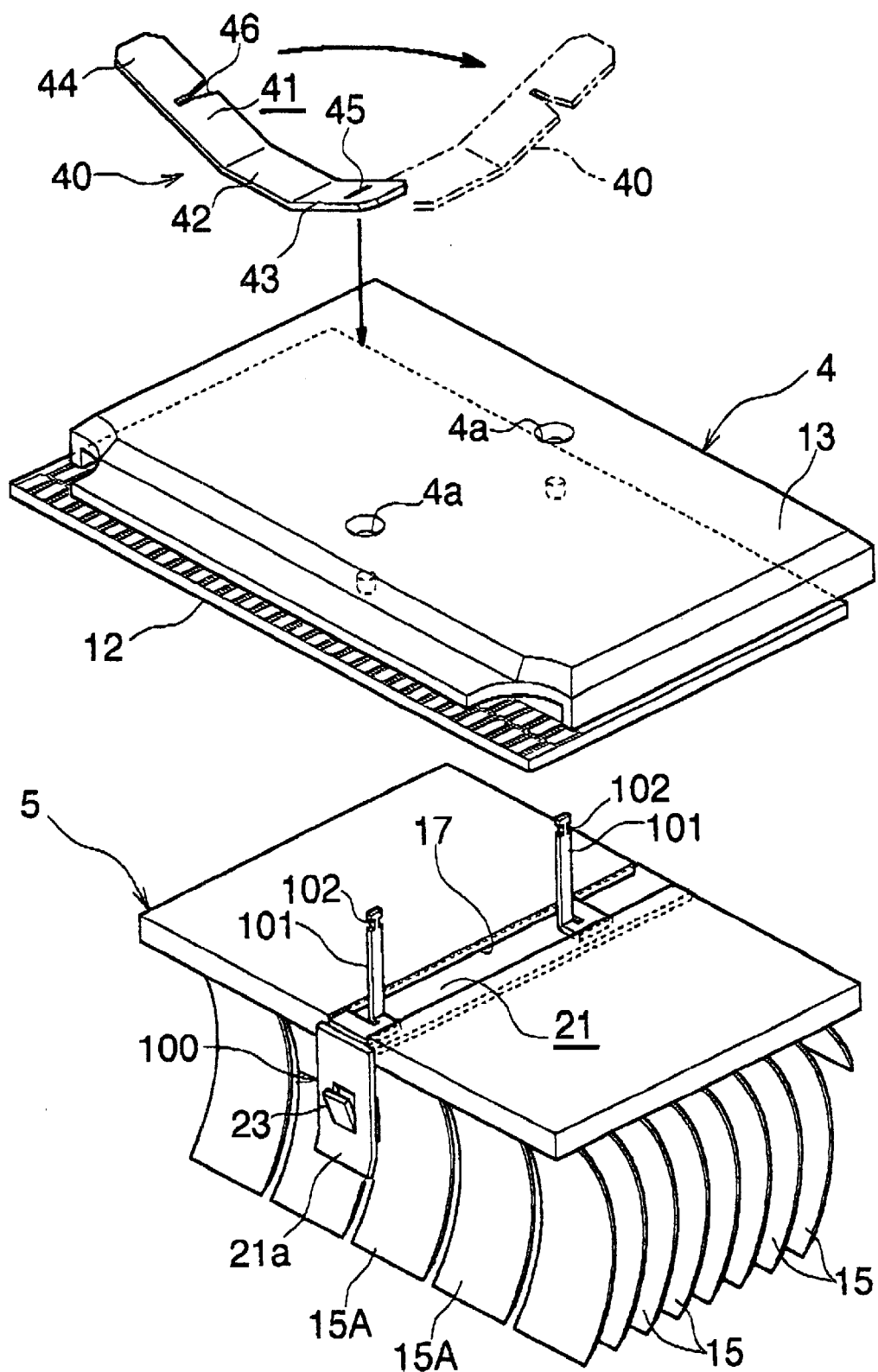
FIG. 27 is an exploded perspective view showing how to fix a heat sink to a CPU assembly according to the sixth embodiment.
Figure 28:
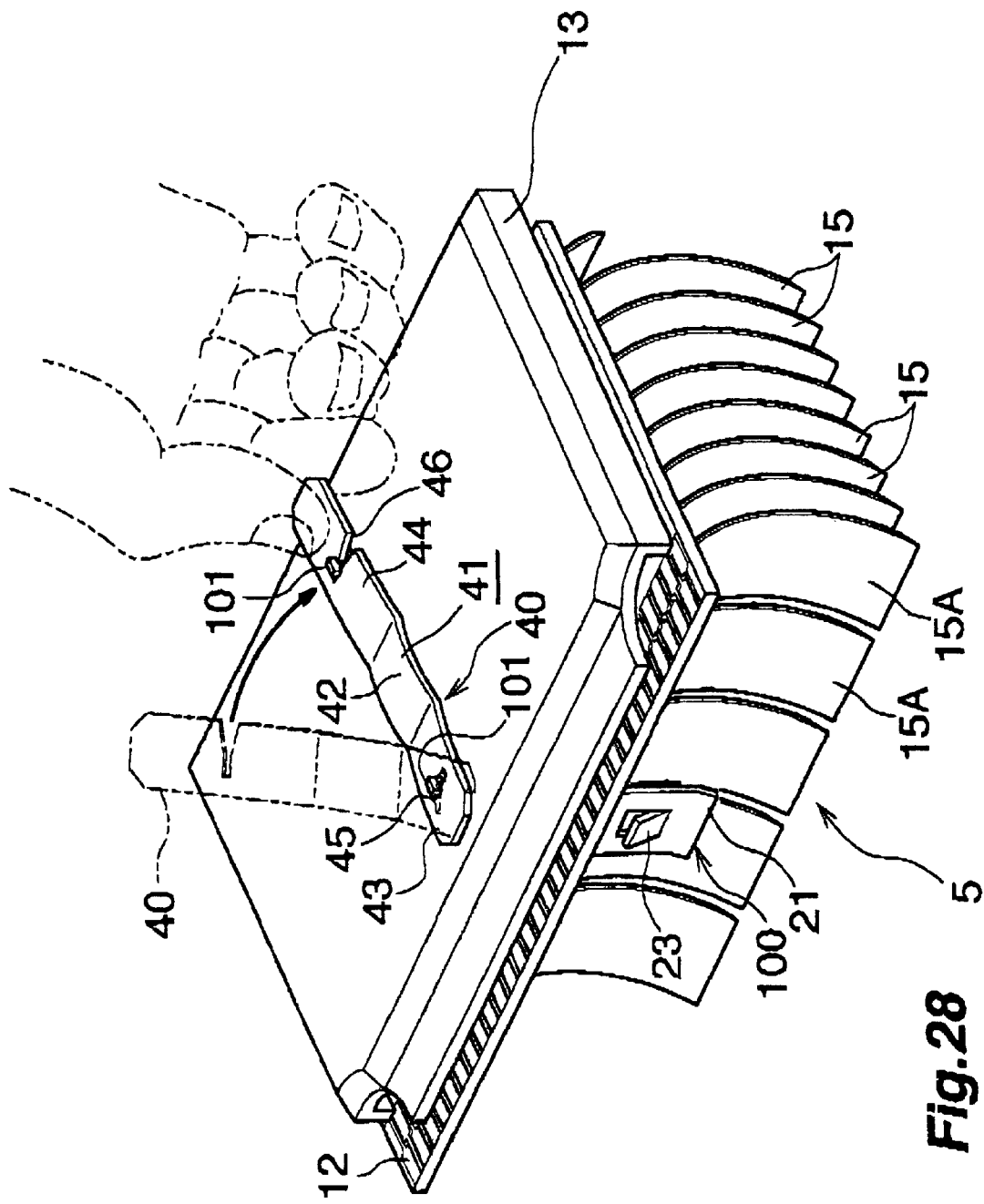
FIG. 28 is a perspective view showing how to engage a second clip with a first clip according to the same embodiment.
Figure 29:
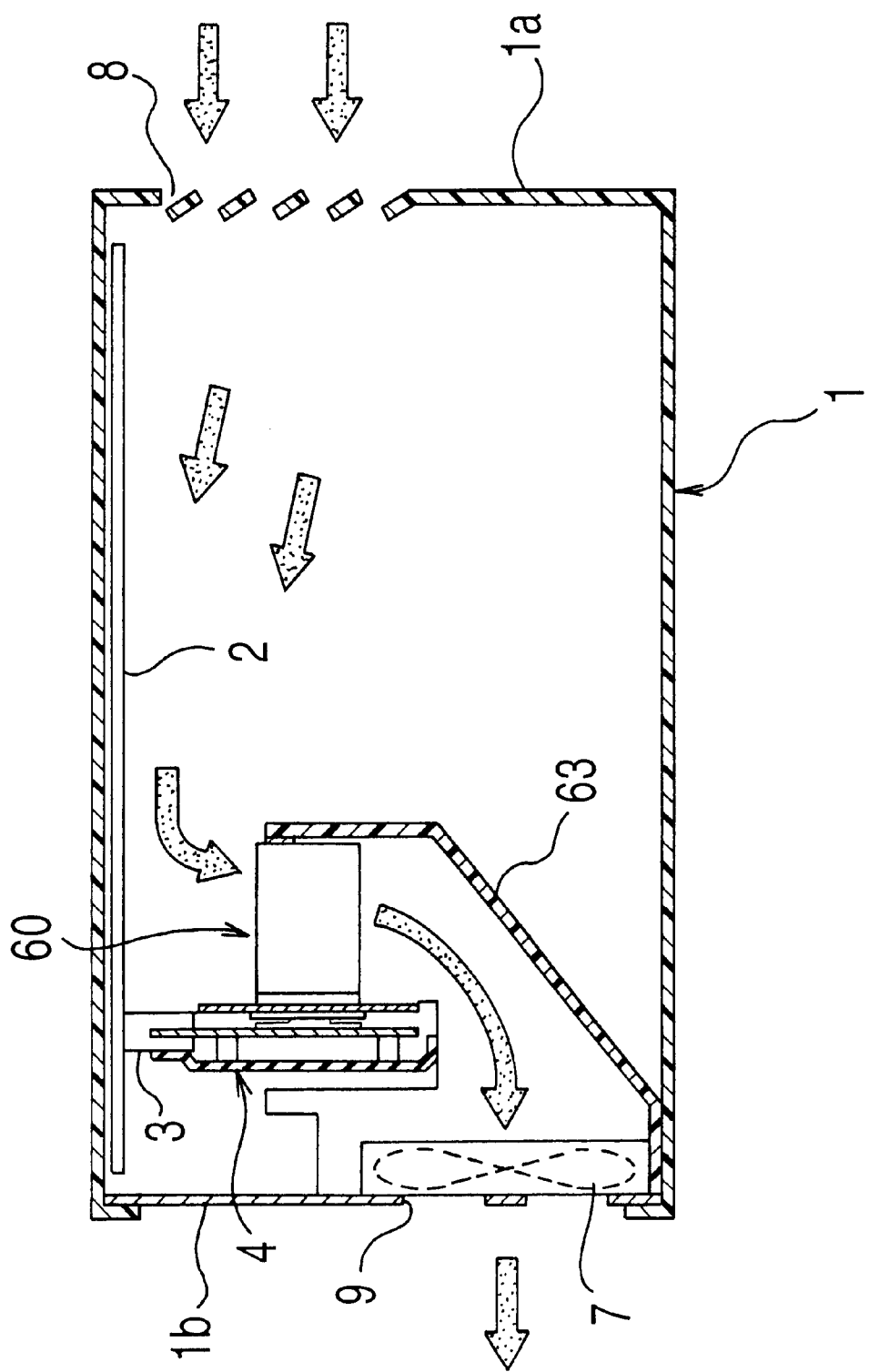
FIG. 29 is a view in horizontal section schematically showing a personal computer having a heat sink of seventh embodiment of the invention.
Figure 30:
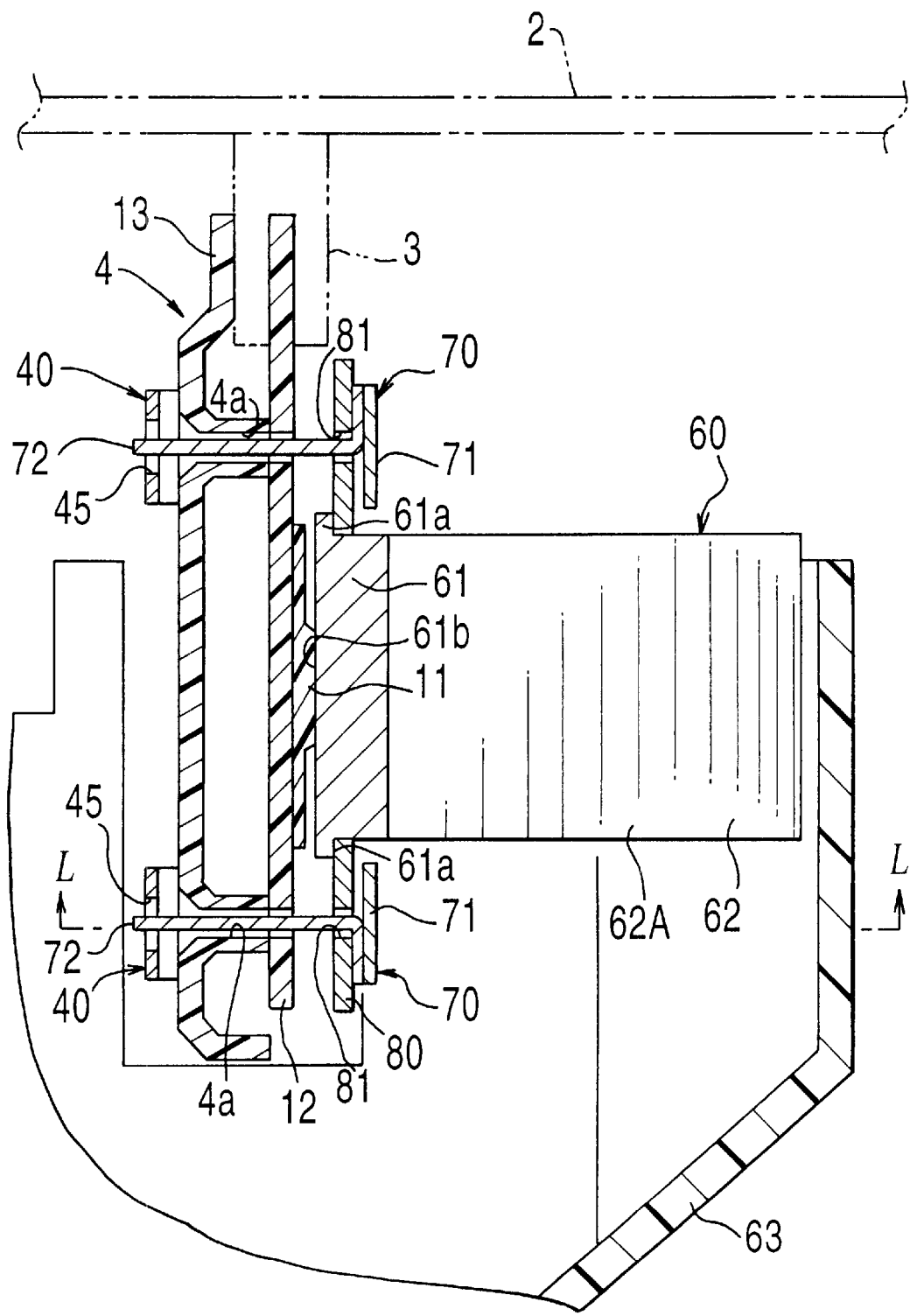
FIG. 30 is an enlarged fragmentary view of FIG. 29.
Figure 31:
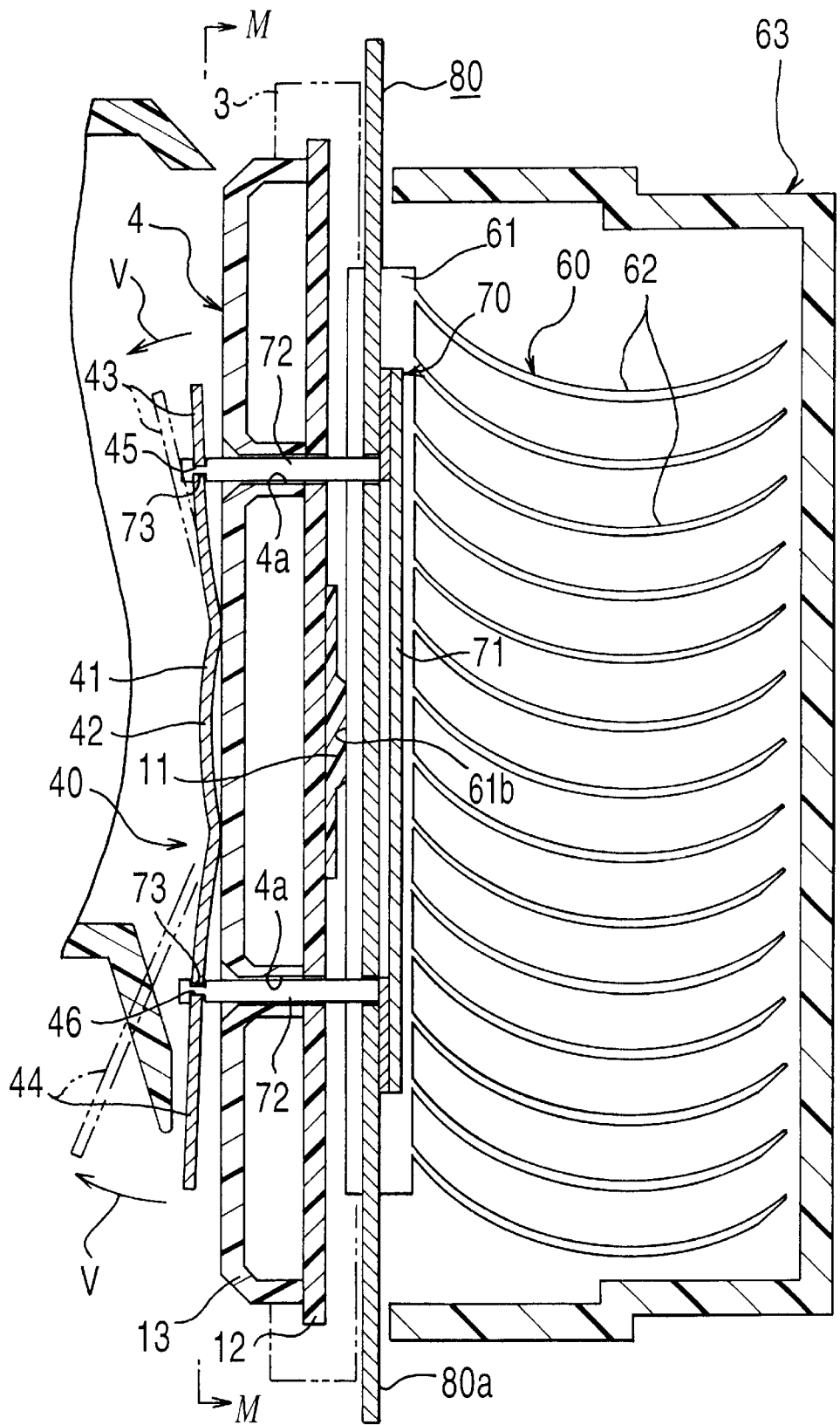
FIG. 31 is a view in section taken along the line L—L in FIG. 30.
Figure 32:
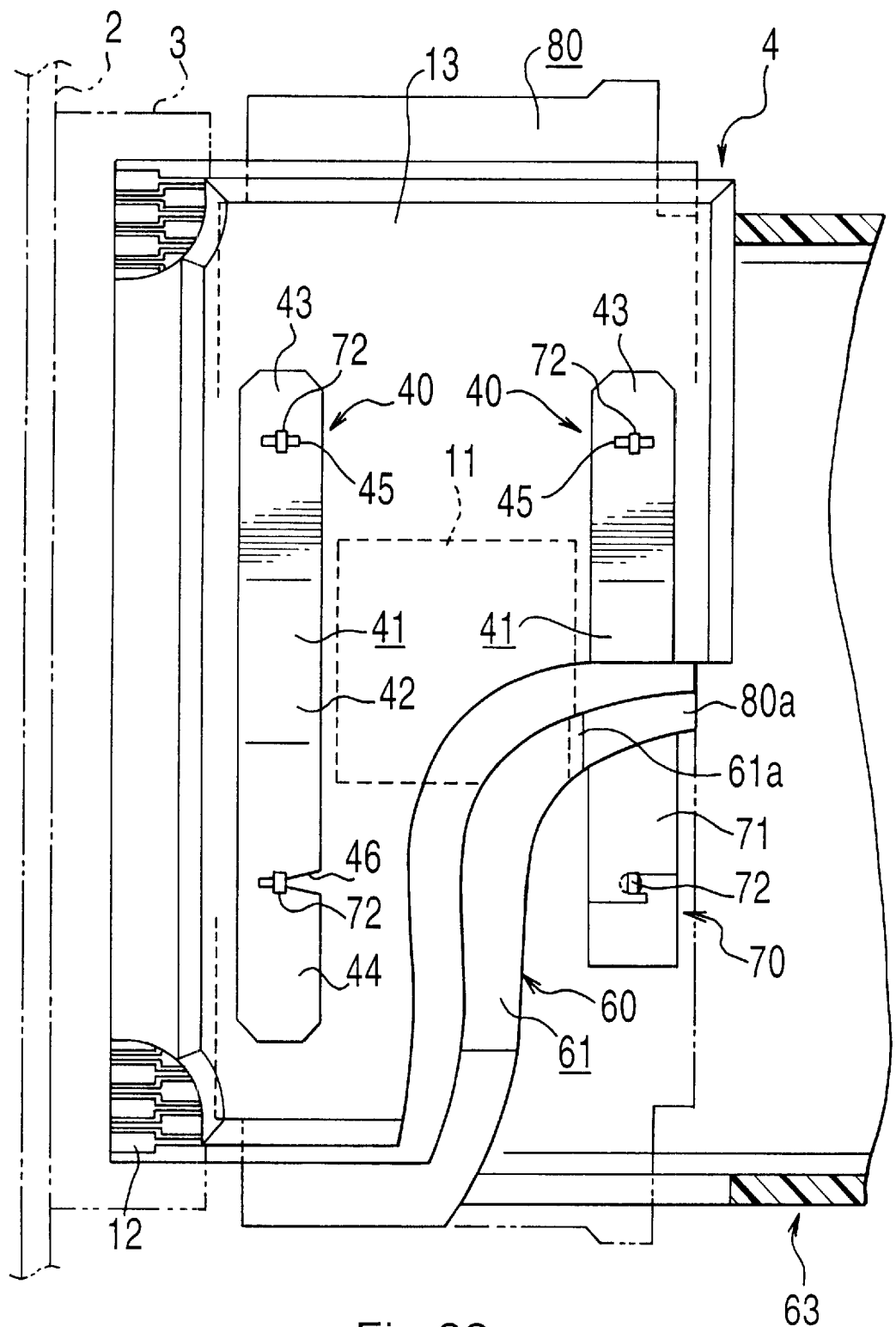
FIG. 32 is a view in section taken along the line M—M in FIG. 31.
Figure 33:
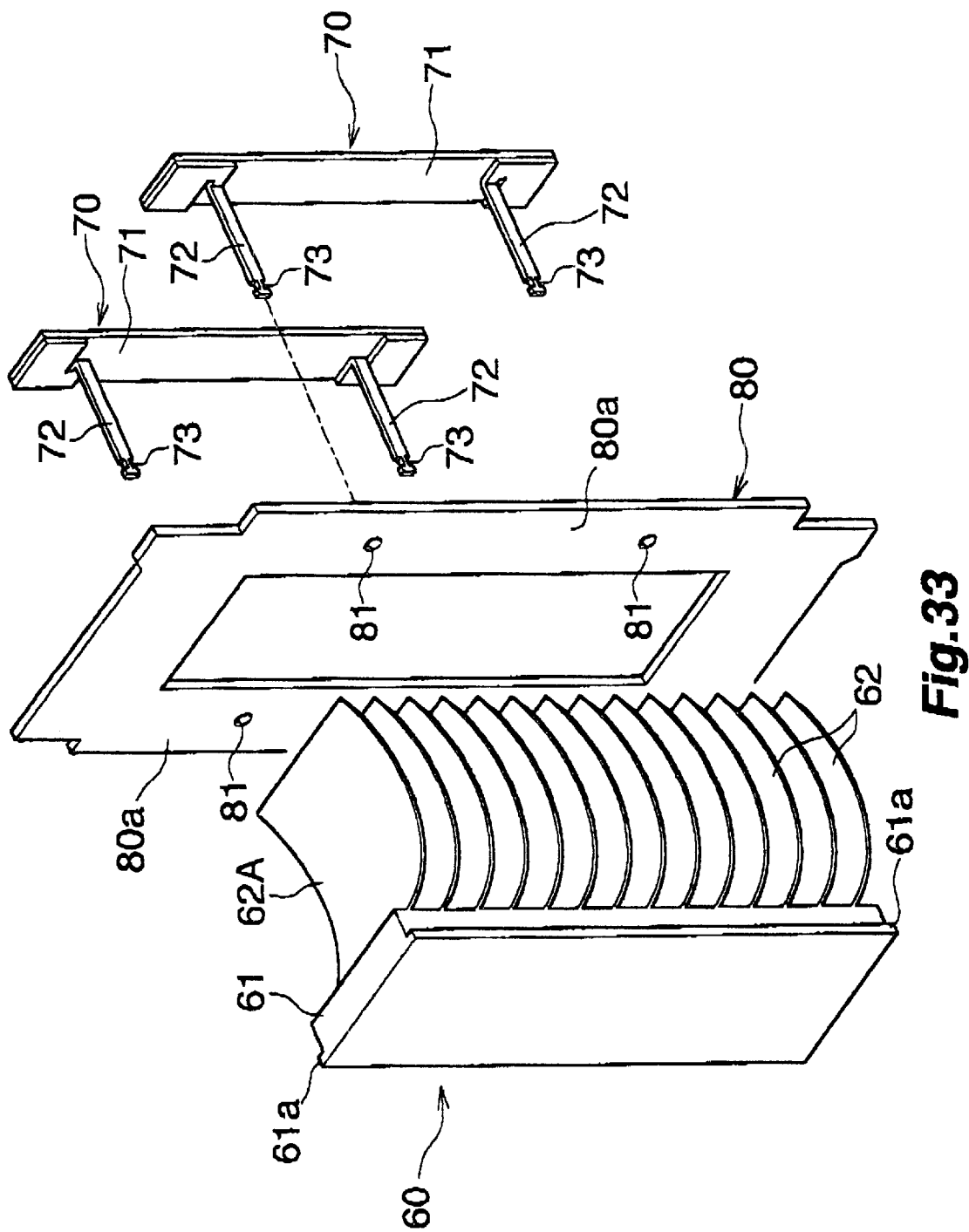
FIG. 33 is an exploded perspective view showing how to assemble the heat sink and first clips according to the seventh embodiment.
Figure 34:
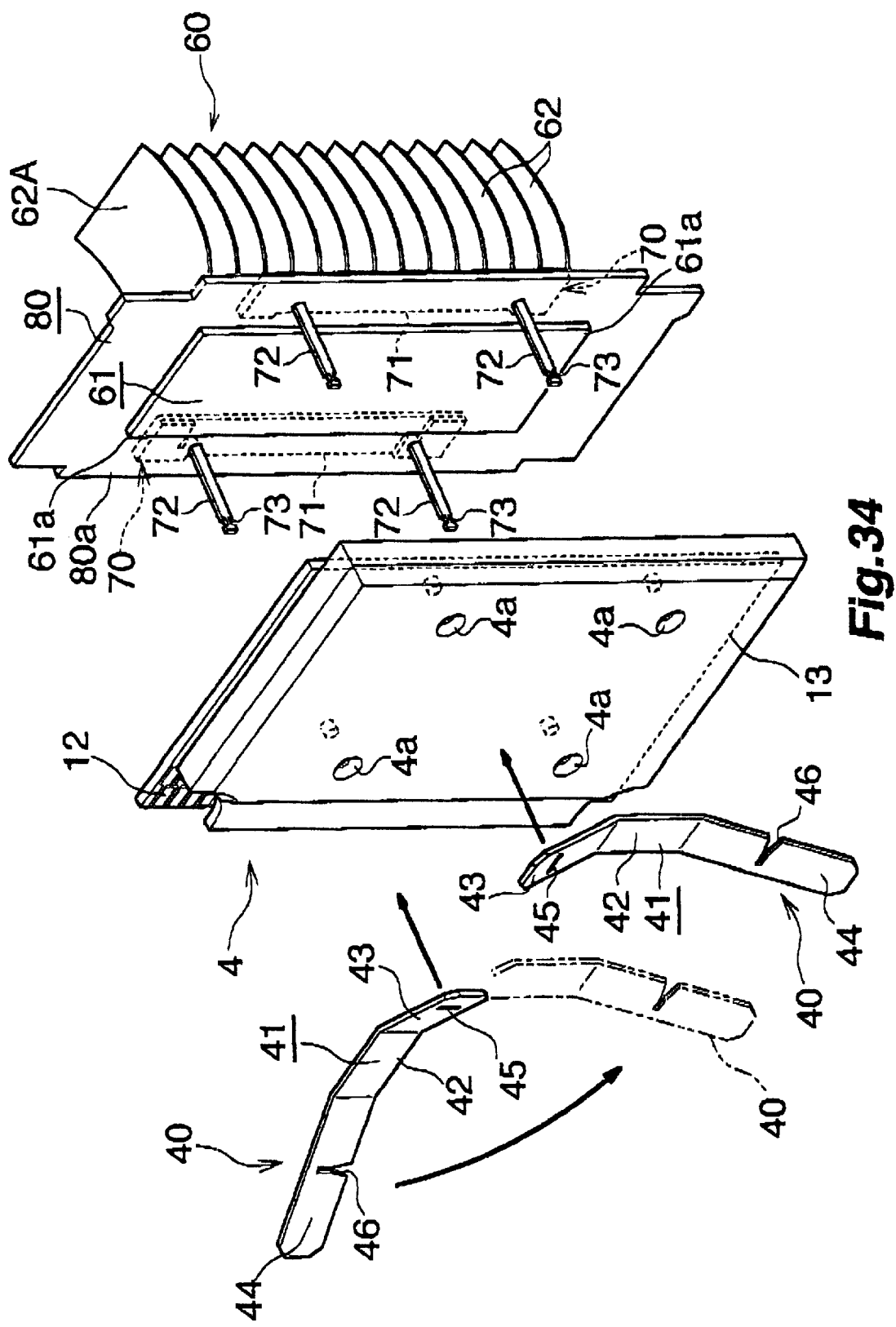
FIG. 34 is an exploded perspective view showing how to fix the heat sing to a CPU assembly according to the same embodiment.
Figure 35:
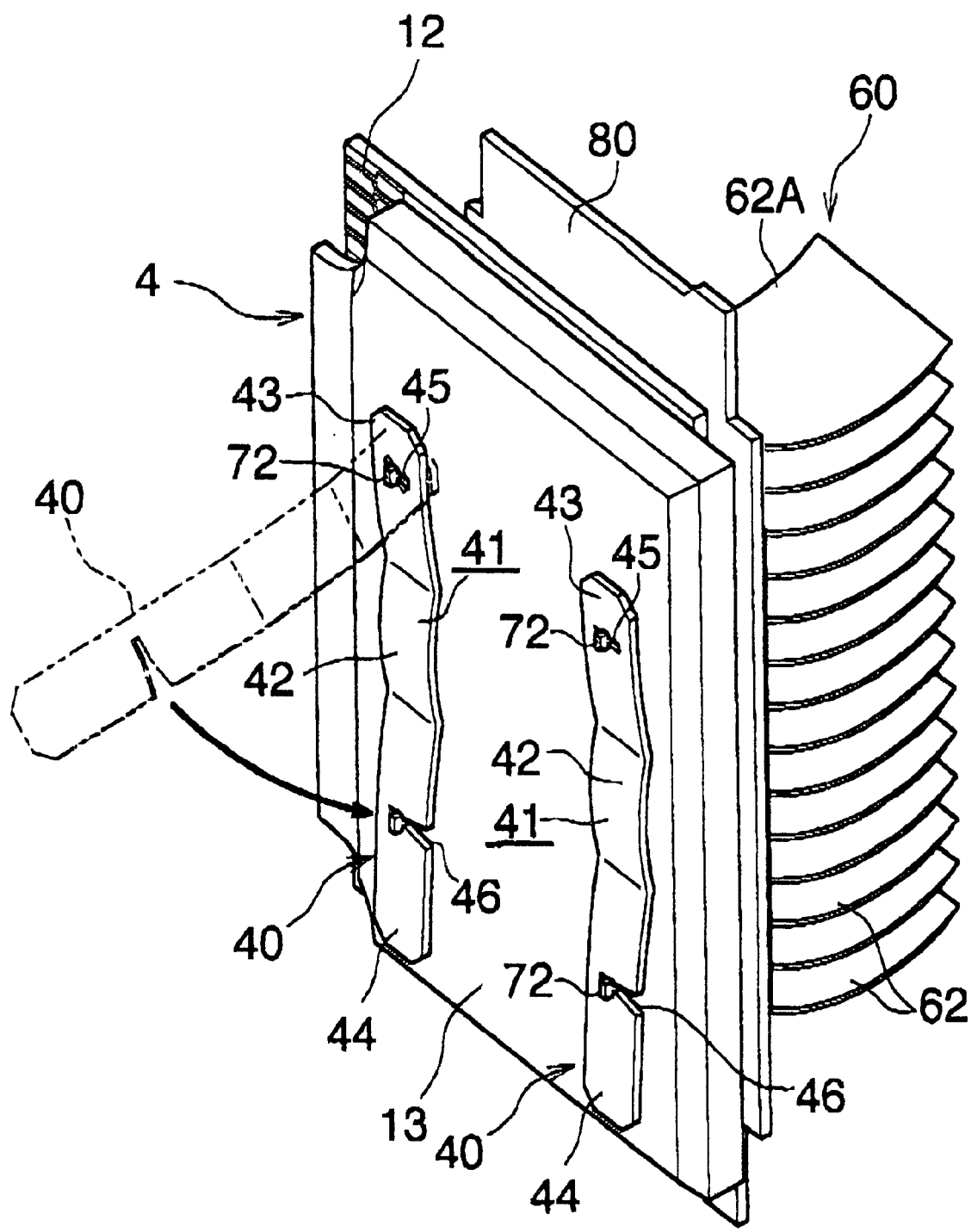
FIG. 35 in a perspective view showing the heat sink as fixed to the CPU assembly according to the same embodiment.

This embodiment is shown in FIGS. 26 to 28. The terms upper, lower, front, rear, left and right as used in describing this embodiment each mean the same direction as in the case of the third embodiment.

This embodiment has the same construction as the fourth with the exception of the construction of first clip and using the first clip and second slip each one in number.

A heat sink 5 has a radiating base plate 14 which has an internally enlarged furrow 17 in the upper surface thereof at the midportion of its length. A first clip 100 comprises a base 21 in the form of a horizontal strip and fitted in the furrow 17. The base 21 of the first clip 100 is fixedly provided with two legs 101 projecting upward and spaced apart transversely of the base plate 14. Each leg 101 is in the form of a strip having a width smaller than that of the base and positioned transversely of the base plate 14. The leg 101 has a neck 102 close to its upper end. The leg 101 and the neck 102 are dimensioned the same as the leg 22 and the neck 24 of the second embodiment, respectively. The first clip 100 is made from a sheet of spring steel, stainless steel or the like by press work and has spring elasticity.

The first clip 100 is mounted on the heat sink 5 and the sink 5 is attached to the CPU assembly 4 in the same manner as in the case of the fourth embodiment, The distance from the upper surface of the cover 13 to the neck 102 of each leg 101 inserted through the hole 4a of the CPU assembly 4 is smaller than the vertical distance from the lower surface of the base 42 of the second clip 40 in a state not deformed elastically to the slot 45 or slit 46.

The second clip 40 is positioned with its length extending lengthwise of the base plate 14 and with the slanting portion 43 located at the front, and the left leg 101 Of the first clip 100 is inserted through the slot 45 with its neck 102 positioned in the slot 45. The second clip 40 is then elastically deformed while being turned about the neck 102 so as to position the slit 46 at a level corresponding to the neck 102 of the right leg 101, and the slit 46 is fitted around the neck 102. The portions of the legs 101 of the first clip 100 which portions are closer to the leg outer ends than the necks 102 are then engaged respectively with an edge part defining the slot 45 in the slanting portion 43 of the second clip 40 as elastically deformed and with an edge part defining the slit 46 of the other slanting portion 44 of the second clip 40 as elastically deformed. In this way, the heat sink 90 is fixed to the CPU assembly 4, At this time, the second clip 40 is elastically deformed as indicated in solid lines in FIG. 26 from the state indicated in chain lines, and the first clip 100 is biased upward, i.e, toward the CPU assembly 4, by the repulsive force of the elastically deformed second clip 40 which force is acting in a direction indicated by arrows G in FIG. 26.

Accordingly, the heat receiving portion 91a of the radiating base plate 14 of the heat sink 5 is pressed against the CPU 11 of the assembly 4 under increased pressure, with the thermally conductive resin film interposed therebetween. This ensures heat transfer from the CPU 11 of the CPU assembly 4 to the heat sink 5 with an improved efficiency for the sink to exhibit satisfactory radiating performance.

Although not shown, the second clip 50 of the fifth embodiment may be used in the sixth embodiment described in place of the second clip 40 of the fourth embodiment.

Seventh Embodiment

This embodiment is shown in FIGS. 29 to 35. In describing this embodiment, the right-hand side of FIG. 29 will be referred to as "front," and the opposite side thereof as "rear." Further the upper and lower sides, the left-hand side and the right-hand side of FIG. 32, will be referred to as "upper," "lower," "left" and "right," respectively.

With the present embodiment, a connector 3 provided on a motherboard 2 has its length positioned vertically. A CPU assembly 4 as positioned vertically is attached to the connector 3, with a CPU 11 facing toward the front and a cover 14 facing rearward. An aluminum beat sink 60 is fixed to the front side of the CPU assembly 4.

The heat sink 60 comprises a radiating base plate 61 elongated vertically and having a rear side providing a flat surface and a heat receiving portion 61b provided at the central portion of the surface for contact with a CPU 11, and a fin row 62A provided on the front surface of the base plate 61 and comprising a multiplicity of tonguelike radiating fins 62. The fins 62 are formed in a raised form by cutting and arranged at a spacing in the direction of extrusion (vertical direction) of the plate 61. The radiating fins 62 are each in the form of a circular-arc bulging downward at the midportion of the height.

As is the case with the first embodiment, a fin forming ridge extending vertically on the base plate 61 and formed when the plate 61 is extruded are louvered, that is, cut to a raised form, whereby the radiating fins 62 of the heat sink 60 are formed.

Provided inside a housing 1 is a duct 63 for guiding air from the position of the heat sink 60 toward an air opening 9 formed in the rear wall 1b of the housing 1. A cooling fan 7 is disposed at an and of the duct 63 toward the air opening 9. When operated, the cooling fan 7 causes the air outside the housing 1 to flow into the housing 1 through an air opening 8 in the front wall 1a of the housing, and to flow between the fins 62 of the sink 60 inside the duct 63, discharging the air from the housing 1 through the air opening 9 in the rear wall 1b.

The heat sink 60 is fixed to the CPU assembly 4 by two first clips 70 provided on the sink 60 and two second clips 40 provided on the CPU assembly 4.

A sink holding frame 80 made of aluminum and in the form of a vertically elongated rectangle is fitted around the row of radiating fins 62 of the sink 60 from the front. The left and right opposite side portions 80a of the frame are in engagement with respective extensions 61a integrally extending leftwardly and rightwardly outward from the radiating base plate 61 of the heat sink 60.

Each of the first clips 70 comprises a striplike bass 71 having a width positioned transversely of the frame 80 and a length positioned vertically and extending along the front surface of the frame side portion 80a, and a plurality of, e.g., two, legs 72 extending rearward from and fixed to the rear surface of the base 71 and spaced apart vertically. The logs 72 of the first clip 70 are each in the form of a strip having a width smaller than that of the base 71 and positioned vertically. Each leg 72 has a neck 73 at a portion thereof close to its rear end. The leg 72 and the neck 73 are dimensioned the same as the leg 22 and the neck 24 of the fourth embodiment, respectively. The first clip 70 is made from a sheet of spring steel, stainless steel or the like and has spring elasticity.

The heat sink 60 is fixed to the CPU assembly 4 in the following manner.

First, each leg 72 of each first clip 70 is inserted through a hole 81 in the frame side portion 80a of the holding frame 80 and through a hole 4a in the CPU assembly 4 from the front to cause the leg outer end to project rearward beyond the cover 13 of the assembly 4 and to position the base 71 along the front surface of the frame side portion 80a. At this time, the distance from the rear surface of the cover 13 to the neck 73 of the lag 72 is smaller than the horizontal distance from the front surface of the base 42 of the second clip 40 in a state not deformed elastically to the slot 45 or slit 46. The heat receiving portion 61b of the base plate 61 of the heat sink 60 has a thermally conductive resin film (not shown), which is fitted to the CPU 11 in intimate contact therewith.

Subsequently the second clip 40 is positioned with its length extending transversely of the resulting assembly, and the upper leg 72 of the first clip 70 is inserted through the slot 45 of the slanting portion 43 with its neck 73 positioned in the slot 45. The second clip 40 is then elastically deformed while being turned about the neck 73 so as to position the slit 46 at the location of the neck 73 of the other leg 72, and the slit 46 is fitted around the neck 73. The portions of the two legs 72 of the first clip 70 which portions are closer to the leg outer ends than the necks 73 are then engaged respectively with an edge part defining the slot 45 in the slanting portion 43 of the second clip 40 as elastically deformed and with an edge part defining the slit 46 of the other slanting portion 44 of the second clip 40 as elastically deformed. In this way, the heat sink 60 is fixed to the CPU assembly 4. At this time, the second clips 40 are elastically deformed as indicated in solid lines in FIG. 31 from the state indicated in chain lines, and the first clips 70 are biased rearward, i.e., toward the CPU assembly 4, by the repulsive force of the elastically deformed second clips 40 which force is acting in a direction indicated by arrows V in FIG. 31. Accordingly, the heat receiving portion 61b of the radiating base plate 61 of the heat sink 60 is pressed against the CPU 11 of the assembly 4 under increased pressure, with the thermally conductive resin film interposed therebetween. This ensures heat transfer from the CPU 11 of the CPU assembly 4 to the heat sink 60 with an improved efficiency for the sink to exhibit satisfactory radiating performance.

Although not shown, the second clips 50 of the fifth embodiment are usable in the seventh embodiment described in place of the second slips 40 of the fourth embodiment.

With the foregoing seven embodiments, the CPU assembly 4 comprises a CPU mount circuit board 12 having a CPU 11 mounted thereon, and a plastic cover 13 provided over the CPU mount circuit board 12, and the CPU 11 is disposed on the outer side of the circuit board 12, whereas the heat sink is usable also for the CPU assembly disclosed in Japanese Utility Model Publication No. 3054704 previously described. In this case, the flat surface of radiating bass plate of the heat sink is held in contact with the outer surface of aluminum plate of the CPU assembly casing.

Eighth Embodiment

Figure 36:
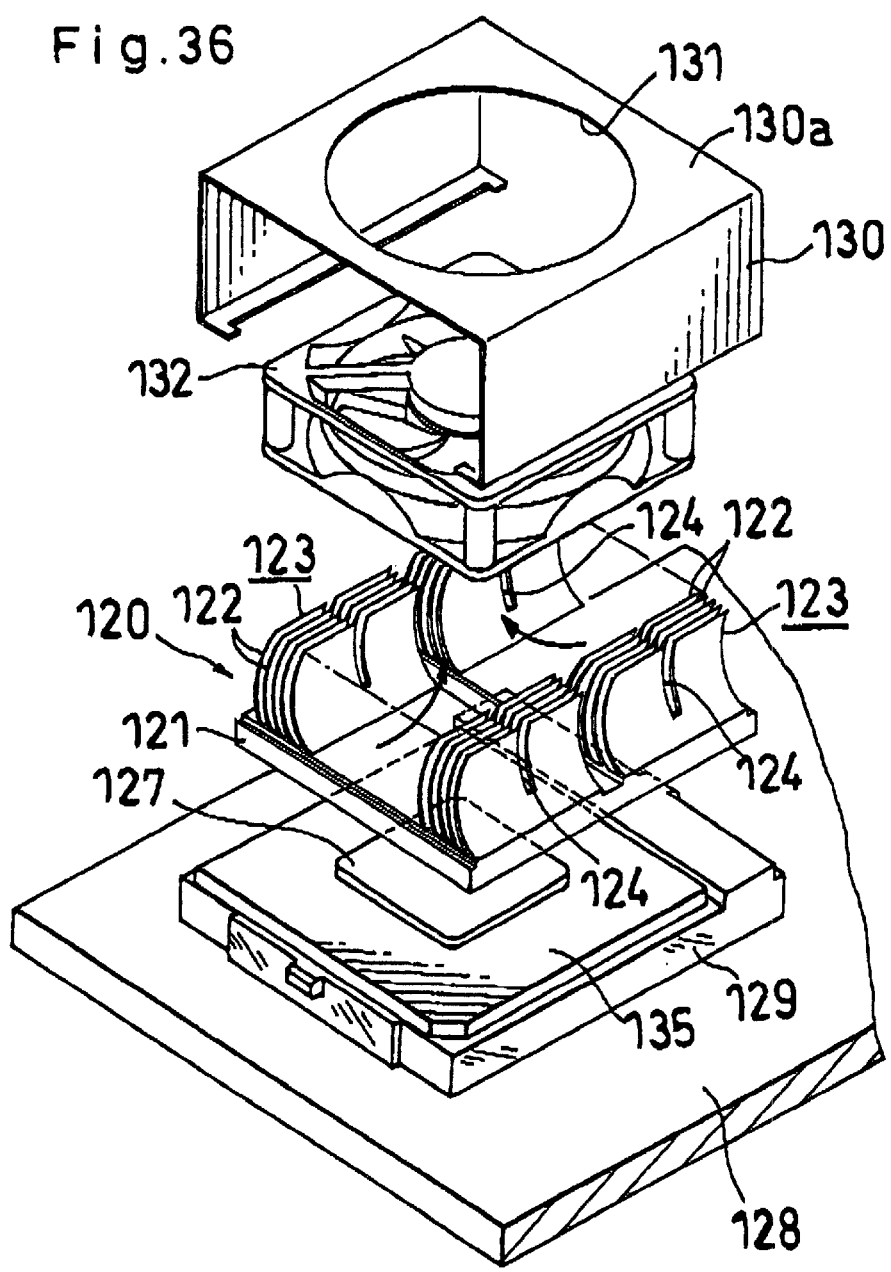
FIG. 36 is a perspective view of an eighth embodiment.
Figure 37:
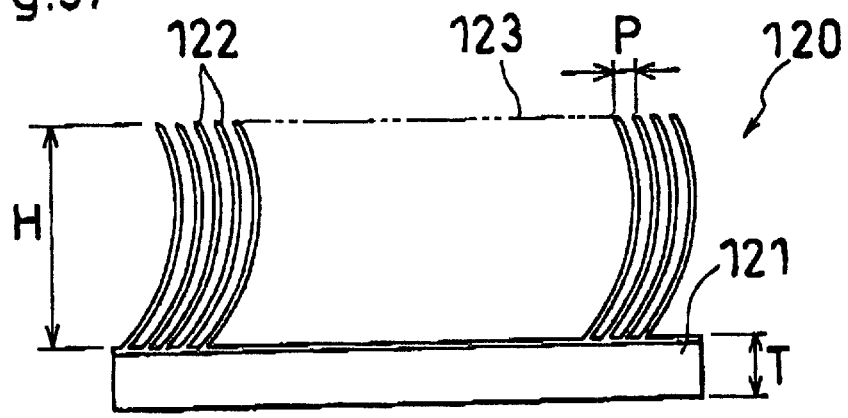
FIG. 37 is a side elevation of the same.
Figure 38:
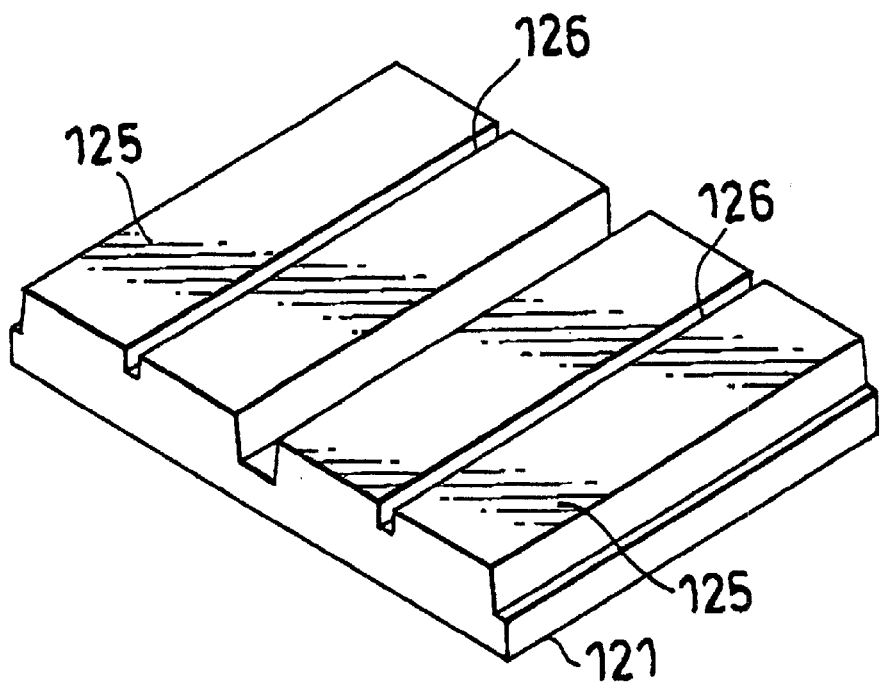
FIG. 38 is a perspective view showing a radiating base plate as extruded before radiating fins are formed according to the eighth embodiment.

This embodiment is shown in FIGS. 36 to 38. In describing this embodiment, the upper and lower sides of FIGS. 36 to 38 will be referred to as "upper" and "lower," respectively, the rightwardly obliquely lower side of FIG. 36 (left-hand side of FIG. 37) as "front," and the opposite side thereof as "rear." The terms "left" and "right" are used for the device as it is seen from the front rearward.

With reference to FIG. 36, a CPU 127 having a package 135 is attached to a socket 129 on a motherboard 128 disposed within the housing of a personal computer.

With reference to FIGS. 36 and 37, a heat sink 120 comprises a radiating base plate 121 made of aluminum and having a lower side providing a flat surface in its entirety and a heat receiving portion (not shown) provided at the central portion of the surface for contact with the CPU, and a plurality of fin rows 123 provided on the upper surface of the base plate 121. The fin rows 123, which are two in number in the present embodiment, each comprise a multiplicity of tonguelike radiating fins 122 formed in a raised form by cutting integrally with the base plate 121 and arranged at a spacing in the direction of extrusion of the plate 121 (front-rear direction). These fin rows 123 extend in the direction of extrusion of the plate 121 (front-rear direction) and are spaced apart from each other leftward or rightward (i.e., laterally). The radiating fins 122 providing the rows 123 are each generally in the form of a circular-arc bulging rearward at the midportion of the height, The radiating fins 122 are each formed with a slit 124 extending from the upper end thereof.

With reference to FIG. 38, two fin forming ridges 125 spaced apart laterally of the base plate 121, extending forward or rearward and formed integrally therewith when the plate is extruded are louvered, that is, cut to a raised form, whereby the radiating fins 122 of the heat sink 120 are formed. A groove 126 extending forward or rearward is formed in the upper surface of each fin forming ridge 125. The grooves 126 are formed in order to reduce the resistance to cutting and to hold lubricant therein when the fins 122 are formed by louvering. The presence of the grooves 126 forms the slits 124 in the radiating fins 122 formed by louvering.

A thermally conductive resin film (not shown) is adhered to the heat receiving portion of lower surface of the radiating base plate 121, and the heat sink 120 is thereafter fixed to the socket 129 of the motherboard 128 by suitable means, with the film in intimate contact with the CPU 127.

The radiating fins 122 of the heat sink 120 are covered with a plastic fin cover 130 which is generally U-shaped and open downward as seen from the left and right. An opening 131 is formed in the top wall 13a of the fin cover 130. A cooling fan 132 is disposed under the top wall 130a of the fin cover 130. The fin cover 130 and the cooling fan 132 serve to cause air to be drawn into the fin cover 130, to flow leftwardly and rightwardly inward between the adjacent fins 122 as indicated by arrows in FIG. 36 and also upward and to be discharged from the cover 130 through the opening 131.

Preferably, the heat sink 120 is 3 to 8 mm in the thickness T of the radiating base plate 121, 15 to 35 mm in the height H of the fins 122 from their base ends to the outer ends thereof, 0.2 to 0.7 mm in the thickness of the fins 122, and 1.5 to 2.5 mm in the fin pitch P of the fins 122 of the row 123.

The thickness T of the radiating base plate 121, the height H of the fins 122 from their base ends to the outer ends thereof, the thickness of the fins 122, and the fin pitch P of the fins 122 of the row 123 are determined by the same experiments as conducted for the foregoing second embodiment. The values in the above ranges are preferable for the same reasons as described for the second embodiment.

Further as is the case with the second embodiment, it is desired that the heat sink 120 be 7 to 44 in the ratio of the height H of the fins 122 from their base end to the outer ends thereof to the spacing between the fins 122 forwardly or rearwardly adjacent to one another (the fin pitch P minus the thickness of one fin 122). If the ratio is less than the lower limit value, the sink fails to have a sufficiently large radiating area, whereas ratios in excess of the upper limit value result in a diminished fin pitch P and an increased pressure loss. The sink fails to achieve an improved radiation efficiency in either case. More preferably, the above ratio is 10 to 20.

The heat sink 120 may be used without being equipped with the fin cover 130 and the cooling fan 132. In this case, the heat sink 120 is preferably 3 to 8 mm in the thickness T of the radiating base plate 121, 20 to 50 mm in the height H of the fins 122 from their base ends to the outer ends thereof, 0.2 to 0.7 mm in the thickness of the fins 122, and 1.5 to 4 mm in the fin pitch P of the fins 122.

The thickness T of the radiating base plate 121, the height H of the fins 122 from their base ends to the outer ends thereof, the thickness of the fins 122, and the fin pitch P of the fins 122 are determined by the same experiments as conducted for the foregoing first embodiment. The values in the above ranges are preferable for the same reasons as described for the first embodiment. Further when the heat sink 120 is used without being equipped with the fin cover 130 and the cooling fan 132, it is desired that the heat sink 120 be 6 to 62 in the ratio of the height H of the fins 122 from their base end to the outer ends thereof to the spacing between the fins forwardly or rearwardly adjacent to one another (the fin pitch P minus the thickness of one fin 122) as in the case of the first embodiment. If the ratio is less than the lower limit value, the sink fails to have a sufficiently large radiating area, whereas ratios in excess of the upper limit value result in a diminished fin pitch P and an increased pressure logs. The sink fails to achieve an improved radiation efficiency in either case. More preferably, the above ratio is 10 to 30.

The differences due to the presence or absence of the cooling fan in the height H of the fins 122, in the fin pitch P and in the ratio of the fin height H to the spacing between the fins 122 forwardly or rearwardly adjacent to one another are attributable to the difference in the speed of air flow.

Ninth Embodiment

Figure 39:
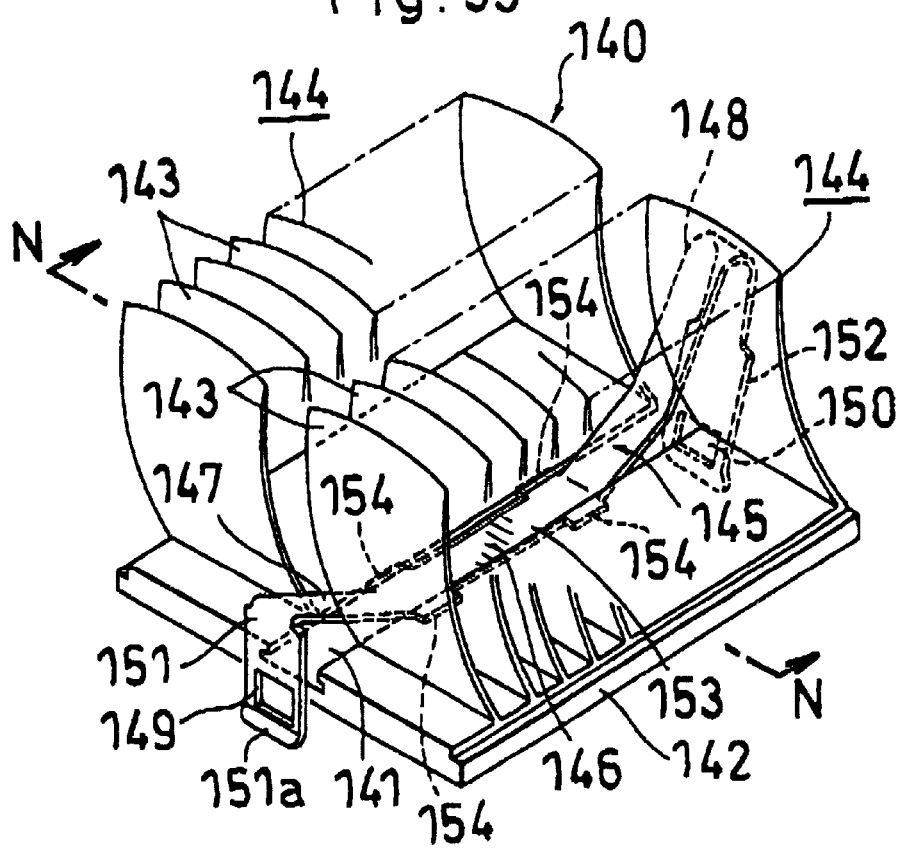
FIG. 39 is a perspective view showing the overall construction of a ninth embodiment.
Figure 40:
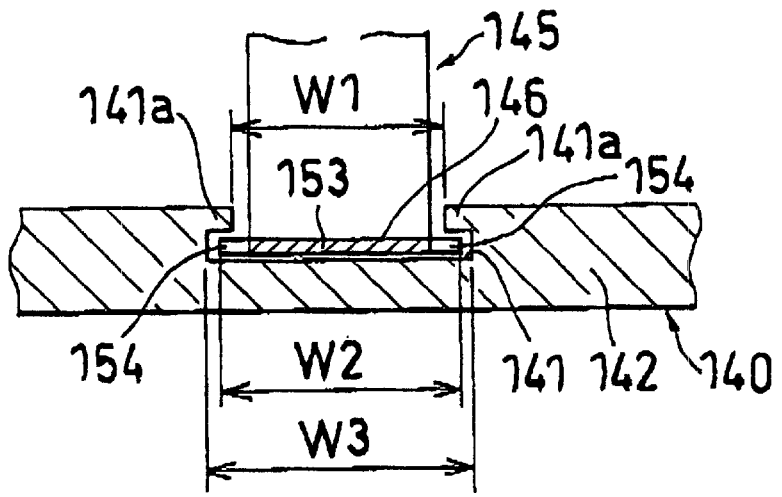
FIG. 40 is an enlarged view in section taken along the line N—N in FIG. 39.
Figure 41:
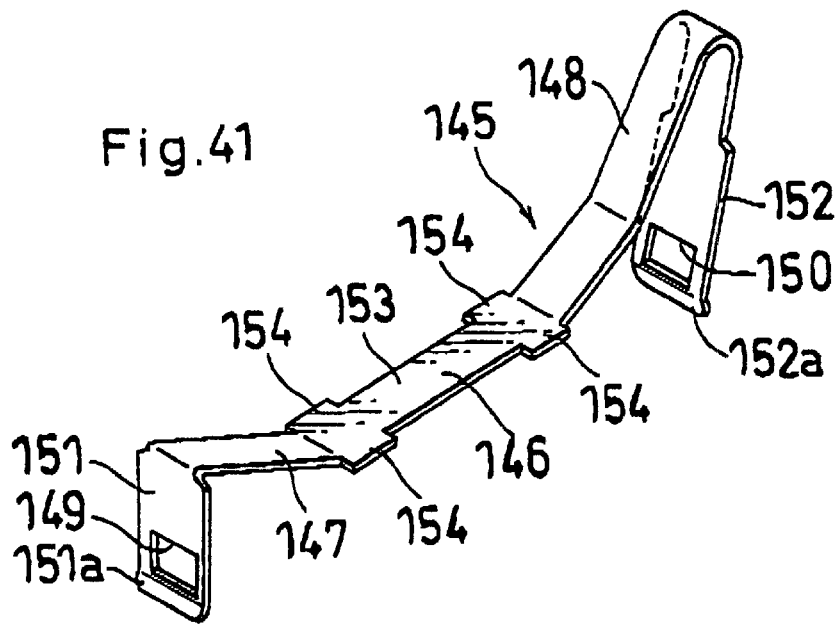
FIG. 41 is a perspective view showing a clip of the ninth embodiment.
Figure 42:
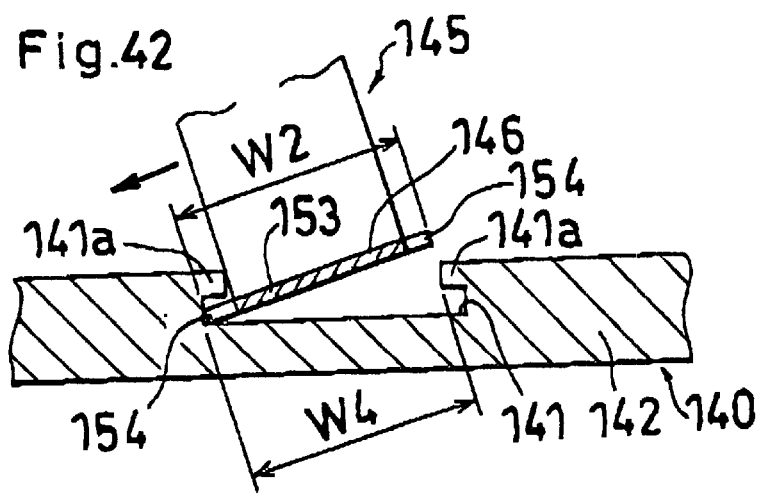
FIG. 42 is a view in section corresponding to FIG. 40 and showing how to cause a heat sink to hold the clip according to the ninth embodiment.
Figure 43:
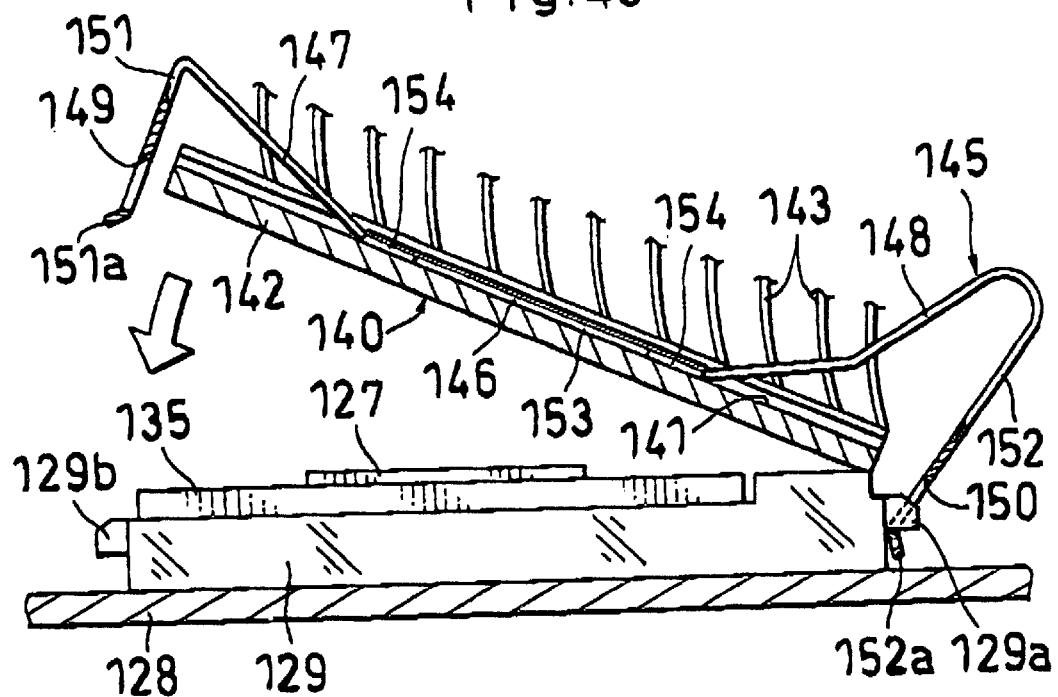
FIG. 43 is a side elevation partly broken away and showing how to fix the heat sink to a socket by the clip according to the ninth embodiment.
Figure 44:
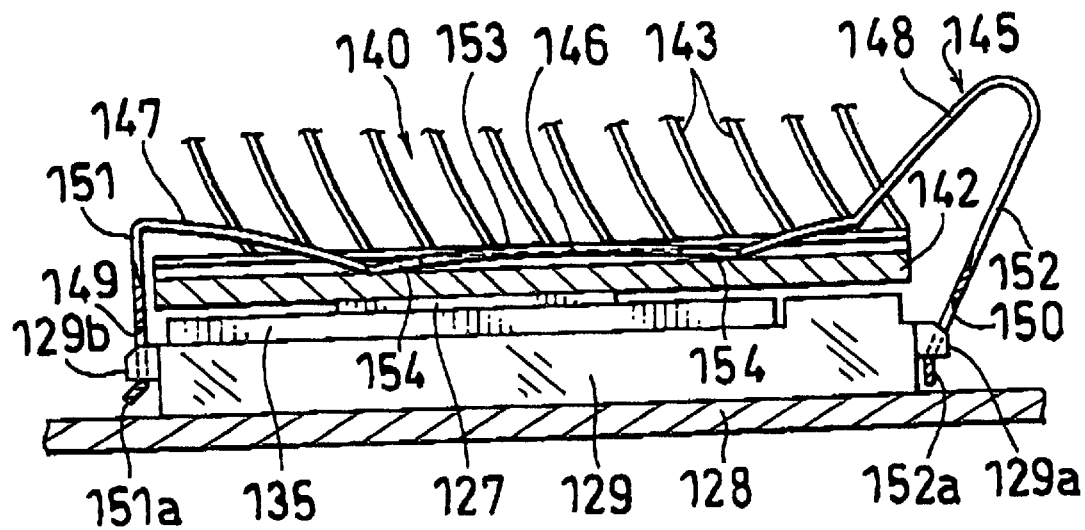
FIG. 44 is a side elevation partly broken away and showing the heat sink as fixed to a socket by the clip according to the ninth embodiment.

This embodiment is shown in FIGS. 39 to 44. FIG. 39 shows the overall construction of a clip-equipped heat sink comprising a heat sink of the invention. FIG. 40 shows the main portion of the sink, and FIG. 41 shows a clip, FIG. 42 shows how to cause the heat sink to hold the clip, and FIGS. 43 and 44 show how to fix the heat sink to a socket. In describing this embodiment, the upper and lower sides of FIGS. 39 to 44 will be referred to as "upper" and "lower," respectively. Further the leftwardly obliquely downward side of FIG. 39 (left-hand side of FIGS. 43 and 44) will be referred to as "front," and the opposite side thereof as "rear." The terms "left" and "right" are used for the illustrated arrangements as they are seen from the front rearward.

With reference to FIG. 39, the clip-equipped heat sink comprises a heat sink 140 which comprises a radiating base plate 142 of aluminum extrudate having a lower aids providing a flat surface in its entirety and an internally enlarged T-shaped furrow 141 formed in the upper surface thereof and extending forward or rearward (longitudinally of the base plate 142), and fin rows 144 provided on the upper surface of the base plate 142 respectively at the left and right opposite sides of the furrow 141 and each comprising a multiplicity of tonguelike radiating fins 143 which are arranged at a spacing in the direction of extrusion of the base plate 142 (longitudinal direction) and formed integrally with the plate 142 by cutting to a raised shape; and a clip 145 held to the heat sink 140, as partly fitted in the furrow 141. The fins 143 of each row 144 are each in the form of a circular arc bulging forward at the midportion of the height.

Fin-forming ridges extending longitudinally of the base plate 142 and formed on the bass plate 142 when the plate is extruded are out to a raised shape, i.e., louvered, whereby the fins 143 of the heat sink 140 are formed.

With reference to FIGS. 39 to 41, the clip 145 comprises a horizontal base 146 to be disposed in the furrow 141, striplike slanting projections 147, 148 formed integrally with respective opposite ends of the base 146 to obliquely upwardly extend outward from inside the furrow 141 longitudinally thereof and each having an outer end positioned above the base plate 142 and outside of the plate 142 longitudinally thereof, and legs 151, 152 formed integrally with the outer ends of the respective projections 147, 148 and extending downward to provide outer ends which have rectangular holes 149, 150 (engaging portions). The bass 146 of the clip 145 comprises a longitudinally elongated striplike portion 153 having a width smaller than the opening width W1 of the furrow 141, i.e., the distance between the opposed edges of inward projections 141a defining the opening of the furrow 141 in the base plate 142, and a plurality of, e.g., two, lateral extensions 154 integral with the opposite side edges of the striplike portion 153 and spaced apart longitudinally thereof. The lateral extensions 154 are positioned at each of the front and rear ends of the striplike portion 153. The width W2 between the outer ends of the opposite lateral extensions 154 of the clip 145 is greater than the opening width W1 of the furrow 141 and smaller than the width W3 of the furrow bottom portion, i.e., the portion of the furrow 141 below the inward projections 141a (see FIG. 40). Furthermore, the width W2 between the outer ends of the opposite lateral extensions 154 is smaller than the distance W4 from the left side corner of the bottom of the furrow 141 to the extremity of lower edge of one inward projection, i.e., the right inward projection 141a (see FIG. 42). The front and rear slanting projections 147, 148 of the clip 145 have the same lateral width as the striplike portion 153 of the base 146. The rear slanting projection 148 has a greater length than the front slanting projection 147, and is bent obliquely upward at an intermediate part thereof. The outer end of the projection 148 is positioned at a higher level than that of the rear slanting projection 147. The front leg 151 is vertical. The rear leg 152 is slanted downwardly forward. The lower ends of the two legs 151, 152 are positioned at a lower level than the lower surface of the base plate 142. The portions of the two legs 151, 152 below the holes 149, 150 are slightly bent forwardly and rearwardly outward as indicated at 149a, 150a. The clip 145 is made from a sheet of spring steel, stainless steel or the like by press work and has spring elasticity.

The clip 145 is held to the heat sink 140 in the manner shown in FIG. 42.

With the clip 145 inclined to position the base 146 obliquely, one of the lateral extensions 154, e.g., the left lateral extension 154, is inserted through the opening of the furrow 141 and placed onto the furrow bottom portion below the left inward projection 141a. The base 146 is then brought to a horizontal position so as to move the right lateral extension 154 through the opening and place the extension 154 onto the furrow bottom portion below the right inward projection 141a. The clip 145 is thereafter moved toward the other side, i.e., toward the side of the right lateral extension 154, to position the outer ends of the two extensions 154 laterally outwardly of the respective inward projections 141a. In this way, the clip 145 is held to the heat sink 140, and the clip 145 is positioned in place relative to the sink 140 with respect to the lateral direction.

The heat sink 140 is fixed to a socket 129 with use of the clip 145 thus held in the manner to be described below with reference to FIGS. 43 and 44.

First, the clip-equipped heat sink is inclined obliquely to position the rear end thereof at a lower level, and a protuberance 129a formed at the rear end face of the socket 129 on a motherboard 128 is fitted into the hole 150 in the rear leg 152 and engaged with a lower edge of the leg 152 defining the hole 150 (see FIG. 43). The front end of the clip 145 is then depressed to elastically deform the rear slanting projection 148 and leg 152 and the front slanting projection 147 and leg 151. In this state, a protuberance 129b on the front end face of the socket 129 is fitted into the hole 149 in the front leg 151. At this time, the front leg 151 is elastically deformed so that the outwardly bent portion 151a thereof is temporarily opened by being pushed by the protuberance 129b. Upon moving past the protuberance 129b, the bent portion 151a restores itself elastically, and the protuberance fits into the hole 149 and is tightly engaged with a lower edge of the leg 151 defining the hole 149. A thermally conductive resin film (not shown) adhered to the lower surface of the radiating base plate 142 is consequently compressed and brought into intimate contact with the upper surface of a CPU 127, and the heat sink 140 is fixed to the socket 129 in this state. At this time, the base 146 of the clip 145 elastically deforms upward to the shape of a bow, with the result that the opposite lateral extensions 154 force the inward projections 141a defining the furrow 141 upward. Accordingly, an upward force acts on the heat sink 140 and the clip 145, consequently holding the hole-defining lower edges of the clip legs 151, 152 in tighter engagement with the protuberances 129b, 129a of the socket 129 and reliably preventing the heat sink 140 and the clip 145 from slipping off the socket 129.

When there arises a need to remove the heat sink 140 from the socket 129, for example, for the replacement of the CPU 127, the rear end of the clip 145 is pushed forward from behind against the elastic force of the clip 145, whereupon the clip 145 moves forward, causing the protuberance 129b at the front end face of the socket 129 to slip out of the hole 149 of the front leg 151. The protuberance 129a at the rear end face of the socket 129 is thereafter withdrawn from the hole 150 in the rear leg 152. In this way, the heat sink 140 is removed from the socket 129 and is therefore removable with extreme ease.

Tenth Embodiment

Figure 45:
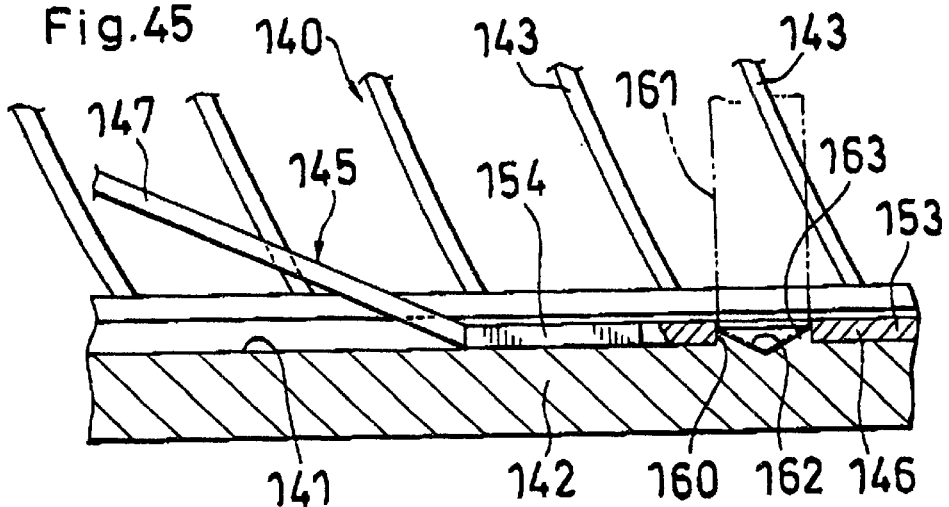
FIG. 45 is an enlarged fragmentary view in vertical section showing a tenth embodiment.
Figure 46:
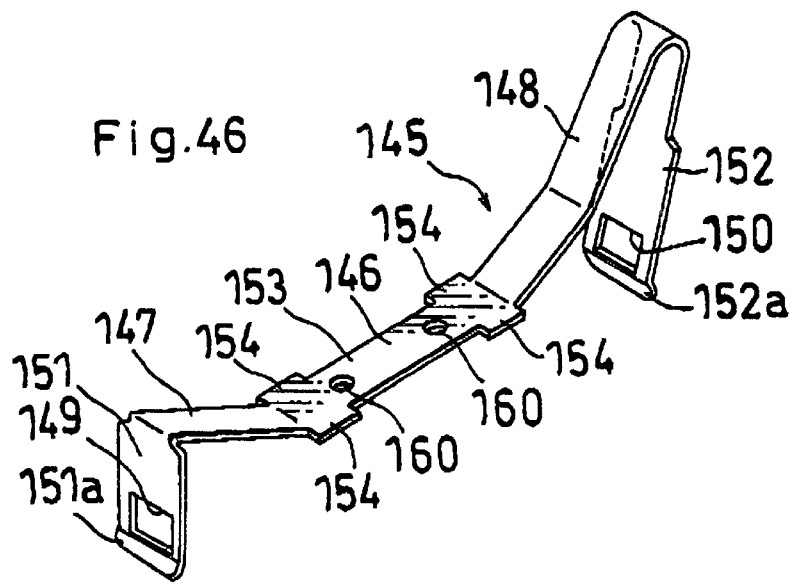
FIG. 46 is a perspective view showing a clip of the tenth embodiment.
Figure 47:
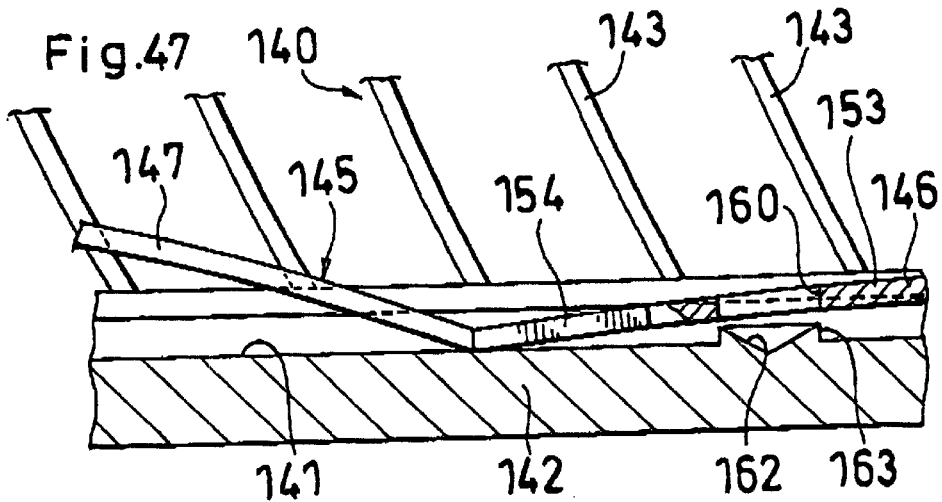
FIG. 47 is a fragmentary side elevation showing a heat sink as fixed to a socket by the clip according to the tenth embodiment.

This embodiment is shown in FIGS. 45 to 47.

In the case of this embodiment, the striplike portion 153 of base 146 of the clip 145 is formed with a plurality of, e.g., two, circular holes 160 spaced apart longitudinally of the clip (see FIG. 46). After the sink 140 is caused to hold the clip 145 thereon in the same manner as in the foregoing ninth embodiment, a punch mark 162 is impressed on the bottom surface of the furrow 141 through the circular hole 160 using a punch 161 having a diameter slightly smaller than the hole 160. This forms an upwardly protruding burr 163 (upward protrusion) between the outer periphery of the extremity of the punch 161 and an inner periphery of the striplike portion 153 defining the circular hole 160, and the burr 160 is forced into the circular hole 160 (see FIG. 45). This causes the heat sink 140 to hold the clip 145 more effectively. Since the clip 145 is positioned in place accurately relative to the sink 140 with respect to the longitudinal and lateral directions, the heat sink 140 can be fixed to the socket without displacement from each other. Thus, the heat sink 140 can be fixed to the socket, i.e., to the CPU 127, as positioned accurately relative thereto with respect to the forward or rearward direction and leftward or rightward direction. The tenth embodiment otherwise has the same construction as the ninth embodiment described, and the heat sink 140 is fixed to the socket 129 in the same manner as described.

When the heat sink 140 is fixed to the socket 129 by the clip 145, the bass 146 of the clip 145 is also elastically deformed upward to the shape of a bow as in the case of the ninth embodiment as seen in FIG. 47, with the result that the burr 163 slips out of the hole 160. When the heat sink 140 is to be removed from the socket 129, accordingly, the clip 145 can be moved forward relative to the sink 140, and the sink 140 is removable free of trouble.

Figure 48:
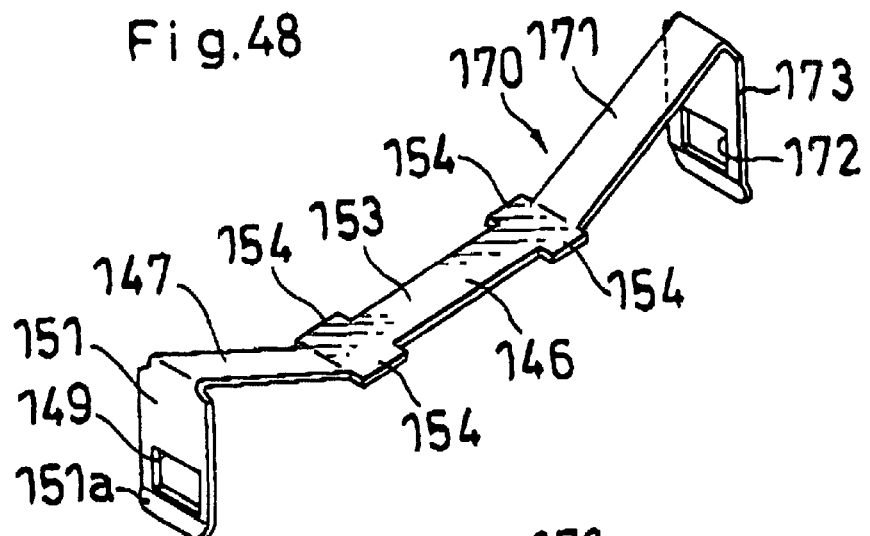
FIG. 48 is a perspective view showing a modified clip.

FIG. 48 shows a modified clip 170 for use in the ninth and tenth embodiments,

The clip 170 has a striplike slanting projection 171 integral with the rear and of a bass 146 and symmetrical with a front striplike slanting projection 147 about the midpoint of length of the base. The rear end of the projection 171 is integral with a vertical leg 173 which is symmetrical with a front leg 151 about the lengthwise midpoint and has a rectangular hole 172 at a lower portion. The clip 170 otherwise has the same construction as the clip 145 of the ninth embodiment.

Figure 49:
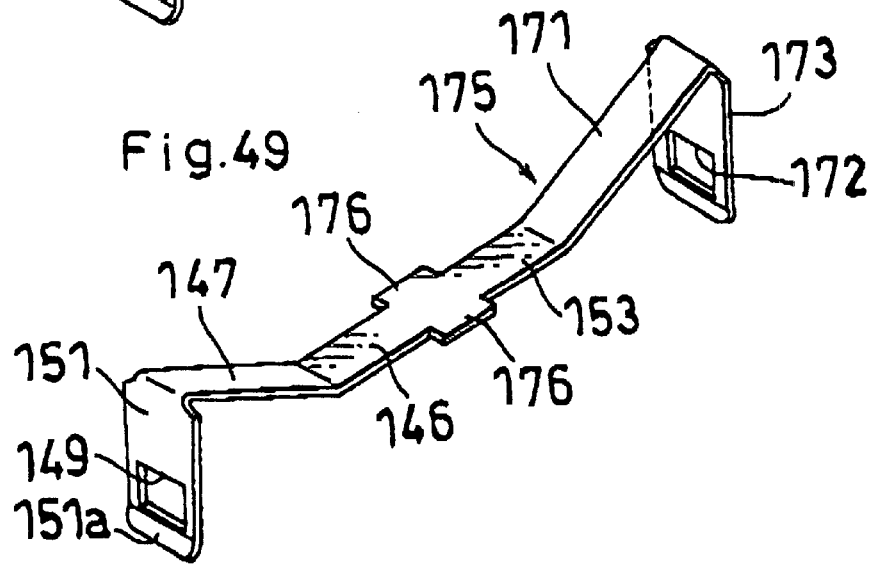
FIG. 49 is a perspective view showing another modified clip.

FIG. 49 shows another modified clip 175 for use in the ninth and tenth embodiments.

The Clip 175 has a base 146, which comprises a striplike portion 153, and lateral extensions 176 formed integrally with the respective opposite side edges of the portion 153 at the midportion of length of the portion 153. The width between the outer ends of the opposite extensions 176 is the same as the width between the outer ends of the lateral extensions 154 of the clip of the ninth embodiment. The clip 175 otherwise has the same structure as the clip 170 of FIG. 48.

Figure 50:
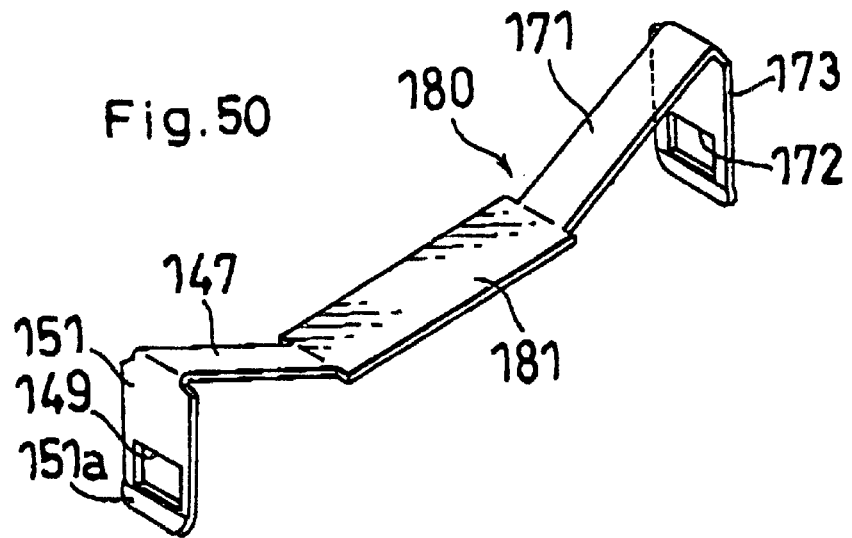
FIG. 50 is a perspective view showing still another modified clip.

FIG. 50 shows still another modified clip 180 for use in the ninth and tenth embodiments.

The clip 180 includes a base 181 having a lateral width which remains unchanged over the entire length thereof. The lateral width of the base 181 is the same as the width between the outer ends of the lateral extensions 154 of the clip of the ninth embodiment. The clip 180 otherwise has the sane structure as the clip 170 of FIG. 48.

In the case of the clips 170, 175, 160 shown in FIGS. 48 to 50, circular holes can also be formed in the base 146 or 181 to force a burr into each hole and to cause the heat sink 140 to hold the clip 170, 175 or 180 thereon reliably as is the case with the tenth embodiment.

What is claimed is:

1. A structure for fixing a heat sink to a CPU assembly having a CPU mount circuit board within a housing of a personal computer by a first clip provided on the heat sink and a second clip provided on the CPU assembly, the heat sink comprising a radiating base plate of metal having on one surface thereof a flat portion for receiving the heat generated by the CPU, and a plurality of radiating fins formed in a raised shape on the other surface of the radiating base plate integrally therewith by cutting, the radiating base plate of the heat sink having an internally enlarged furrow formed in the surface thereof provided with the heat receiving portion, the first clip comprising a base in the form of a strip and having a width larger than the opening width of the furrow and smaller than the bottom width of the furrow, and a leg provided on the base perpendicular thereto and having an engaging portion at an outer end thereof, the second clip comprising a springlike elastic portion engageable with the engaging portion of the leg end of the first clip, the base of the first clip being disposed in the furrow with the leg thereof extending from inside the furrow outward through the CPU assembly, the engaging portion of the leg end being in engagement with the elastic portion of the second clip as deformed elastically, the first clip being biased toward the CPU assembly by the elastically deformed elastic portion.

2. A structure for fixing a heat sink to a CPU assembly according to claim 1 wherein the radiating base plate of the heat sink has two internally enlarged furrows formed in parallel as spaced apart from each other, each of the furrows having the bass of the first clip disposed therein, the base being integrally formed with two legs spaced apart longitudinally of the base and each having a width smaller than the opening width of the furrow, each of the legs having a folded-over hook at an outer end thereof, the second clip comprising two striplike plate springs extending in parallel to each other and having a width positioned longitudinally of the furrows and a length greater than the distance between outer opening edges of the two furrows, and a connector interconnecting the plate springs at lengthwise midportions thereof, the plate springs of the second clip each comprising a flat base extending along an outer surface of a cover of the CPU assembly, two first slanting portions extending from respective opposite ends of the base integrally therewith and each slanting toward an outer end thereof so as to be positioned away from the cover, a horizontal portion extending from the outer and of each first slanting portion integrally therewith, and a second slanting portion extending from an outer end of the horizontal portion integrally therewith and slanting toward the cover as the second slanting portion extends toward an outer end thereof to position its outer end in bearing contact with the cover outer surface, the horizontal portion of each plate spring having a hole for passing the leg therethrough, the two plate springs of the second clip being elastically deformed so as to move the horizontal portions toward the cover, whereby the legs of the first clips at one end of each clip are inserted respectively through the two holes of one of the plate springs of the second clip, and the other legs are inserted respectively through the two holes of the other plate spring of the second clip, with the hooks of the leg ends in engagement with the respective horizontal portions of the plate springs as elastically deformed, each at an edge part defining the hole.

3. A structure for fixing a heat sink to a CPU assembly according to claim 1 wherein the radiating base plate of the heat sink has two internally enlarged furrows formed in parallel as spaced apart from each other, each of the furrows having the base of the first clip disposed therein, the base of the first clip being integrally formed with a striplike leg having a width smaller than the opening width of the furrow, with the width of the leg positioned widthwise of the base, the leg having a neck close to an outer end thereof, the second clip comprising a plate spring in the form of a strip and having a length larger than the distance between outer opening edges of the two furrows, the plate spring of the second clip comprising a base extending along an outer surface of a cover of the CPU assembly and two slanting portions extending from respective opposite ends of the base integrally therewith and each slanting toward an outer end thereof so as to be positioned away from the cover, one of the slanting portions being formed with a slot having a length positioned widthwise of the second clip and larger than the width of the leg of the first clip and a width larger than the width of the neck, the other slanting portion being formed with a slit extending from a side edge thereof widthwise of the second clip and having a width smaller than the width of the leg and larger than the width of the neck, the neck of the leg of one of the first clips being fitted in the slit of the second clip and portions of the legs of the first clips closer to the log outer ends than the necks being engaged respectively with an edge part defining the slot in the slanting portion of the second clip as elastically deformed and with an edge part defining the slit of the other slanting portion of the second clip as elastically deformed, by disposing the second clip with its length positioned lengthwise of the first clips and with the leg of the other first clip inserted through the slot to position the neck in the slot and elastically deforming and turning the second clip about the leg.

4. A structure for fixing a heat sink to a CPU assembly according to claim 1 wherein the radiating base plate of the heat sink has two internally enlarged furrows formed in parallel as spaced apart from each other, each of the furrows having the base of the first clip disposed therein, the base of the first clip being integrally formed with a striplike leg having a width smaller than the opening width of the furrow, with the width of the leg positioned widthwise of the base, the leg having a neck close to an outer end thereof, the second clip comprising a plate spring in the form of a strip and having a length larger than the distance between outer opening edges of the two furrows, the plate spring of the second clip comprising a base extending along an outer surface of a cover of the CPU assembly and two slanting portions extending from respective opposite ends of the base integrally therewith and each slanting toward an outer end thereof so as to be positioned away from the cover, one of the slanting portions being formed with a first slot having length positioned widthwise of the second clip and larger than the width of the leg of the first clip and a width larger than the width of the neck, the other slanting portion being formed with a second slot having a length larger than the width of the leg of the first clip and positioned lengthwise of the second clip, the second clip being disposed with its length positioned lengthwise of the first clips and the leg of one of the first clips being inserted through the first slot to position the neck in the slot and elastically deforming and turning the second clip about the leg, the leg of the other first clip being inserted through the second slot of the second clip and portions of the legs of the first clips closer to the leg outer ends than the necks being engaged respectively with edge parts defining the two slots in the slanting portions of the second clip as elastically deformed.

5. A structure for fixing a heat sink to a CPU assembly according to claim 1 wherein the radiating base plate of the heat sink has an internally enlarged furrow having the base of the first clip disposed therein, the base of the first clip being integrally formed with two striplike legs spaced apart lengthwise of the base and having a width smaller than the width of the base and positioned lengthwise of the base, each of the legs having a neck close to an outer end thereof, the second clip comprising a plate spring in the form of a strip and having a length larger than the distance between the two legs of the first clip, the plate spring of the second clip comprising a base extending along an outer surface of a cover of the CPU assembly and two slanting portions extending from respective opposite ends of the base integrally therewith and each slanting toward an outer end thereof so as to be positioned away from the cover, one of the slanting portions being formed with a slot having a length larger than the width of the leg of the first clip and positioned widthwise of the second clip and a width larger than the width of the neck, the other slanting portion being formed with a slit extending from a side edge thereof widthwise of the second clip and having a width smaller than the width of the leg and larger than the width of the neck, the neck of one of the legs of the first clip being fitted in the slit of the second clip and portions of the legs of the first clip closer to the leg outer ends than the necks being engaged respectively with an edge part defining the slot in the slanting portion of the second clip as elastically deformed and with an edge part defining the slit of the other slanting portion of the second clip as elastically deformed, by disposing the second clip with its length positioned widthwise of the first clip and with the other leg of the first clip inserted through the slot to position the neck in the slot and elastically deforming and turning the second clip about the leg.

* * * * *

UNITED STATES PATENT AND TRADEMARK OFFICE
CERTIFICATE OF CORRECTION

PATENT NO. : 6,504,712 B2 Page 1 of 1
DATED : January 7, 2003
INVENTOR(S) : Hashimoto et al.

It is certified that error appears in the above-identified patent and that said Letters Patent is hereby corrected as shown below:

<u>Title page,</u>
Item [73], change "Showa Denka K. K." to be -- Showa Denko K. K. --

Signed and Sealed this

Twenty-seventh Day of May, 2003

JAMES E. ROGAN
*Director of the United States Patent and Trademark Office*